United States Patent
Okazaki et al.

(10) Patent No.: US 9,842,938 B2
(45) Date of Patent: Dec. 12, 2017

(54) SEMICONDUCTOR DEVICE AND DISPLAY DEVICE INCLUDING SEMICONDUCTOR DEVICE

(71) Applicant: Semiconductor Energy Laboratory Co., Ltd., Atsugi-shi, Kanagawa-ken (JP)

(72) Inventors: Kenichi Okazaki, Tochigi (JP); Junichi Koezuka, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/074,043

(22) Filed: Mar. 18, 2016

(65) Prior Publication Data

US 2016/0284854 A1     Sep. 29, 2016

(30) Foreign Application Priority Data

Mar. 24, 2015 (JP) ................................. 2015-061347

(51) Int. Cl.
*H01L 29/78* (2006.01)
*H01L 29/786* (2006.01)
(Continued)

(52) U.S. Cl.
CPC ........ *H01L 29/7869* (2013.01); *H01L 29/045* (2013.01); *H01L 29/24* (2013.01);
(Continued)

(58) Field of Classification Search
CPC ............. H01L 29/7831; H01L 29/7869; H01L 29/786; H01L 29/78696; H01L 29/7832;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Kimberly Rizkallah
*Assistant Examiner* — Brian Turner
(74) *Attorney, Agent, or Firm* — Robinson Intellectual Property Law Office; Eric J. Robinson

(57) ABSTRACT

A semiconductor device includes a transistor which includes a first gate electrode, a first insulating film, an oxide semiconductor film, source and drain electrodes, a second insulating film, and a second gate electrode. The oxide semiconductor film includes a first oxide semiconductor film in contact with the first insulating film, a second oxide semiconductor film in contact with the first oxide semiconductor film, and a third oxide semiconductor film in contact with the second oxide semiconductor film. The first to third oxide semiconductor films each contain In, Zn, and M (M represents Al, Ga, Y, or Sn). The third oxide semiconductor film includes a region in contact with a side surface of the second oxide semiconductor film and a region in contact with the second insulating film. The third oxide semiconductor film includes a region where the content of M is greater than or equal to that of In.

29 Claims, 63 Drawing Sheets

(51) Int. Cl.
*H01L 29/66* (2006.01)
*H01L 21/34* (2006.01)
*H01L 29/26* (2006.01)
*H01L 29/04* (2006.01)
*H01L 29/24* (2006.01)
*H01L 27/12* (2006.01)

(52) U.S. Cl.
CPC .. *H01L 29/78648* (2013.01); *H01L 29/78696* (2013.01); *H01L 27/1225* (2013.01)

(58) Field of Classification Search
CPC ............... H01L 29/24; H01L 29/66969; H01L 29/66742; H01L 27/14632; H01L 27/14687
USPC .................. 257/43, 57, 66, E27.06; 438/104
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,890,159 B2 | 11/2014 | Yamazaki et al. |
| 8,952,381 B2 | 2/2015 | Yamazaki |
| 8,987,731 B2 | 3/2015 | Yamazaki |
| 9,082,863 B2 | 7/2015 | Yamazaki |
| 9,123,573 B2 | 9/2015 | Yamazaki et al. |
| 9,184,245 B2 | 11/2015 | Yamazaki |
| 9,202,827 B2 | 12/2015 | Koyama et al. |
| 9,207,504 B2 | 12/2015 | Kimura |
| 9,240,492 B2 | 1/2016 | Yamazaki |
| 9,287,117 B2 | 3/2016 | Yamazaki et al. |
| 9,293,602 B2 | 3/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0043377 A1 | 2/2005 | Klunk et al. |
| 2005/0199959 A1 | 9/2005 | Chiang et al. |
| 2006/0035452 A1 | 2/2006 | Carcia et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0270552 A1* | 10/2013 | Yamazaki ........... H01L 29/7831 257/43 |
| 2013/0320334 A1 | 12/2013 | Yamazaki et al. |
| 2013/0334523 A1* | 12/2013 | Yamazaki ......... H01L 29/78693 257/43 |
| 2014/0077205 A1 | 3/2014 | Yamazaki et al. |
| 2014/0339560 A1* | 11/2014 | Yamazaki ........... H01L 29/7869 257/49 |
| 2014/0361292 A1 | 12/2014 | Yamazaki et al. |
| 2015/0123127 A1 | 5/2015 | Yamazaki |
| 2015/0187949 A1 | 7/2015 | Yamazaki |
| 2015/0349133 A1 | 12/2015 | Yamazaki et al. |
| 2016/0027923 A1 | 1/2016 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| JP | 2002-076356 A | 3/2002 |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-030001 | 2/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers; May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4304-4308.

Nomura. K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, pp. 899-902.

Oba.F et al., "Defect energetics in ZnO: A hybrid Hartree-Fock density functional study", Phys. Rev. B. (Physical Review. B), 2008, vol. 77, pp. 245202-1-2475202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 1A
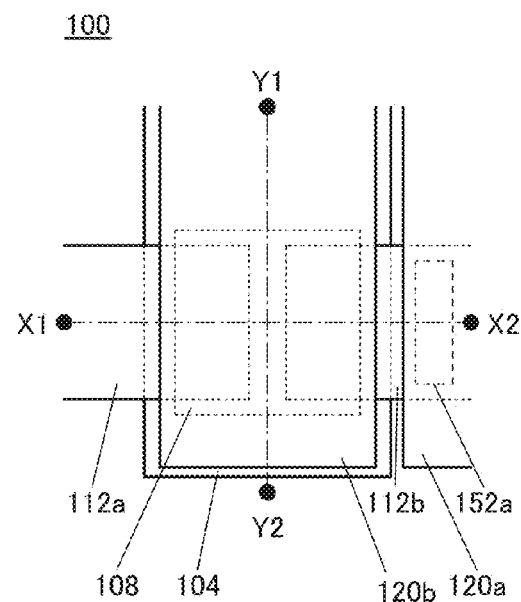
FIG. 1B
FIG. 1C
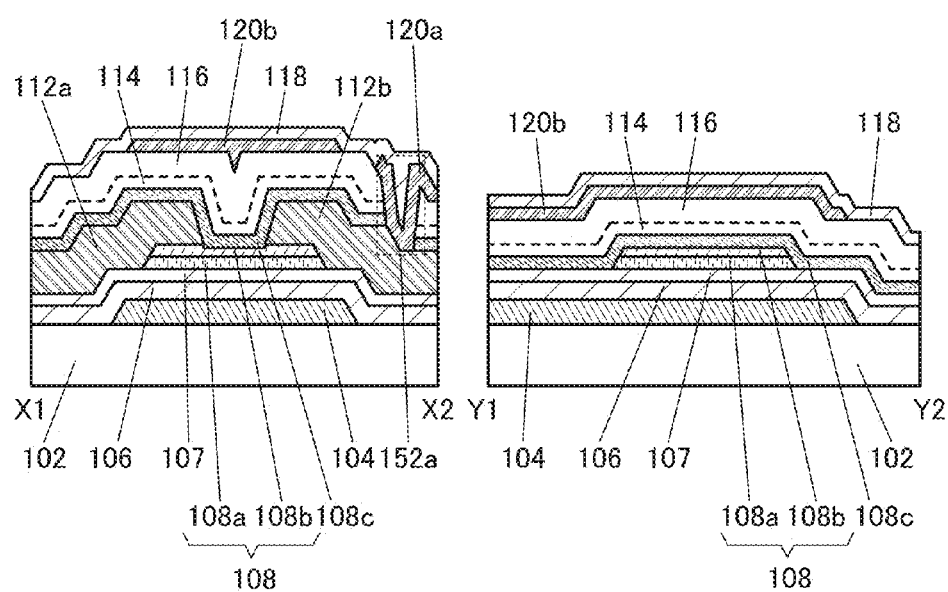

FIG. 20A
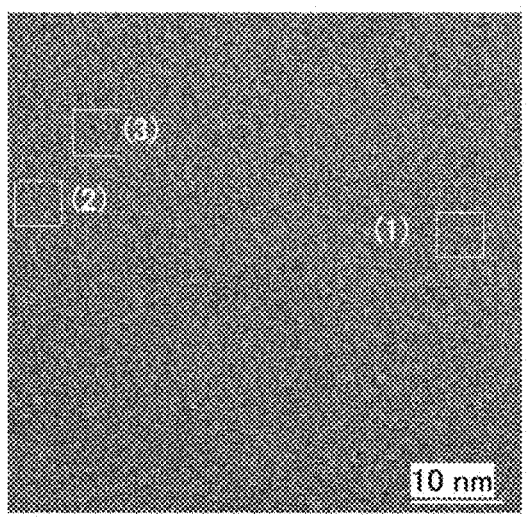
FIG. 20B          FIG. 20C          FIG. 20D
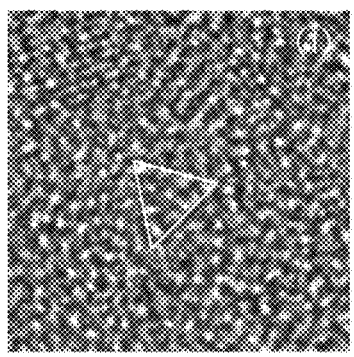 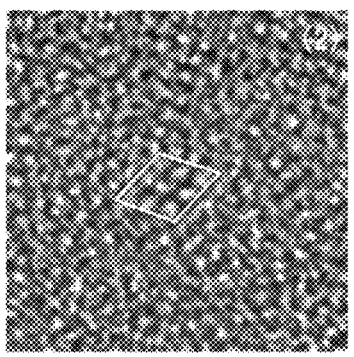 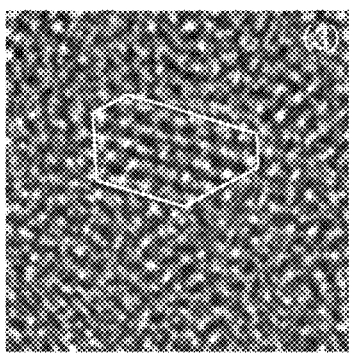

derived from substrate

FIG. 27A  FIG. 27B
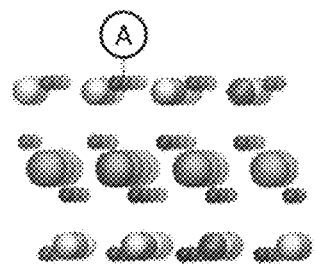 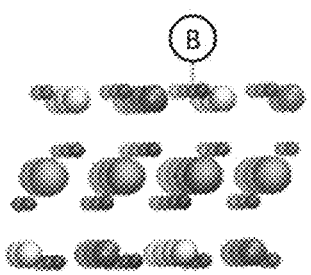
FIG. 27C  FIG. 27D  FIG. 27E
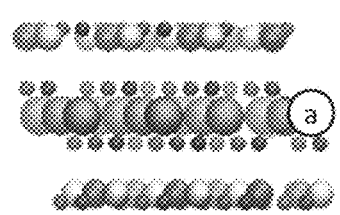 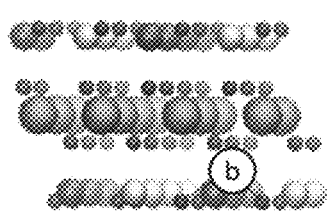 
FIG. 27F  FIG. 27G
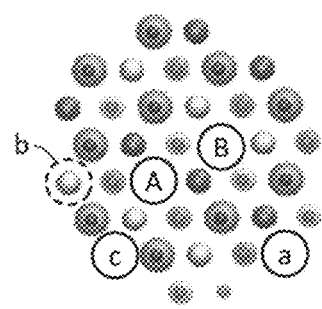 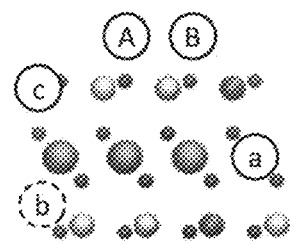

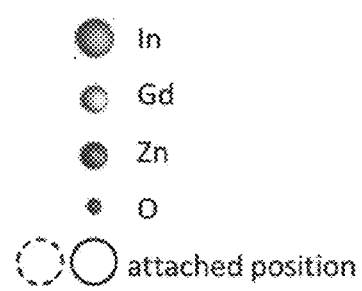

SEMICONDUCTOR DEVICE AND DISPLAY DEVICE INCLUDING SEMICONDUCTOR DEVICE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor (a thin film transistor (TFT) or a field-effect transistor (FET)) using a semiconductor thin film formed over a substrate. The transistor is applied to a wide range of electronic devices such as an integrated circuit (IC) or an image device (display device). A silicon-based semiconductor material is widely known as a material for a semiconductor thin film applicable to the transistor. As other materials, an oxide semiconductor has been attracting attention.

A highly reliable semiconductor device in which a transistor including an oxide semiconductor has stable electric characteristics is disclosed (for example, see Patent Document 1). In the semiconductor device, oxide semiconductor films with different compositions are stacked such that an oxide semiconductor film containing a large amount of In is positioned on the channel side and an oxide semiconductor film containing a large amount of a stabilizer such as Ga is positioned on the back channel side.

REFERENCE

Patent Document

[Patent Document 1] Japanese Published Patent Application No. 2014-030001

SUMMARY OF THE INVENTION

An oxide semiconductor film containing a large amount of In might have a small energy band gap ($E_g$) (for example, less than 3.0 eV). Such an oxide semiconductor film having a small $E_g$ is more affected by light than an oxide semiconductor film having a large $E_g$ (for example, greater than or equal to 3.0 eV and less than or equal to 3.5 eV). Therefore, a transistor including an oxide semiconductor film having a small $E_g$ might have a poor reliability.

In view of the above problem, an object of one embodiment of the present invention is to provide a semiconductor device including a highly reliable transistor. Another object of one embodiment of the present invention is to provide a semiconductor device including a transistor in which a fluctuation in electric characteristics is suppressed. Another object of one embodiment of the present invention is to provide a semiconductor device including a transistor having excellent electric characteristics (e.g., excellent on-state current, field-effect mobility, or frequency characteristics). Another object of one embodiment of the present invention is to provide a novel semiconductor device. Another object of one embodiment of the present invention is to provide a method for manufacturing the novel semiconductor device.

Note that the description of these objects does not disturb the existence of other objects. In one embodiment of the present invention, there is no need to achieve all the objects. Other objects will be apparent from and can be derived from the description of the specification and the like.

One embodiment of the present invention is a semiconductor device including a transistor. The transistor includes a first gate electrode, a first insulating film over the first gate electrode, an oxide semiconductor film including a region which overlaps with the first gate electrode with the first insulating film provided therebetween, a source electrode electrically connected to the oxide semiconductor film, a drain electrode electrically connected to the oxide semiconductor film, a second insulating film over the oxide semiconductor film, and a second gate electrode including a region which overlaps with the oxide semiconductor film with the second insulating film provided therebetween. The oxide semiconductor film includes a first oxide semiconductor film in contact with an upper surface of the first insulating film, a second oxide semiconductor film in contact with an upper surface of the first oxide semiconductor film, and a third oxide semiconductor film including a region in contact with an upper surface of the second oxide semiconductor film. The first oxide semiconductor film, the second oxide semiconductor film, and the third oxide semiconductor film each contain In, Zn, and M (M represents Al, Ga, Y, or Sn). The third oxide semiconductor film includes a region in contact with a side surface of the second oxide semiconductor film and a region in contact with the second insulating film. The third oxide semiconductor film includes a region where the content of M is greater than or equal to the content of In.

Another embodiment of the present invention is a semiconductor device including a transistor. The transistor includes a first gate electrode, a first insulating film over the first gate electrode, an oxide semiconductor film including a region which overlaps with the first gate electrode with the first insulating film provided therebetween, a source electrode electrically connected to the oxide semiconductor film, a drain electrode electrically connected to the oxide semiconductor film, a second insulating film over the oxide semiconductor film, a second gate electrode including a region which overlaps with the oxide semiconductor film with the second insulating film provided therebetween, and a third insulating film over the second gate electrode. The oxide semiconductor film includes a first oxide semiconductor film in contact with an upper surface of the first insulating film, a second oxide semiconductor film in contact with an upper surface of the first oxide semiconductor film, and a third oxide semiconductor film including a region in contact with an upper surface of the second oxide semiconductor film. The first oxide semiconductor film, the second oxide semiconductor film, and the third oxide semiconductor film each contain In, Zn, and M (M represents Al, Ga, Y, or Sn). The second gate electrode contains a metal element contained in the first oxide semiconductor film, the second oxide semiconductor film, and the third oxide semiconductor film. The third oxide semiconductor film includes a region in contact with a side surface of the second oxide semiconductor film and a region in contact with the second insulating film. The third oxide semiconductor film includes a region where the content of M is greater than or equal to the content of In.

In the above structure, it is preferable that the third insulating film contain at least one of nitrogen and hydrogen.

In each of the above structures, it is preferable that the second oxide semiconductor film be covered with the first oxide semiconductor film and the third oxide semiconductor film.

In each of the above structures, it is preferable that the second oxide semiconductor film include a region where the content of In is greater than or equal to the content of M and that the first oxide semiconductor film include a region where the content of M is greater than or equal to the content of In.

In each of the above structures, it is preferable that the third oxide semiconductor film include a region where the content of M is greater than or equal to the content of M in the second oxide semiconductor film, that the second oxide semiconductor film include a region where the content of In is greater than or equal to the content of In in the third oxide semiconductor film, and that the second oxide semiconductor film include a region where the content of In is greater than or equal to the content of In in the first oxide semiconductor film.

In each of the above structures, it is preferable that the carrier density of the second oxide semiconductor film be higher than the carrier density of the first oxide semiconductor film and the carrier density of the third oxide semiconductor film.

In each of the above structures, it is preferable that the oxide semiconductor film include a crystal part and that the crystal part have c-axis alignment.

Another embodiment of the present invention is a display device including the semiconductor device of any of the above embodiments and a display element. Another embodiment of the present invention is a display module including the display device of the above embodiment and a touch sensor. Another embodiment of the present invention is an electronic device including the semiconductor device of any of the above embodiments, the display device of the above embodiment or the display module of the above embodiment, and an operation key or a battery.

According to one embodiment of the present invention, a semiconductor device including a highly reliable transistor can be provided. According to one embodiment of the present invention, a semiconductor device including a transistor in which a fluctuation in electric characteristics is suppressed can be provided. According to one embodiment of the present invention, a semiconductor device including a transistor having excellent electric characteristics (e.g., excellent on-state current, field-effect mobility, or frequency characteristics) can be provided. According to one embodiment of the present invention, a novel semiconductor device can be provided. According to one embodiment of the present invention, a method for manufacturing the novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A to 1C are a top view and cross-sectional views illustrating one embodiment of a semiconductor device.

FIGS. 20A to 20D are Cs-corrected high-resolution TEM images of a plane of a CAAC-OS.

FIGS. 27A to 27G illustrate the position where a particle is attached to a pellet.

DETAILED DESCRIPTION OF THE INVENTION

Figure 2A:
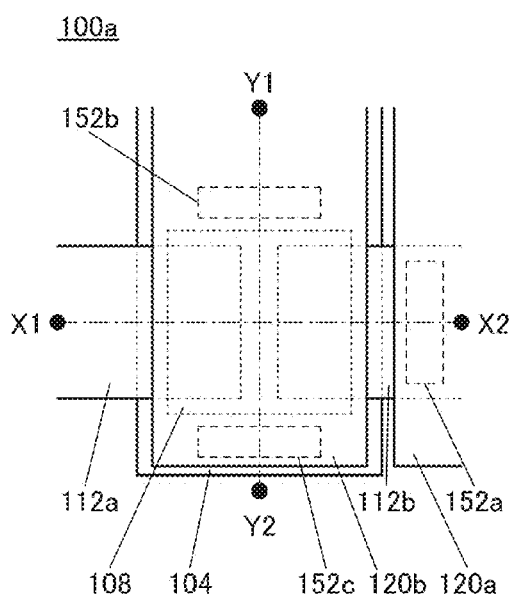
FIGS. 2A to 2C are a top view and cross-sectional views illustrating one embodiment of a semiconductor device.

Embodiments of the present invention will be described in detail below with reference to the drawings. However, the present invention is not limited to the description below, and modes and details thereof can be variously modified without departing from the purpose and the scope of the present invention. Thus, the present invention should not be interpreted as being limited to the description of the embodiments below.

Note that the position, the size, the range, or the like of each component illustrated in the drawings and the like is not accurately represented in some cases for simplification. Therefore, the disclosed invention is not necessarily limited to the position, the size, the range, or the like disclosed in the drawings and the like.

Note that the ordinal numbers such as "first" and "second" in this specification and the like are used for convenience and do not denote the order of steps or the stacking order of layers. Therefore, for example, the description can be made even when "first" is replaced with "second" or "third", as appropriate. In addition, the ordinal numbers in this specification and the like are not necessarily the same as those which specify one embodiment of the present invention.

Note that in this specification, the terms for describing arrangement, such as "over", "above", "under", and "below", are used for convenience in describing a positional relation between components with reference to the drawings. Furthermore, the positional relation between components is changed as appropriate in accordance with a direction in which the components are illustrated. Thus, there is no limitation on the terms used in this specification, and the description can be made appropriately depending on the situation.

In describing the structures of the invention with reference to the drawings in this specification and the like, common reference numerals are used for the same portions in different drawings.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. Alternatively, an "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, a transistor is an element including at least three terminals: a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, the channel region refers to a region through which current mainly flows.

The functions of the source and the drain might be interchanged with each other when a transistor of opposite polarity is employed or the direction of current flow is changed in circuit operation, for example. Therefore, the terms "source" and "drain" can be interchanged with each other in this specification and the like.

Note that the channel length refers to, for example, a distance between a source (a source region or a source electrode) and a drain (a drain region or a drain electrode) in a region where a semiconductor (or a portion where current flows in the semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value, in a region where a channel is formed.

The channel width refers to, for example, the length of a portion where a source and a drain face each other in a region where a semiconductor (or a portion where current flows in the semiconductor when a transistor is on) and a gate electrode overlap with each other or a region where a channel is formed in a top view of the transistor. In one transistor, channel widths in all regions are not necessarily the same. In other words, a channel width of one transistor is not limited to one value in some cases. Thus, in this specification and the like, a channel width is any one of values, the maximum value, the minimum value, or the average value, in a region where a channel is formed.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, an inductor, a capacitor, and elements with a variety of functions as well as an electrode and a wiring.

A voltage usually refers to a potential difference between a given potential and a reference potential (e.g., a source potential or a ground potential (GND)). Accordingly, a voltage can also be called a potential.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10° and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100° and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a semiconductor device of one embodiment of the present invention and a method of manufacturing the semiconductor device will be described with reference to FIGS. 1A to 1C to FIGS. 18A and 18B.

<1-1. Structural Example 1 of Semiconductor Device>

FIG. 1A is a top view of a transistor 100 that is a semiconductor device of one embodiment of the present invention. FIG. 1B is a cross-sectional view taken along the dashed-dotted line X1-X2 in FIG. 1A, and FIG. 1C is a cross-sectional view taken along the dashed-dotted line Y1-Y2 in FIG. 1A. Note that some components (e.g., a substrate 102 and an insulating film) of the transistor 100 are not illustrated in FIG. 1A for simplicity.

In some cases, the direction of the dashed-dotted line X1-X2 in FIG. 1A is referred to as the channel length direction of the transistor 100, and the direction of the dashed-dotted line Y1-Y2 in FIG. 1A is referred to as the channel width direction of the transistor 100.

The transistor 100 includes a conductive film 104 functioning as a first gate electrode over the substrate 102, an insulating film 106 over the substrate 102 and the conductive film 104, an insulating film 107 over the insulating film 106, an oxide semiconductor film 108 over the insulating film 107, conductive films 112a and 112b functioning as a pair of electrodes and electrically connected to the oxide semiconductor film 108, an oxide semiconductor film 108c over the oxide semiconductor film 108 and the conductive films 112a and 112b, insulating films 114 and 116 over the oxide semiconductor film 108c, a conductive film 120a which is over the insulating film 116 and electrically connected to one of the conductive films 112a and 112b (the conductive film 112b in FIG. 1B) through an opening 152a provided in the oxide semiconductor film 108c and the insulating films 114 and 116, a conductive film 120b functioning as a second gate electrode over the insulating film 116, and an insulating film 118 over the insulating film 116 and the conductive films 120a and 120b. The oxide semiconductor film 108 includes an oxide semiconductor film 108a in contact with an upper surface of the insulating film 107 and an oxide semiconductor film 108b in contact with an upper surface of the oxide semiconductor film 108a.

In the transistor 100, the insulating films 106 and 107 function as a first gate insulating film of the transistor 100, the insulating films 114 and 116 function as a second gate insulating film of the transistor 100, and the insulating film 118 functions as a protective insulating film of the transistor 100. Note that in this specification and the like, in some cases, the insulating films 106 and 107 are collectively referred to as a first gate insulating film, and the insulating films 114 and 116 are collectively referred to as a second gate insulating film. In the transistor 100, one of the conductive films 112a and 112b functioning as a pair of electrodes functions as a source electrode, and the other functions as a drain electrode. The conductive film 120a functions as a pixel electrode of a display device.

<<S-Channel Structure>>

In the transistor 100 illustrated in FIGS. 1A to 1C, the oxide semiconductor film 108 is sandwiched between the conductive films 104 and 120b such that the first gate insulating film is provided between the oxide semiconductor film 108 and the conductive film 104 and the second gate insulating film is provided between the oxide semiconductor film 108 and the conductive film 120b. The length in the channel length direction and the length in the channel width direction of the conductive film 104 are longer than the length in the channel length direction and the length in the channel width direction of the oxide semiconductor film 108. In addition, the length in the channel length direction and the length in the channel width direction of the conductive film 120b are longer than the length in the channel length direction and the length in the channel width direction of the oxide semiconductor film 108. Therefore, the oxide semiconductor film 108 is entirely covered with the conductive films 104 and 120b such that the first gate insulating film is provided between the oxide semiconductor film 108 and the conductive film 104 and the second gate insulating film is provided between the oxide semiconductor film 108 and the conductive film 120b.

In other words, in the channel width direction of the transistor 100, the conductive films 104 and 120b surround the oxide semiconductor film 108 such that the first gate insulating film is provided between the oxide semiconductor film 108 and the conductive film 104 and the second gate insulating film is provided between the oxide semiconductor film 108 and the conductive film 120b.

With such a structure, the oxide semiconductor film 108 included in the transistor 100 can be electrically surrounded by electric fields of the conductive films 104 and 120b. A device structure of a transistor, like that of the transistor 100, in which electric fields of the conductive films 104 and 120b electrically surround an oxide semiconductor film where a channel region is formed can be referred to as a surrounded channel (s-channel) structure.

Since the transistor 100 has an s-channel structure, an electric field for inducing a channel can be effectively applied to the oxide semiconductor film 108 from the conductive films 104 and 120b. Accordingly, the current drive capability of the transistor 100 is increased, so that a high on-state current can be obtained. Since the on-state current can be high, the size of the transistor 100 can be reduced. Furthermore, since the transistor 100 has a structure in which the oxide semiconductor film 108 is surrounded by the conductive films 104 and 120b, the mechanical strength of the transistor 100 can be increased.

In the above structure, the area where carriers flow in the oxide semiconductor film 108 is increased. That is, carriers also flow in a region on the first gate insulating film side of the oxide semiconductor film 108b and a region on the second gate insulating film side of the oxide semiconductor film 108b. Therefore, the amount of carriers that transfer in the transistor 100 is increased. As a result, the on-state current of the transistor 100 is increased, and the field-effect mobility of the transistor 100 is also increased to, for example, higher than or equal to 10 cm$^2$/V·s. Note that here, the field-effect mobility is not an approximate value of the mobility as the physical property of the oxide semiconductor film but is an index of the current drive capability of the transistor in a saturation region and the apparent field-effect mobility.

Figure 2B:
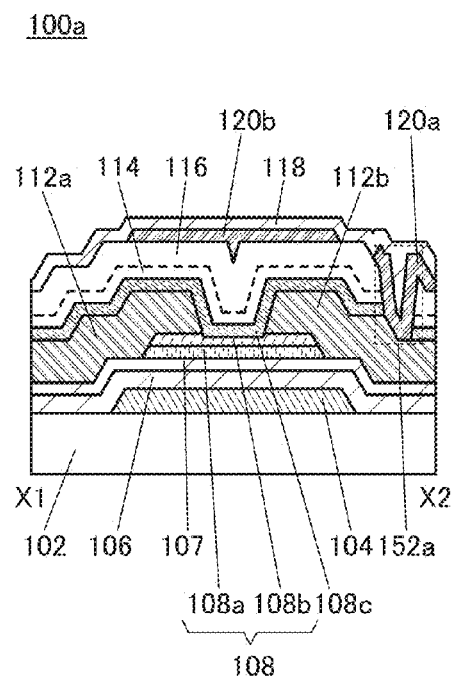
Figure 2C:
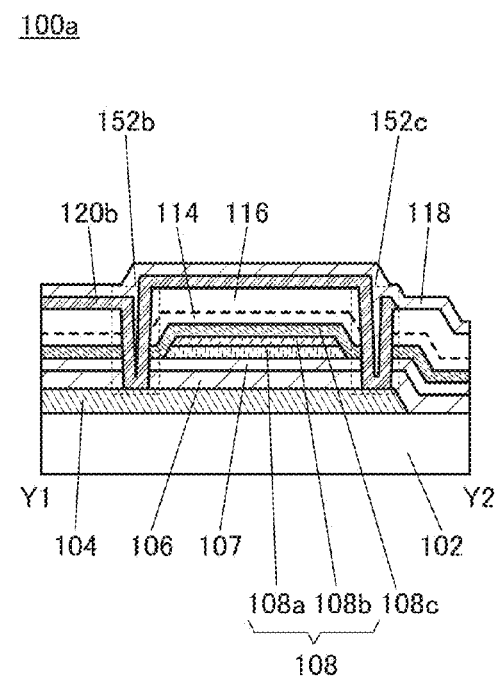

In addition, as in a transistor 100a illustrated in FIGS. 2A to 2C, the conductive film 120b functioning as a second gate electrode may be connected to the conductive film 104 functioning as a first gate electrode through openings 152b and 152c provided in the first gate insulating film (the insulating films 106 and 107), the oxide semiconductor film 108c, and the second gate insulating film (the insulating films 114, and 116). FIG. 2A is a top view of the transistor 100a that is a semiconductor device of one embodiment of the present invention. FIG. 2B is a cross-sectional view taken along the dashed-dotted line X1-X2 in FIG. 2A, and FIG. 2C is a cross-sectional view taken along the dashed-dotted line Y1-Y2 in FIG. 2A. Other components of the transistor 100a are similar to those of the transistor 100; thus, the structure of the transistor 100 can be referred to.

In the transistor 100a, since the conductive film 120b is connected to the conductive film 104 through the openings 152b and 152c provided in the first gate insulating film, the oxide semiconductor film 108c, and the second gate insulating film, a side surface of the oxide semiconductor film 108 in the channel width direction faces the conductive film 120b with the second gate insulating film provided therebetween. In addition, the conductive films 104 and 120b are supplied with the same potential. Accordingly, the oxide semiconductor film 108 included in the transistor 100a can be electrically surrounded by electric fields of the conductive films 104 and 120b effectively. Note that one of the openings 152b and 152c may be omitted. In addition, in the case where the conductive films 104 and 120b are not connected to each other as in the transistor 100 illustrated in FIGS. 1A to 1C, it is possible to supply different potentials to the conductive films 104 and 120b. In addition, one of or both the length in the channel length direction and the length in the channel width direction of the conductive film 120b are not necessarily longer than the length in the channel length direction and/or the length in the channel width direction of the oxide semiconductor film 108.

Note that in gate voltage-drain current characteristics (hereinafter also referred to as $V_g$-$I_d$ characteristics), which are the electric characteristics of a transistor, drain current ($I_d$) is saturated when a voltage between a pair of electrodes (a source electrode and a drain electrode) is higher than gate voltage, more properly, when drain voltage is higher than a voltage obtained by subtracting the threshold voltage from gate voltage ($V_d$>$V_g$−$V_{th}$). A region where drain current ($I_d$) is saturated is called a saturation region.

In a transistor in which a gate electrode is provided over or below an oxide semiconductor film, such as a transistor with a structure including one gate electrode (also referred to as a single-gate structure), the charge density of a region in the oxide semiconductor film in the vicinity of a drain electrode is increased because of high drain voltage. The transistor 100 of one embodiment of the present invention has a structure in which the oxide semiconductor film 108 is sandwiched between the conductive films 104 and 120b such that the first gate insulating film is provided between the oxide semiconductor film 108 and the conductive film 104 and the second gate insulating film is provided between the oxide semiconductor film 108 and the conductive film 120b (also referred to as a dual-gate structure). When the same potential is supplied to the conductive films 104 and 120b, controllability of the gate electrodes is increased, so that an increase in the charge density of a region in the oxide semiconductor film 108 in the vicinity of the conductive film 112b functioning as a drain electrode can be suppressed. As a result, drain current ($I_d$) in a saturation region is saturated more easily in the transistor 100 employing the above-described driving method (also referred to as dual-gate driving) than in a transistor with a single-gate structure. This means that drain current ($I_d$) in a saturation region does not greatly fluctuate even when drain voltage ($V_d$) fluctuates.

Defects are formed at the side surface and its vicinity of the oxide semiconductor film 108 which is processed by etching or the like because of damage due to the processing, while the side surface and its vicinity of the oxide semiconductor film 108 are polluted by attachment of impurities or the like. For this reason, in the case where the transistor has a single-gate structure in which only one of the conductive films 104 and 120b is formed, even when the oxide semiconductor film 108 is intrinsic or substantially intrinsic as described later, the side surface and its vicinity of the oxide semiconductor film 108 are easily activated to be a low-resistance region (an n-type region) by application of stress such as an electric field. In the case where the n-type side surface or its vicinity overlaps with a region between the conductive films 112a and 112b, the n-type region serves as a carrier path, resulting in formation of a parasitic channel. As a result, the value of drain current ($I_d$) is increased at or around the threshold voltage, resulting in negative threshold voltage (also referred to as normally-on characteristics).

However, in the transistor 100 of one embodiment of the present invention in the channel width direction, the oxide semiconductor film 108 is sandwiched between the conductive films 104 and 120b such that the first gate insulating film is provided between the oxide semiconductor film 108 and the conductive film 104 and the second gate insulating film is provided between the oxide semiconductor film 108 and the conductive film 120b. Therefore, electric fields of the conductive films 104 and 120b also affect the side surface of the oxide semiconductor film 108. Thus, formation of a parasitic channel at the side surface and its vicinity of the oxide semiconductor film 108 can be suppressed. As a result, the transistor 100 has excellent electric characteristics. Furthermore, the transistor has positive threshold voltage (also referred to as normally-off characteristics).

<<Channel-Etched Transistor>>

A channel-etched transistor and a channel protective transistor are compared.

In a channel protective transistor including two gate electrodes (a first gate electrode and a second gate electrode) with an oxide semiconductor film provided therebetween, a first insulating film is formed over the first gate electrode, and the oxide semiconductor film is formed over the first insulating film. A channel protective film is formed over the oxide semiconductor film, and a pair of electrodes in contact with the oxide semiconductor film are formed over the channel protective film. A second insulating film is formed over the channel protective film and the pair of electrodes, and the second gate electrode is formed over the second insulating film.

The channel protective film is damaged by exposure to plasma in an etching process for forming the pair of electrodes. Thus, defects are easily formed in the channel protective film.

In addition, in the channel protective transistor, the pair of electrodes block an electric field of the second gate electrode in regions of the oxide semiconductor film which overlap with the pair of electrodes, so that the electric field of the second gate electrode does not evenly affect the oxide semiconductor film. As a result, the amount of carriers that flow in the oxide semiconductor film when induced by the electric field of the second gate electrode is reduced.

The transistor 100 described in this embodiment is a channel-etched transistor. A region of the second gate insulating film which is provided between the oxide semiconductor film 108 and the conductive film 120b is not exposed to an etching atmosphere. Thus, the transistor 100 has few defects in the second gate insulating film and thus has a high reliability.

In addition, in the transistor 100 described in this embodiment, the electric field of the conductive film 120b evenly affects a back channel of the oxide semiconductor film 108. Furthermore, the electric field of the conductive film 120b also affects the side surface of the oxide semiconductor film 108. As a result, carriers flow in a wide region of the oxide semiconductor film 108, so that the field-effect mobility and the on-state current of the transistor are increased.

In the channel protective transistor, end portions of the pair of electrodes are positioned over the channel protective film to make a connection between the oxide semiconductor film and the pair of electrodes. The end portions of the pair of electrodes are positioned on the inner side of connection regions of the oxide semiconductor film and the pair of electrodes. For this reason, in consideration of misalignment of a photomask, the distance between the connection regions of the oxide semiconductor film and the pair of electrodes is preferably designed to be long.

In contrast, in the channel-etched transistor 100, the oxide semiconductor film 108 is directly connected to end portions of the conductive films 112a and 112b functioning as a pair of electrodes. Thus, the distance between the pair of electrodes in the channel-etched transistor 100 can be made small easily as compared with the channel protective transistor.

Each of the conductive films 104 and 120b in the channel-etched transistor 100 has a function of blocking an external electric field. Thus, fixed charge between the substrate 102 and the conductive film 104 and over the conductive film 120b do not affect the oxide semiconductor film 108. Therefore, degradation due to a stress test (e.g., a bias-temperature (BT) stress test in which negative potential is applied to a gate electrode) can be suppressed, and a fluctuation in voltage at which the on-state current starts increasing depending on drain voltage can be suppressed.

The BT stress test is one kind of accelerated test and can evaluate, in a short time, a change in characteristics (i.e., a change over time) of a transistor, which is caused by long-term use. In particular, the amount of change in threshold voltage of the transistor before and after the BT stress test is an important indicator when examining the reliability of the transistor. The smaller the amount of change in the threshold voltage before and after the BT stress test, the higher the reliability of the transistor.

The channel-etched transistor fluctuates in characteristics in some cases due to damage or impurity contamination in a region of the oxide semiconductor film 108 in contact with the second gate insulating film during a process such as a deposition step or an etching step of the conductive films 112a and 112b functioning as a pair of electrodes.

The transistor 100 including the oxide semiconductor film 108 is operated by the accumulation of electrons that are major carriers. Thus, there is a bulk current in the oxide semiconductor film 108 in addition to the accumulation current on the first gate insulating film side of the oxide semiconductor film 108. Therefore, when a trap state due to damage or impurity contamination during a process exists on the second gate insulating film side of the oxide semiconductor film 108, a carrier is easily trapped by the trap state.

<<Structure of Oxide Semiconductor Film>>

In view of the above, the oxide semiconductor film 108 in the transistor 100 of one embodiment of the present invention includes the oxide semiconductor films 108a and 108b. That is, the oxide semiconductor film 108 has a two-layer structure. Furthermore, the transistor 100 includes the oxide semiconductor film 108c including a region in contact with the upper surface of the oxide semiconductor film 108b. The oxide semiconductor films 108a and 108b include oxides with different compositions, and the oxide semiconductor films 108b and 108c include oxides with different compositions. Part of the oxide semiconductor film 108b functions as a channel region of the transistor 100.

The oxide semiconductor films 108a, 108b, and 108c include at least one common element. Thus, interface scattering is unlikely to occur at the interface between the oxide semiconductor films 108a and 108b and at the interface between the oxide semiconductor films 108b and 108c. Thus, the transistor 100 can have a high field-effect mobility because the transfer of carriers is not hindered at the interfaces.

Preferably, the oxide semiconductor films 108a, 108b, and 108c each include a metal oxide, and the metal oxide contains at least indium (In) or zinc (Zn).

An oxide semiconductor film containing In has a high carrier mobility (a high electron mobility), for example. In addition, an oxide semiconductor film containing Zn is easily crystallized.

An oxide semiconductor film has a large energy gap ($E_g$) by containing an element M functioning as a stabilizer, for example. The energy gap of an oxide semiconductor film which is favorably used in one embodiment of the present invention is greater than or equal to 2 eV, preferably greater than or equal to 2.5 eV, more preferably greater than or equal to 3 eV. The use of a metal oxide having such a large energy gap as the oxide semiconductor film 108 can reduce the off-state current of the transistor 100. Note that the element M is an element having a high bonding energy with oxygen, which is higher than the bonding energy of In with oxygen.

Typically, an In—Zn oxide, an In-M oxide, or an In-M-Zn oxide can be used for the oxide semiconductor film which is favorably used in the semiconductor device of one embodiment of the present invention. It is particularly preferable to use an In-M-Zn oxide (M represents aluminum (Al), gallium (Ga), yttrium (Y), or tin (Sn)). In addition, it is particularly preferable to use an In-M-Zn oxide where M is Ga (i.e., an In—Ga—Zn oxide; hereinafter also referred to as IGZO).

In the case where the oxide semiconductor film 108b includes an In-M-Zn oxide, the proportions of In and M, not taking Zn and oxygen into consideration, are preferably higher than 25 atomic % and lower than 75 atomic %, respectively, more preferably higher than 34 atomic % and lower than 66 atomic %, respectively. In particular, the oxide semiconductor film 108b preferably includes a region where the atomic proportion of In is higher than or equal to the atomic proportion of M.

The oxide semiconductor film 108b including the region where the atomic proportion of In is higher than or equal to the atomic proportion of M can increase the field-effect mobility (also simply referred to as mobility or μFE) of the transistor 100. Specifically, the field-effect mobility of the transistor 100 can be higher than 10 cm$^2$/Vs, preferably higher than 30 cm$^2$/Vs.

For example, the channel width of the transistor with a high field-effect mobility can be small; therefore, the use of the transistor for a gate driver that generates a gate signal (particularly, for a demultiplexer connected to an output terminal of a shift register included in the gate driver) can reduce the size of the gate driver, leading to a semiconductor device or a display device having a narrow frame. Alternatively, the power consumption of a display device can be reduced because gate voltage can be reduced. Note that the details of the gate driver are described later.

With the transistor having a high field-effect mobility, the pixel density and the resolution of a display device can be increased. For example, the transistor having a high field-effect mobility can be favorably used in a pixel circuit or a driver circuit of a high-definition display device with a high pixel density typified by 4 k×2 k pixels (3840 pixels in the horizontal direction and 2160 pixels in the perpendicular direction) or 8 k×4 k pixels (7680 pixels in the horizontal direction and 4320 pixels in the perpendicular direction).

On the other hand, the oxide semiconductor film 108b including the region where the atomic proportion of In is higher than or equal to the atomic proportion of M has a smaller energy gap ($E_g$); thus, the electric characteristics of the transistor 100 are likely to fluctuate by light irradiation. However, in the semiconductor device of one embodiment of the present invention, the oxide semiconductor film 108c is formed over the oxide semiconductor film 108b. In addition, the oxide semiconductor film 108b is formed over the oxide semiconductor film 108a. The oxide semiconductor films 108a and 108c each include a region where the atomic proportion of In is lower than that in the oxide semiconductor film 108b and thus have a larger energy gap ($E_g$) than the oxide semiconductor film 108b. For this reason, the transistor including a stack of the oxide semiconductor films 108a, 108b, and 108c has a high resistance to a negative bias stress test with light irradiation.

In the case where the oxide semiconductor films 108a and 108c each include an In-M-Zn oxide, the atomic proportions of In and M, not taking Zn and oxygen into consideration, are preferably lower than 75 atomic % and higher than 25 atomic %, respectively, more preferably lower than 66 atomic % and higher than 34 atomic %, respectively. In particular, the oxide semiconductor films 108a and 108c each preferably include a region where the atomic proportion of M is higher than or equal to the atomic proportion of In.

The oxide semiconductor films 108a and 108c in which the atomic proportion of M is higher than or equal to the atomic proportion of In may have any of the following effects: (1) the energy gap increases, (2) the electron affinity decreases, (3) an impurity from the outside is blocked, and (4) an insulating property improves. Furthermore, oxygen vacancies are less likely to be generated in the oxide semiconductor films 108a and 108c in which the atomic proportion of M is higher than or equal to the atomic proportion of In because M is a metal element which is strongly bonded to oxygen.

The atomic proportion of M in the oxide semiconductor films 108a and 108c is preferably higher than or equal to the atomic proportion of M in the oxide semiconductor film 108b. Typically, the atomic proportion of M in the oxide semiconductor films 108a and 108c is preferably 1.5 or more times, more preferably two or more times as high as the atomic proportion of M in the oxide semiconductor film 108b.

The atomic proportion of In in the oxide semiconductor film 108b is preferably higher than or equal to the atomic proportion of In in the oxide semiconductor films 108a and 108c. Typically, the atomic proportion of In in the oxide semiconductor film 108b is preferably 1.5 or more times, more preferably two or more times as high as the atomic proportion of In in the oxide semiconductor films 108a and 108c. In that case, the oxide semiconductor film 108b can function as a channel region of the transistor 100. With the above structure, the transistor 100 can have a higher on-state current and a higher field-effect mobility. Note that the transistor with a high field-effect mobility has negative threshold voltage (normally-on characteristics) in some cases. This is because charge is generated owing to oxygen vacancies in the oxide semiconductor film in the transistor, and the resistance is thus reduced. The transistor having normally-on characteristics causes various problems in that a malfunction is likely to be caused when in operation and that power consumption is increased when not in operation, for example. Thus, it is preferable to use, as the oxide semiconductor film 108b, a CAAC-OS which is described later and includes few impurities or defects (e.g., oxygen vacancies).

Furthermore, in the case where the oxide semiconductor film 108b has an atomic ratio of In:M:Zn=$x_b$:$y_b$:$z_b$ and the oxide semiconductor film 108a has an atomic ratio of In:M:Zn=$x_a$:$y_a$:$z_a$, $y_a$/$x_a$ is larger than $y_b$/$x_b$, preferably 1.5 or more times as large as $y_b$/$x_b$, more preferably two or more times as large as $y_b$/$x_b$. It is preferable that in the oxide semiconductor film 108a, $y_a$ be larger than or equal to $x_a$ because the transistor including the oxide semiconductor film can have stable electric characteristics.

Furthermore, in the case where the oxide semiconductor film 108c has an atomic ratio of In:M:Zn=$x_c$:$y_c$:$z_c$, $y_c$/$x_c$ is larger than $y_b$/$x_b$, preferably 1.5 or more times as large as $y_b$/$x_b$, more preferably two or more times as large as $y_b$/$x_b$. It is preferable that in the oxide semiconductor film 108c, $y_c$ be larger than or equal to $x_c$ because the transistor including the oxide semiconductor film can have stable electric characteristics.

In the atomic ratio of metal elements in a sputtering target for forming the oxide semiconductor film 108b, the atomic proportion of In is preferably higher than or equal to the atomic proportion of M, and the atomic proportion of Zn is preferably higher than or equal to the atomic proportion of M. Alternatively, when the sputtering target has an atomic ratio of metal elements of In:M:Zn=$x_b$:$y_b$:$z_b$, $x_b$/$y_b$ is preferably greater than or equal to ⅓ and less than or equal to 6, more preferably greater than or equal to 1 and less than or equal to 6, and $z_b$/$y_b$ is preferably greater than or equal to ⅓ and less than or equal to 6, more preferably greater than or equal to 1 and less than or equal to 6. When $z_b$/$y_b$ is greater than or equal to 1 and less than or equal to 6, a c-axis-aligned crystalline oxide semiconductor (CAAC-OS) film described later is easily formed as the oxide semiconductor film 108b. Typical examples of the atomic ratio of the metal elements in the target are In:M:Zn=1:1:1, In:M:Zn=1:1:1.2, In:M:Zn=3:1:2, In:M:Zn=4:2:4.1, and In:M:Zn=5:1:7.

In the atomic ratio of metal elements in a sputtering target for forming each of the oxide semiconductor films 108a and 108c, the atomic proportion of M is preferably higher than or equal to the atomic proportion of In. When the sputtering target has an atomic ratio of metal elements of In:M:Zn=$x_c$:$y_c$:$z_c$, $x_c$/$y_c$ is preferably less than $x_b$/$y_b$, and $z_c$/$y_c$ is preferably greater than or equal to ⅓ and less than or equal to 6, more preferably greater than or equal to 1 and less than or equal to 6. When $z_c$/$y_c$ is greater than or equal to 1 and less than or equal to 6, a CAAC-OS film described later is easily formed as the oxide semiconductor films 108a and 108b. Typical examples of the atomic ratio of the metal elements in the target are In:M:Zn=1:1:1, In:M:Zn=1:1:1.2, In:M:Zn=1:3:2, In:M:Zn=1:3:4, In:M:Zn=1:3:6, and In:M:Zn=1:3:8.

Note that the atomic ratio of each of the oxide semiconductor films 108a, 108b, and 108c fluctuates within a range of ±40% of the above atomic ratio as an error. For example, when a sputtering target with an atomic ratio of In:Ga:Zn=4:2:4.1 is used, the atomic ratio of In to Ga and Zn in the formed oxide semiconductor film may be 4:2:3 to 4:2:4.1. Alternatively, when a sputtering target with an atomic ratio of In:Ga:Zn=1:1:1.2 is used, the atomic ratio of In to Ga and Zn in the formed oxide semiconductor film may be 1:1:1 to 1:1:1.2. Alternatively, when a sputtering target with an atomic ratio of In:Ga:Zn=5:1:7 is used, the atomic ratio of In to Ga and Zn in the formed oxide semiconductor film may be 5:1:6 to 5:1:7.

The transistor 100 includes the oxide semiconductor film 108c between the oxide semiconductor film 108b and the insulating film 114. Hence, if carrier traps are formed between the oxide semiconductor film 108c and the insulating film 114 owing to impurities or defects, electrons flowing in the oxide semiconductor film 108b are less likely to be captured by the carrier traps because there is a distance between the oxide semiconductor film 108b and the region where the carrier traps are formed. Accordingly, the on-state current or the field-effect mobility of the transistor 100 can be high. When electrons are captured by the carrier traps, the electrons behave as negative fixed charge, resulting in fluctuation in the threshold voltage of the transistor. However, with the distance between the region where the carrier traps are formed and the oxide semiconductor film 108b, the influence of the capture of the electrons by the carrier traps in the transistor 100 can be reduced, or a fluctuation in the threshold voltage of the transistor 100 can be reduced.

The oxide semiconductor film 108c has a function of relieving damage to the oxide semiconductor film 108b when the insulating film 116 is formed. For this reason, the insulating film 116 may be formed over the oxide semiconductor film 108c without forming the insulating film 114.

The oxide semiconductor films 108a and 108c have a function of blocking external impurities. Accordingly, the amount of impurities which enter the oxide semiconductor film 108b from the outside can be reduced. Furthermore, oxygen vacancies are less likely to be formed in the oxide semiconductor films 108a and 108c. Consequently, the impurity concentration and the amount of oxygen vacancies in the oxide semiconductor film 108b can be reduced.

In the transistor 100, the oxide semiconductor film 108a is provided between the first gate insulating film and the oxide semiconductor film 108b, and the oxide semiconductor film 108c is provided between the oxide semiconductor film 108b and the second gate insulating film. Thus, it is possible to reduce the concentration of silicon or carbon at the interface or in the vicinity of the interface between the oxide semiconductor films 108a and 108b, in the oxide semiconductor film 108b, or at the interface or in the vicinity of the interface between the oxide semiconductor films 108b and 108c.

Impurities such as hydrogen or moisture entering the channel region of the oxide semiconductor film 108, particularly the oxide semiconductor film 108b, adversely affect the transistor characteristics and therefore cause a problem. Therefore, it is preferable that the amount of impurities such as hydrogen or moisture in the channel region of the oxide semiconductor film 108b be as small as possible.

Note that an impurity in a semiconductor refers to, for example, an element other than the main components of a semiconductor film. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components, specifically, hydrogen (included in water), lithium, sodium, silicon, boron, phosphorus, carbon, and nitrogen. In the case of an oxide semiconductor, for example, oxygen vacancies may be formed by entry of impurities such as hydrogen. Furthermore, when the semiconductor includes silicon, examples of an impurity which changes the characteristics of the semiconductor include oxygen, Group 1 elements except hydrogen, Group 2 elements, Group 13 elements, and Group 15 elements.

Oxygen vacancies formed in the channel region of the oxide semiconductor film 108b adversely affect the transistor characteristics and therefore cause a problem. For example, oxygen vacancies formed in the channel region of the oxide semiconductor film 108b are bonded to hydrogen to serve as a carrier supply source. The carrier supply source generated in the channel region of the oxide semiconductor film 108b causes a fluctuation in the electric characteristics, typically, a shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with an oxide semiconductor film, specifically, the insulating film 107 formed below the oxide semiconductor film 108a and the insulating films 114 and 116 formed over the oxide semiconductor film 108c include excess oxygen. Oxygen or excess oxygen is transferred from the insulating film 107 and the insulating films 114 and 116 to the oxide semiconductor film 108, whereby the amount of oxygen vacancies in the oxide semiconductor film 108 can be reduced. As a result, a fluctuation in the electric characteristics of the transistor 100, particularly a fluctuation in the electric characteristics of the transistor 100 due to light irradiation, can be suppressed.

In one embodiment of the present invention, a manufacturing method is used in which the number of manufacturing steps which make the insulating film 107 and the insulating films 114 and 116 contain excess oxygen is not increased or an increase in the number of such manufacturing steps is extremely small. Thus, the transistor 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is also added to the insulating film 114 and the oxide semiconductor films 108c and 108 below the insulating film 116 when oxygen or excess oxygen is added to the insulating film 116.

The length in the channel length direction and the length in the channel width direction of the oxide semiconductor film 108c are longer than the length in the channel length direction and the length in the channel width direction of the oxide semiconductor film 108b. In addition, the oxide semiconductor film 108b is provided in contact with the upper surface of the oxide semiconductor film 108a. Therefore, the oxide semiconductor film 108b is entirely covered with the oxide semiconductor films 108a and 108c. In other words, in the channel width direction of the transistor 100, the side surface of the oxide semiconductor film 108b includes a region in contact with the oxide semiconductor film 108c. Therefore, in the transistor 100, the oxide semiconductor film 108b does not include a region which is in contact with the first gate insulating film or the second gate insulating film.

Silicon has a high bonding strength with oxygen; for example, the bonding energy of silicon with oxygen is higher than the bonding energy of indium, zinc, or gallium with oxygen. Accordingly, when the first gate insulating film and/or the second gate insulating film includes silicon oxide and the oxide semiconductor film 108b includes a region in contact with the first gate insulating film and/or the second gate insulating film, oxygen in the oxide semiconductor film 108b is transferred to the first gate insulating film and/or the second gate insulating film in some cases, causing a bonding reaction between the oxygen and silicon in the first gate insulating film and/or the second gate insulating film. As a result, oxygen vacancies are generated and thus defect states are formed in the oxide semiconductor film 108b. In addition, hydrogen in silicon oxide is transferred to the oxygen vacancies in the oxide semiconductor film 108b to serve as a carrier supply source, which results in a transistor whose electric characteristics are likely to fluctuate.

In the transistor 100 of one embodiment of the present invention, however, the oxide semiconductor film 108b is covered with the oxide semiconductor films 108a and 108c. Thus, oxygen vacancies are unlikely to be formed in the oxide semiconductor film 108b, and entry of hydrogen into the oxide semiconductor film 108b can be prevented.

The transistor 100 having such a structure includes very few defects in the oxide semiconductor film 108 including the oxide semiconductor film 108b and thus has improved electric characteristics. Typically, the on-state current and field-effect mobility of the transistor 100 can be increased. Furthermore, in a BT stress test and a BT photostress test which are examples of a stress test, the amount of fluctuation in the threshold voltage of the transistor 100 is small, and thus, the reliability of the transistor 100 is high.

<<Band Structure of Buried Channel Structure>>

Next, the band structure of the oxide semiconductor films in the transistor 100 illustrated in FIGS. 1A to 1C is described with reference to FIG. 3.

Figure 3:
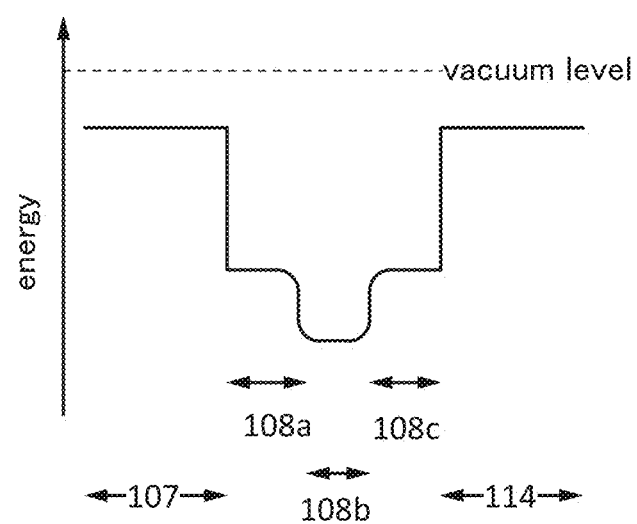
FIG. 3 shows a band structure.

FIG. 3 schematically shows part of the band structure in the thickness direction of a stack including the insulating film 107, the oxide semiconductor films 108a, 108b, and 108c, and the insulating film 114. For easy understanding, the energy level of the conduction band minimum ($E_c$) of each of the insulating film 107, the oxide semiconductor films 108a, 108b, and 108c, and the insulating film 114 is shown in the band structure.

The band diagram of FIG. 3 shows the structure in which a silicon oxide film is used as each of the insulating films 107 and 114, an oxide semiconductor film formed using a metal oxide target having an atomic ratio of metal elements of In:Ga:Zn=1:1:1.2 is used as the oxide semiconductor film 108a, an oxide semiconductor film formed using a metal oxide target having an atomic ratio of metal elements of In:Ga:Zn=4:2:4.1 is used as the oxide semiconductor film 108b, and an oxide semiconductor film formed using a metal oxide target having an atomic ratio of metal elements of In:Ga:Zn=1:1:1.2 is used as the oxide semiconductor film 108c.

As shown in FIG. 3, there is no energy barrier between the oxide semiconductor films 108a, 108b, and 108c, and the energy of the conduction band minimum is smoothly changed. In other words, the energy of the conduction band minimum is continuously changed or the conduction band minimums are continuously connected. Therefore, such an energy band structure is also referred to as a buried channel structure.

This is because the oxide semiconductor films 108a, 108b, and 108c contain the same element and oxygen is transferred between the oxide semiconductor films 108a, 108b, and 108c, so that a mixed layer is formed. To obtain such a band structure, a stacked structure which has no impurity that forms a defect state such as a trap center or a recombination center at the interface between the oxide semiconductor films 108a and 108b or at the interface between the oxide semiconductor films 108b and 108c is used.

If a continuous junction is not formed and an impurity exists between the stacked oxide semiconductor films 108a and 108b and between the stacked oxide semiconductor films 108b and 108c, a continuity of the energy band is damaged, and the carrier is trapped or recombined at the interface and then disappears.

To form a continuous junction, the films are preferably stacked in succession without exposure to the air using a deposition apparatus (sputtering apparatus) of a multi chamber type with a load lock chamber. Each chamber in the sputtering apparatus is preferably evacuated to a high vacuum state (to a degree of about $5 \times 10^{-7}$ Pa to $1 \times 10^{-4}$ Pa) with an adsorption vacuum pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen, from an exhaust system to the inside of the chamber.

In the band structure of FIG. 3, the oxide semiconductor film 108b serves as a well, and the channel region is formed in the oxide semiconductor film 108b in the transistor 100 including the oxide semiconductor films 108a, 108b, and 108c.

Even when trap states due to impurities or defects are formed at the interface or in the vicinity of the interface between the oxide semiconductor film 108a and the insulating film 107 and at the interface or in the vicinity of the interface between the oxide semiconductor film 108c and the insulating film 114 in the transistor 100, the oxide semiconductor film 108b can be distanced from the regions where the trap states are formed owing to the existence of the oxide semiconductor films 108a and 108c. However, in the case where the trap states are more distant from the vacuum level than the energy level of the conduction band minimum ($E_c$) of the oxide semiconductor film 108b functioning as a channel region, electrons are likely to be captured by the trap states. When the electrons are captured by the trap states and accumulated, negative fixed charge is generated on the surface of the insulating film, so that the threshold voltage of the transistor is shifted in the positive direction. Therefore, it is preferable that the trap states be closer to the vacuum level than the energy level of the conduction band minimum ($E_c$) of the oxide semiconductor film 108b. Such a structure inhibits accumulation of electrons in the trap states. As a result, the on-state current and the field-effect mobility of the transistor can be increased. In addition, such a structure is preferable because a fluctuation in the threshold voltage of the transistor 100 is reduced and stable electric characteristics are obtained.

To prevent the oxide semiconductor films 108a and 108c from functioning as part of the channel region, a material having lower conductivity than the oxide semiconductor film 108b is used for the oxide semiconductor films 108a and 108c. Thus, each of the oxide semiconductor films 108a and 108c can also be referred to as an oxide insulating film owing to its physical property and/or function. In addition, a material which has a smaller electron affinity (difference in energy level between the vacuum level and the conduction band minimum) than the oxide semiconductor film 108b and has a difference in energy level in the conduction band minimum from the oxide semiconductor film 108b (band offset) is preferably used for the oxide semiconductor films 108a and 108c. Furthermore, to inhibit generation of a difference in threshold voltage due to the value of drain voltage, it is preferable to form the oxide semiconductor films 108a and 108c using a material whose energy level of the conduction band minimum is closer to the vacuum level than the energy level of the conduction band minimum of the oxide semiconductor film 108b. For example, a difference in energy level between the conduction band minimum of the oxide semiconductor film 108b and the conduction band minimum of the oxide semiconductor films 108a and 108c is greater than or equal to 0.2 eV, preferably greater than or equal to 0.5 eV.

With such a structure, the oxide semiconductor film 108b serves as a main current path. That is, the oxide semiconductor film 108b functions as a channel region, and the oxide semiconductor films 108a and 108c function as oxide insulating films. In addition, since the oxide semiconductor films 108a and 108c each contain one or more metal elements included in the oxide semiconductor film 108b in which the channel region is formed, interface scattering is less likely to occur at the interface between the oxide semiconductor films 108a and 108b or at the interface between the oxide semiconductor films 108b and 108c. Thus, the transistor can have a high field-effect mobility because the transfer of carriers is not hindered at the above interfaces.

It is preferable that the oxide semiconductor films 108a and 108c not have a spinel crystal structure. This is because if the oxide semiconductor films 108a and 108c have a spinel crystal structure, a constituent element of the conductive films 112a and 112b functioning as a pair of electrodes might be diffused into the oxide semiconductor film 108b through the interface between the spinel crystal structure and other regions. Note that each of the oxide semiconductor film 108a and 108c is preferably a CAAC-OS which is described later, in which case a higher blocking property against a constituent element of the conductive films 112a and 112b functioning as a pair of electrodes, for example, a copper element, is obtained.

The thickness of each of the oxide semiconductor films 108a and 108c is greater than or equal to a thickness that is capable of inhibiting diffusion of the constituent element of the conductive films 112a and 112b functioning as a pair of electrodes to the oxide semiconductor film 108b, and less than a thickness that inhibits supply of oxygen from the insulating films 107 and 114 to the oxide semiconductor film 108b. For example, when the thickness of each of the oxide semiconductor films 108a and 108c is greater than or equal to 10 nm, the constituent element of the conductive films 112a and 112b functioning as a pair of electrodes can be prevented from diffusing into the oxide semiconductor film 108b. When the thickness of each of the oxide semiconductor films 108a and 108c is less than or equal to 100 nm, oxygen can be effectively supplied from the insulating films 107 and 114 to the oxide semiconductor film 108b.

The transistor 100, which has an s-channel structure and the stacked oxide semiconductor films as described above, is preferably used in a display device including an organic electroluminescence element (also referred to as an organic EL element) as a light-emitting element.

An organic EL element is a current-driving-type element. In a transistor controlling the organic EL element, the field-effect mobility and the on-state current in a saturation region (a voltage region where drain voltage is higher than a voltage obtained by subtracting the threshold voltage from gate voltage, i.e., $V_d > V_g - V_{th}$) are particularly important among the electric characteristics. Owing to an s-channel structure and the stacked oxide semiconductor films of the transistor 100, the on-state current and the field-effect mobility can be increased. Furthermore, a fluctuation in electric characteristics can be suppressed.

<1-2. Components of Semiconductor Device>

Components of the semiconductor device of this embodiment are described in detail below.

<<Oxide Semiconductor Film>>

The oxide semiconductor films 108a, 108b, and 108c can be formed using any of the materials described above.

The thickness of each of the oxide semiconductor films 108a, 108b, and 108c is preferably greater than or equal to 3 nm and less than or equal to 200 nm, more preferably greater than or equal to 3 nm and less than or equal to 100 nm, more preferably greater than or equal to 3 nm and less than or equal to 50 nm.

An oxide semiconductor film with a low impurity concentration and a low density of defect states is preferably used as each of the oxide semiconductor films 108a, 108b, and 108c, because the transistor can have more excellent electric characteristics. Here, the state where the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources and thus can have a low carrier density.

That is, a highly purified intrinsic or substantially highly purified intrinsic oxide semiconductor film is preferably used as the oxide semiconductor film 108b. The term "substantially intrinsic" refers to a state where the oxide semiconductor film has a carrier density of higher than or equal to $1\times10^{-9}/cm^3$ and lower than $8\times10^{11}/cm^3$, preferably lower than $1\times10^{11}/cm^3$, more preferably lower than $1\times10^{10}/cm^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

A transistor in which a channel region is formed in a highly purified intrinsic or substantially highly purified intrinsic oxide semiconductor film is likely to have positive threshold voltage (normally-off characteristics). A highly purified intrinsic or substantially highly purified intrinsic oxide semiconductor film has a low density of defect states and accordingly has a low density of trap states in some cases.

Furthermore, a transistor including a highly purified intrinsic or substantially highly purified intrinsic oxide semiconductor film has an extremely low off-state current; even when a semiconductor element has a channel width of $1\times10^6$ μm and a channel length of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of from 1 V to 10 V. Thus, a transistor whose channel region is formed in such an oxide semiconductor film has a small fluctuation in the electric characteristics and a high reliability.

Charge trapped by the trap states in the oxide semiconductor film takes a long time to be released and may behave like fixed charge. Thus, a transistor whose channel region is formed in an oxide semiconductor film having a high density of trap states has unstable electric characteristics in some cases. Examples of the impurity include hydrogen, nitrogen, alkali metal, and alkaline earth metal.

Hydrogen contained in an oxide semiconductor film reacts with oxygen bonded to a metal atom to form water, and in addition, an oxygen vacancy is formed in a lattice from which oxygen is released (or a portion from which oxygen is released). Due to entry of hydrogen into the oxygen vacancy, an electron serving as a carrier might be generated. Furthermore, in some cases, bonding of part of hydrogen to oxygen bonded to a metal atom causes generation of an electron serving as a carrier. Thus, a transistor including an oxide semiconductor film that contains hydrogen is likely to have negative threshold voltage (normally-on characteristics).

Thus, hydrogen in an oxide semiconductor film where a channel of a transistor is formed is preferably reduced as much as possible. Specifically, in the oxide semiconductor film 108b, the concentration of hydrogen, which is measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$. As a result, the transistor has positive threshold voltage (normally-off characteristics).

When silicon or carbon that is one of Group 14 elements is contained in the oxide semiconductor film 108$b$, the number of oxygen vacancies is increased in the oxide semiconductor film 108$b$, and the oxide semiconductor film 108$b$ becomes an n-type film. Thus, the concentration of silicon or carbon in the oxide semiconductor film 108$b$, which is measured by SIMS, is lower than or equal to $2\times10^{18}$ atoms/cm$^3$, preferably lower than or equal to $2\times10^{17}$ atoms/cm$^3$. As a result, the transistor 100 has positive threshold voltage (normally-off characteristics).

The concentration of alkali metal or alkaline earth metal in the oxide semiconductor film 108$b$, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 108$b$. As a result, the transistor 100 has positive threshold voltage (normally-off characteristics).

Furthermore, when containing nitrogen, the oxide semiconductor film 108$b$ easily becomes an n-type film by generation of electrons serving as carriers and an increase of carrier density. A transistor including an oxide semiconductor film that contains nitrogen is likely to have negative threshold voltage (normally-on characteristics). For this reason, the concentration of nitrogen, which is measured by SIMS, is preferably lower than or equal to $5\times10^{18}$ atoms/cm$^3$.

It is preferable to perform heat treatment after an oxide semiconductor film used for a channel region of a transistor is formed. The heat treatment is preferably performed at a temperature of higher than or equal to 250° C. and lower than or equal to 650° C., preferably higher than or equal to 300° C. and lower than or equal to 400° C., more preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here allows impurities such as hydrogen and water to be removed from the oxide semiconductor film. Note that the above-described heat treatment may also be performed before the oxide semiconductor film is processed into an island shape.

Note that, without limitation to those described above, a material with an appropriate composition may be used for the oxide semiconductor film depending on required semiconductor characteristics and electric characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the oxide semiconductor film be set to appropriate values.

In addition, the oxide semiconductor film 108$b$ preferably includes a CAAC-OS described later. A CAAC-OS structure has a lower density of defect states than a polycrystalline structure, a microcrystalline structure described later, and an amorphous structure.

Note that the oxide semiconductor film 108$b$ may be a mixed film including two or more of the following: a region having a microcrystalline structure, a region having a polycrystalline structure, a CAAC-OS region, and a region having a single-crystal structure. The mixed film has a single-layer structure including, for example, two or more of the following in some cases: a region having an amorphous structure, a region having a polycrystalline structure, a CAAC-OS region, and a region having a single-crystal structure. Furthermore, the mixed film has a stacked-layer structure including, for example, two or more of the following in some cases: a region having an amorphous structure, a region having a polycrystalline structure, a CAAC-OS region, and a region having a single-crystal structure.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102.

In the case where a glass substrate is used as the substrate 102, a large glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly over the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Films Functioning as First Gate Electrode and a Pair of Electrodes>>

The conductive film 104 functioning as a first gate electrode and the conductive films 112$a$ and 112$b$ functioning as a pair of electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), yttrium (Y), and zirconium (Zr), an alloy containing any of these metal elements as its component, an alloy including a combination of any of these metal elements, or the like.

Furthermore, the conductive films 104, 112$a$, and 112$b$ may have a single-layer structure or a stacked-layer structure of two or more layers. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order can be given. Alternatively, an alloy film or a nitride film in which aluminum and one or more elements selected from titanium, tantalum, tungsten, molybdenum, chromium, neodymium, and scandium are combined may be used.

A Cu—X alloy film (X is Mn, Ni, Cr, Fe, Co, Mo, Ta, or Ti) may be used as the conductive films 104, 112a, and 112b. The use of a Cu—X alloy film enables the manufacturing cost to be reduced because a wet etching process can be used in processing.

It is particularly preferable that the conductive films 104, 112a, and 112b contain at least one of titanium, tungsten, tantalum, and molybdenum. When the conductive films 104, 112a, and 112b contain at least one of titanium, tungsten, tantalum, and molybdenum, copper in the conductive films 104, 112a, and 112b can be prevented from being diffused to the outside, so that a function of what is called a barrier metal can be obtained.

Furthermore, the conductive films 104, 112a, and 112b preferably include a nitride containing nitrogen and tantalum or a nitride containing nitrogen and titanium. Such a nitride has conductivity and a high barrier property against copper or hydrogen. In addition, a film of such a nitride releases little hydrogen and can be favorably used as a metal in contact with the oxide semiconductor film.

The conductive films 104, 112a, and 112b can also be formed using a light-transmitting conductive material such as indium oxide, tin oxide, zinc oxide, indium tin oxide (ITO), indium zinc oxide, indium oxide containing tungsten oxide, indium zinc oxide containing tungsten oxide, indium oxide containing titanium oxide, indium tin oxide containing titanium oxide, or indium tin oxide to which silicon oxide is added. It is also possible to have a stacked structure formed using the above light-transmitting conductive material and the above metal element.

<<First Gate Insulating Film>>

As each of the insulating films 106 and 107 functioning as a first gate insulating film of the transistor 100, a stacked layer or a single layer including at least one of the following deposited by a plasma enhanced chemical vapor deposition (PECVD) method, a sputtering method, or the like can be used: silicon oxide, silicon oxynitride, silicon nitride oxide, silicon nitride, aluminum oxide, hafnium oxide, yttrium oxide, zirconium oxide, tantalum oxide, magnesium oxide, lanthanum oxide, cerium oxide, neodymium oxide, gallium oxide, and a Ga—Zn-based metal oxide. Note that instead of a stacked structure of the insulating films 106 and 107, an insulating film of a single layer formed using a material selected from the above or an insulating film of three or more such layers may be used.

The insulating film 106 functions as a blocking film which inhibits penetration of oxygen. For example, in the case where excess oxygen is supplied to the insulating films 107, 114, and 116 and/or the oxide semiconductor film 108, the insulating film 106 can inhibit penetration of oxygen.

Note that, preferably, the insulating film 107 in contact with the oxide semiconductor film 108a is an oxide insulating film and includes a region containing oxygen in excess of the stoichiometric composition (oxygen-excess region). In other words, the insulating film 107 is an insulating film capable of releasing oxygen. In order to provide the oxygen excess region in the insulating film 107, the insulating film 107 may be formed in an oxygen atmosphere, for example. Alternatively, oxygen may be added to the formed insulating film 107. A method for adding oxygen to the formed insulating film 107 is described later.

Furthermore, the insulating films 106 and 107 are preferably formed using a high-k material such as hafnium silicate (HfSi$O_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide. The material containing hafnium or yttrium has a higher dielectric constant than silicon oxide and silicon oxynitride. Therefore, the thickness can be increased as compared with the silicon oxide film; thus, leakage current due to tunneling current can be reduced. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. A silicon nitride film has a higher dielectric constant than a silicon oxide film and needs a larger thickness for a capacitance equivalent to that of a silicon oxide film. Therefore, when the first gate insulating film of the transistor 100 includes a silicon nitride film, the physical thickness of the first gate insulating film can be large. This makes it possible to reduce a decrease in withstand voltage of the transistor 100 and furthermore to increase the withstand voltage, thereby reducing electrostatic discharge damage to the transistor 100.

The thickness of the first gate insulating film is preferably greater than or equal to 5 nm and less than or equal to 400 nm, more preferably greater than or equal to 10 nm and less than or equal to 300 nm, more preferably greater than or equal to 50 nm and less than or equal to 250 nm.

<<Second Gate Insulating Film>>

It is preferable that the insulating films 114 and 116 functioning as a second gate insulating film include at least an oxide insulating film containing more oxygen than that in the stoichiometric composition. Here, as the insulating film 114, an oxide insulating film which permeates oxygen is formed, and as the oxide insulating film 116, an oxide insulating film which contains more oxygen than that in the stoichiometric composition is formed. Although the second gate insulating film has a two-layer structure, the second gate insulating film can have a single layer structure, a three-layer structure, or a stacked-layer structure including four or more layers as appropriate. Note that in these cases, at least an oxide insulating film containing more oxygen than that in the stoichiometric composition is preferably included.

The insulating film 114 is an oxide insulating film which permeates oxygen. Therefore, oxygen released from the insulating film 116 provided over the insulating film 114 can be transferred to the oxide semiconductor film 108 through the insulating film 114. In addition, the insulating film 114 also functions as a film which relieves damage to the oxide semiconductor film 108 at the time of forming the insulating film 116 in a later step.

The thickness of the insulating film 114 is greater than or equal to 5 nm and less than or equal to 150 nm, preferably greater than or equal to 5 nm and less than or equal to 50 nm. For the insulating film 114, silicon oxide, silicon oxynitride, or the like can be used.

It is preferable that the amount of defects in the insulating film 114 be small. Typically, the spin density of a signal that appears at g=2.001 due to a dangling bond of silicon is preferably lower than or equal to $3 \times 10^{17}$ spins/cm$^3$ by ESR measurement. This is because if the density of defects in the insulating film 114 is high, oxygen is bonded to the defects and the amount of oxygen that permeates the insulating film 114 is decreased.

Furthermore, it is preferable that the amount of defects at the interface between the insulating film 114 and the oxide semiconductor film 108c be small. Typically, the spin density of a signal that appears at g=1.93 due to a defect in the oxide semiconductor film 108 is preferably lower than or equal to $1 \times 10^{17}$ spins/cm$^3$, more preferably lower than or equal to the lower limit of detection by ESR measurement.

Note that all oxygen entering the insulating film 114 from the outside is transferred to the outside of the insulating film 114 in some cases. Alternatively, some oxygen entering the insulating film 114 from the outside remains in the insulating film 114 in some cases. Furthermore, transfer of oxygen occurs in the insulating film 114 in some cases in such a manner that oxygen enters the insulating film 114 from the outside and oxygen contained in the insulating film 114 is transferred to the outside of the insulating film 114. When an oxide insulating film which can transmit oxygen is formed as the insulating film 114, oxygen released from the insulating film 116 provided over the insulating film 114 can be transferred to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases a small amount of nitrogen oxide, an aluminum oxynitride film that releases a small amount of nitrogen oxide, or the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment in which the surface temperature of the film is higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms a state in the insulating film 114, for example. The state is positioned in the energy gap of the oxide semiconductor film 108. Therefore, when nitrogen oxide is diffused to the interface or the vicinity of the interface between the insulating film 114 and the oxide semiconductor film 108c, an electron is in some cases trapped by the state on the insulating film 114 side. As a result, the trapped electron remains at the interface or in the vicinity of the interface between the insulating film 114 and the oxide semiconductor film 108c; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface or in the vicinity of the interface between the insulating film 114 and the oxide semiconductor film 108c.

By using the above oxide insulating film, the insulating film 114 can reduce the shift in the threshold voltage of the transistor, which leads to a smaller fluctuation in the electric characteristics of the transistor.

Note that in an ESR spectrum at 100 K or lower of the insulating film 114, by heat treatment of a manufacturing process of the transistor, typically heat treatment at a temperature of higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966, the smaller the amount of nitrogen oxide contained in the oxide insulating film.

The concentration of nitrogen in the oxide insulating film, which is measured by SIMS, is lower than or equal to $6 \times 10^{20}$ atoms/cm$^3$.

The oxide insulating film is formed by a PECVD method at a substrate temperature of higher than or equal to 220° C., higher than or equal to 280° C., or higher than or equal to 350° C. using silane and dinitrogen monoxide, whereby a dense and hard film can be formed.

The insulating film 116 is formed to be in contact with the insulating film 114. The insulating film 116 is formed using an oxide insulating film that contains more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

In the case where the insulating film 116 includes the oxide insulating film containing more oxygen than that in the stoichiometric composition, part of oxygen contained in the insulating film 116 can be transferred to the oxide semiconductor film 108 through the insulating film 114 to reduce oxygen vacancies in the oxide semiconductor film 108.

In a transistor formed using an oxide semiconductor film including oxygen vacancies, the threshold voltage is likely to shift in the negative direction, and such a transistor tends to have negative threshold voltage (normally-on characteristics). This is because charge is generated owing to oxygen vacancies in the oxide semiconductor film and the resistance is thus reduced. The transistor having normally-on characteristics causes various problems in that a malfunction is likely to be caused when in operation and that power consumption is increased when not in operation, for example. Furthermore, there is a problem in that the amount of change in electric characteristics, typified by threshold voltage, of the transistor is increased with passage of time or due to a stress test.

However, in the transistor 100 described in this embodiment, the oxide insulating film containing more oxygen than that in the stoichiometric composition is included in the insulating film 116 provided over the oxide semiconductor film 108; thus, oxygen contained in the insulating film 116 can be transferred to the oxide semiconductor film 108 through the insulating film 114 to reduce oxygen vacancies in the oxide semiconductor film 108. In addition, because the second gate insulating film is not exposed to an etching atmosphere, the second gate insulating film has few defects. As a result, the transistor has positive threshold voltage (normally-off characteristics). Furthermore, the amount of change in electric characteristics, typified by threshold voltage with respect to operation time, of the transistor with passage of time or due to a stress test can be reduced. Furthermore, a change in the threshold voltage can be reduced even when a stress test is repeatedly performed.

Oxygen can be introduced by a method in which the acceleration energy is applied to a gas under reduced pressure, specifically, an ion implantation method, an ion doping method, a plasma immersion ion implantation method, plasma treatment, or the like. When oxygen is introduced, a substrate is preferably heated because a larger amount of oxygen can be introduced. The substrate temperature at the time when oxygen is introduced is preferably higher than room temperature and lower than 350° C., for example. For the above plasma treatment, an apparatus with which an oxygen gas is made to be plasma by high-frequency power (also referred to as a plasma etching apparatus or a plasma ashing apparatus) is preferably used.

The insulating film 116 preferably has a thickness of greater than or equal to 30 nm and less than or equal to 500 nm, more preferably greater than or equal to 50 nm and less than or equal to 400 nm. For the insulating film 116, silicon oxide, silicon oxynitride, or the like can be used.

It is preferable that the amount of defects in the insulating film 116 be small. Typically, the spin density of a signal that appears at g=2.001 due to a dangling bond of silicon is preferably lower than $6 \times 10^{17}$ spins/cm$^3$, more preferably lower than $3 \times 10^{17}$ spins/cm$^3$, more preferably lower than or equal to $1.5 \times 10^{17}$ spins/cm$^3$ by ESR measurement. Note that the insulating film 116 is provided more apart from the oxide semiconductor film 108 than the insulating film 114; thus, the insulating film 116 may have a higher defect density than the insulating film 114.

The amount of released oxygen can be found by measuring the insulating film by thermal desorption spectroscopy (TDS). For example, the amount of released oxygen molecules from the insulating films 114 and 116 is greater than or equal to $8.0 \times 10^{14}$/cm$^2$, preferably greater than or equal to $1.0 \times 10^{15}$/cm$^2$, more preferably greater than or equal to $1.5 \times 10^{15}$/cm$^2$ by TDS. Note that the surface temperature of the film in TDS is higher than or equal to 100° C. and lower than or equal to 700° C., preferably higher than or equal to 100° C. and lower than or equal to 500° C.

In one embodiment of the present invention, a conductive film capable of inhibiting release of oxygen (also simply referred to as a conductive film) is formed over the insulating film 116, and oxygen is introduced to the insulating films 114 and 116 through the conductive film, so that the oxygen excess region is formed in the insulating films 114 and 116.

For the conductive film capable of inhibiting release of oxygen, for example, indium (In) and a material including one of zinc (Zn), tin (Sn), tungsten (W), titanium (Ti), and silicon (Si) can be used. As the conductive film, a conductive film containing indium or a semiconductor film containing indium is particularly preferable. The conductive film may be removed after oxygen introduction. For the conductive film containing indium, a light-transmitting conductive material such as indium gallium zinc oxide (IGZO), indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide containing silicon oxide (ITSO) can be used. Among the above-described materials, ITSO is particularly preferably used as the conductive film capable of inhibiting release of oxygen because it can be deposited over an insulating film having roughness or the like with favorable coverage.

<<Conductive Films Functioning as Second Gate Electrode and Pixel Electrode>>

The conductive film 120b functioning as a second gate electrode and the conductive film 120a functioning as a pixel electrode can be formed using a material and a method similar to those of the conductive film 104 functioning as a first gate electrode and the conductive films 112a and 112b functioning as a pair of electrodes which are described above.

Alternatively, the conductive films 120a and 120b can be formed using a material and a method similar to those of the oxide semiconductor films 108a, 108b, and 108c which are described above. For example, the conductive films 120a and 120b can be formed using an In oxide, an In—Sn oxide, an In—Zn oxide, an In—Ga oxide, a Zn oxide, an Al—Zn oxide, an In—Ga—Zn oxide, or the like. It is particularly preferable to use an In—Sn oxide or an In—Ga—Zn oxide. Alternatively, the conductive films 120a and 120b can be formed using indium tin oxide (ITO) or indium tin oxide to which silicon oxide is added (ITSO).

The conductive films 120*a* and 120*b* preferably contain a metal element contained in the oxide semiconductor films 108*a*, 108*b*, and 108*c*. In the case where the conductive films 120*a* and 120*b* are formed using an oxide semiconductor included in the oxide semiconductor films 108*a*, 108*b*, and 108*c*, the conductive films 120*a* and 120*b* function as a protective film for suppressing release of oxygen from the insulating films 114 and 116. In that case, the conductive films 120*a* and 120*b* function as semiconductors before a step of forming the insulating film 118 and function as conductors after the step of forming the insulating film 118. Therefore, the conductive films 120*a* and 120*b* can each be referred to as an oxide conductor film.

In the case where an oxide semiconductor is used for the conductive films 120*a* and 120*b*, in order to allow the conductive films 120*a* and 120*b* to function as conductors, oxygen vacancies are formed in the conductive films 120*a* and 120*b*, and hydrogen is added from the insulating film 118 to the oxygen vacancies, whereby donor states are formed in the vicinity of the conduction band. As a result, the conductivity of each of the conductive films 120*a* and 120*b* is increased, so that the conductive films 120*a* and 120*b* become conductors. The conductive films 120*a* and 120*b* having become conductors can each be referred to as an oxide conductor film. An oxide semiconductor generally has a visible light transmitting property because of its large energy gap. An oxide conductor is an oxide semiconductor having donor states in the vicinity of the conduction band. Therefore, the influence of absorption due to the donor states is small in an oxide conductor, and an oxide conductor has a visible light transmitting property comparable to that of an oxide semiconductor.

The conductive film 120*a* functioning as a pixel electrode and the conductive film 120*b* functioning as a second gate electrode can be formed using a material and a method similar to those of the oxide semiconductor film. For example, the conductive films 120*a* and 120*b* and the oxide semiconductor films 108*a*, 108*b*, and 108*c* contain the same metal element; thus, the manufacturing cost can be reduced.

For example, in the case where the conductive films 120*a* and 120*b* each include an In-M-Zn oxide, a sputtering target for forming the In-M-Zn oxide preferably includes a region where the atomic proportion of In is higher than or equal to the atomic proportion of M in the atomic ratio of metal elements. The atomic ratio of metal elements in such a sputtering target is In:M:Zn=2:1:3, In:M:Zn=3:1:2, In:M:Zn=4:2:4.1, In:M:Zn=5:1:7, or the like. To form the conductive films 120*a* and 120*b*, the composition of the sputtering target is not limited to that described above. The conductive films 120*a* and 120*b* can each have a single-layer structure or a stacked-layer structure of two or more layers.

<<Protective Insulating Film>>

The insulating film 118 functions as a protective insulating film of the transistor 100.

The insulating film 118 has an effect of blocking at least hydrogen and oxygen. Preferably, the insulating film 118 has an effect of blocking oxygen, hydrogen, water, alkali metal, alkaline earth metal, and the like. It is possible to prevent outward diffusion of oxygen from the oxide semiconductor film 108 and entry of hydrogen, water, and the like into the oxide semiconductor film 108 from the outside by including the insulating film 118.

The insulating film 118 has a function of supplying one of or both hydrogen and nitrogen to the conductive film 120*a* functioning as a pixel electrode and the conductive film 120*b* functioning as a second gate electrode. The insulating film 118 preferably contains hydrogen and has a function of supplying the hydrogen to the conductive films 120*a* and 120*b*. In the case where the conductive films 120*a* and 120*b* are formed using an oxide semiconductor film, the conductive films 120*a* and 120*b* function as conductors by being supplied with hydrogen from the insulating film 118.

The insulating film 118 has a thickness of greater than or equal to 50 nm and less than or equal to 300 nm, preferably greater than or equal to 100 nm and less than or equal to 200 nm. A nitride insulating film can be used as the insulating film 118. The nitride insulating film can be formed using silicon nitride, silicon nitride oxide, aluminum nitride, aluminum nitride oxide, or the like.

Note that instead of the insulating film 118, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Note that the above-described various films such as the electrodes, the insulating films, and the oxide semiconductor film can be formed by a sputtering method, a chemical vapor deposition (CVD) method, a vacuum evaporation method, a pulsed laser deposition (PLD) method, or the like. Alternatively, the above-described various films such as the electrodes, the insulating films, and the oxide semiconductor film can be formed by a plasma enhanced chemical vapor deposition (PECVD) method, a thermal CVD method, or an atomic layer deposition (ALD) method. As an example of a thermal CVD method, a metal organic chemical vapor deposition (MOCVD) method can be given. Further alternatively, the above-described various films such as the electrodes, the insulating films, and the oxide semiconductor film can be formed by a coating method or a printing method.

A thermal CVD method has an advantage that no defect due to plasma damage is generated since it does not utilize plasma to form a film.

A film may be formed by a thermal CVD method in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

A film may be formed by an ALD method in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that plural kinds of source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer, and then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by an ALD method or a thermal CVD method such as an MOCVD method. To form an In—Ga—Zn—O film, for example, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. As another material liquid, tetrakis(ethylmethylamide)hafnium can be given.

For example, in the case where an aluminum oxide film is formed with a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. As another material liquid, tris(dimethylamide)aluminum, triisobutylaluminum, and aluminum tris(2,2,6,6-tetramethyl-3,5-heptanedionate) can be given.

For example, in the case where a silicon oxide film is formed with a deposition apparatus employing ALD, hexachlorodisilane is adsorbed on a surface on which a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed with a deposition apparatus employing ALD, a $WF_6$ gas and a $B_2H_6$ gas are sequentially introduced a plurality of times to form an initial tungsten film, and then a $WF_6$ gas and an $H_2$ gas are sequentially introduced a plurality of times to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<1-3. Structural Examples 2 to 7 of Semiconductor Device>

Structure examples different from that of the transistor 100 illustrated in FIGS. 1A to 1C are described with reference to FIGS. 4A to 4C to FIGS. 13A to 13D. In FIGS. 4A to 4C to FIGS. 13A to 13D, a portion having a function similar to that of the transistor 100 is shown by the same hatching and not especially denoted by a reference numeral in some cases.

<<Structure Example 2 of Semiconductor Device>>

Figure 4A:
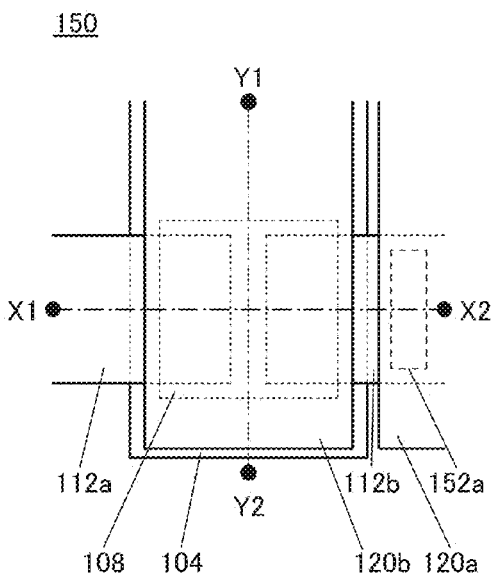
FIGS. 4A to 4C are a top view and cross-sectional views illustrating one embodiment of a semiconductor device.
Figure 4B:
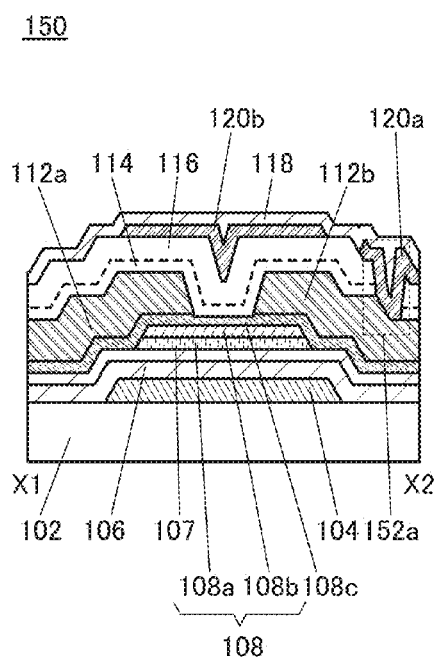
Figure 4C:
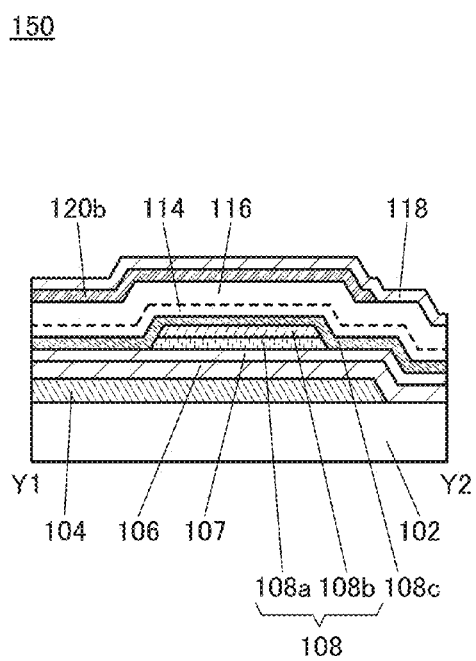

FIG. 4A is a top view of a transistor 150 that is a semiconductor device of one embodiment of the present invention. FIG. 4B is a cross-sectional view taken along the dashed-dotted line X1-X2 in FIG. 4A, and FIG. 4C is a cross-sectional view taken along the dashed-dotted line Y1-Y2 in FIG. 4A.

The transistor 150 is different from the transistor 100 in that it includes the oxide semiconductor film 108*c* over the insulating film 107 and the oxide semiconductor film 108, the conductive films 112*a* and 112*b* functioning as a pair of electrodes over the oxide semiconductor film 108*c*, and the insulating film 114 over the oxide semiconductor film 108*c* and the conductive films 112*a* and 112*b*. Furthermore, the transistor 150 is different from the transistor 100 in that the conductive film 120*a* over the insulating film 116 is electrically connected to one of the conductive films 112*a* and 112*b* (the conductive film 112*b* in FIG. 4B) through the opening 152*a* provided in the insulating films 114 and 116. Other components of the transistor 150 are similar to those of the transistor 100 and have similar effects. Structures different from those in the transistor 100 are described below.

The length in the channel length direction and the length in the channel width direction of the oxide semiconductor film 108*c* are longer than the length in the channel length direction and the length in the channel width direction of the oxide semiconductor film 108*b*. The oxide semiconductor film 108*b* is provided in contact with the upper surface of the oxide semiconductor film 108*a*.

In the channel width direction and the channel length direction of the transistor 150, the side surface of the oxide semiconductor film 108*b* is in contact with the oxide semiconductor film 108*c*. Therefore, in the transistor 150, the oxide semiconductor film 108*b* is in contact with only the oxide semiconductor films 108*a* and 108*c* containing the same metal element as that of the oxide semiconductor film 108*b*.

Therefore, in the transistor 150 of one embodiment of the present invention, the oxide semiconductor film 108*b* is entirely covered with the oxide semiconductor films 108*a* and 108*c*. Thus, oxygen vacancies are unlikely to be formed in the oxide semiconductor film 108*b*, and entry of hydrogen into the oxide semiconductor film 108*b* can be prevented.

In the deposition process or etching process for forming the conductive films 112*a* and 112*b* over the oxide semiconductor film 108*c*, regions of the oxide semiconductor film 108*c* which are in contact with the conductive films 112*a* and 112*b* and the vicinity thereof are activated to be low-resistance (n-type) regions. Accordingly, the conductive films 112*a* and 112*b* are electrically connected to the oxide semiconductor film 108 and function as a pair of electrodes.

In the transistor 150, the oxide semiconductor film 108b functions as a channel region, and the oxide semiconductor film 108c functions as an oxide insulating film.

The oxide semiconductor film 108b is not exposed to the atmosphere for forming the conductive films 112a and 112b and the insulating films 107 and 114 and thus includes fewer defect states.

Figure 6A:
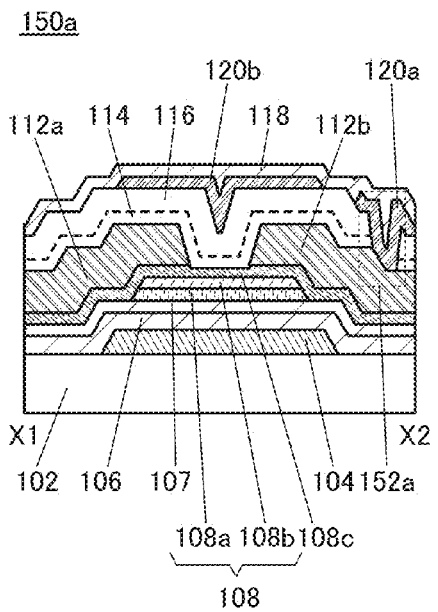
FIGS. 6A to 6D are cross-sectional views each illustrating one embodiment of a semiconductor device.
Figure 6B:
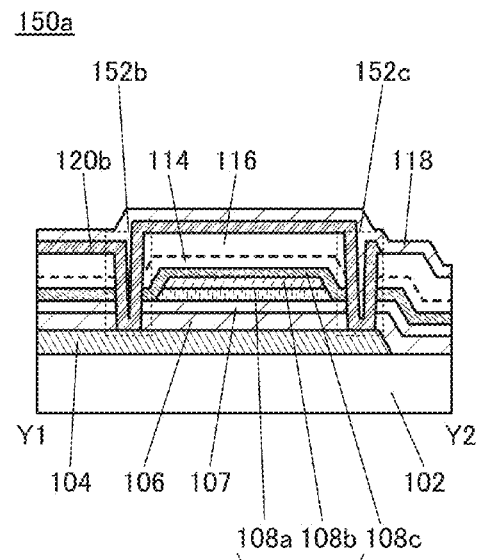

As in a transistor 150a illustrated in FIGS. 6A and 6B, the conductive film 120b functioning as a second gate electrode may be connected to the conductive film 104 functioning as a first gate electrode through the openings 152b and 152c provided in the first gate insulating film (the insulating films 106 and 107), the oxide semiconductor film 108c, and the second gate insulating film (the insulating films 114, and 116). The top view of the transistor 150a corresponds to the top view of the transistor 100a in FIG. 2A. FIG. 6A is a cross-sectional view taken along the dashed dotted line X1-X2 in FIG. 2A, and FIG. 6B is a cross-sectional view taken along the dashed dotted line Y1-Y2 in FIG. 2A. Other components of the transistor 150a are similar to those of the transistor 150; thus, the structure of the transistor 150 can be referred to.

The transistor 150a has an s-channel structure in which the conductive film 104 is connected to the conductive film 120b through the openings 152b and 152c provided in the first gate insulating film, the oxide semiconductor film 108c, and the second gate insulating film. Accordingly, the oxide semiconductor film 108 included in the transistor 150a can be electrically surrounded by electric fields of the conductive films 104 and 120b effectively.

<<Structure Example 3 of Semiconductor Device>>

Figure 5A:
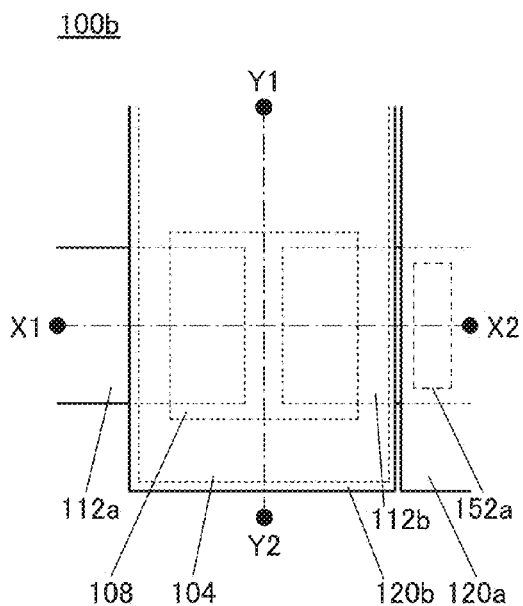
FIGS. 5A to 5C are a top view and cross-sectional views illustrating one embodiment of a semiconductor device.
Figure 5B:
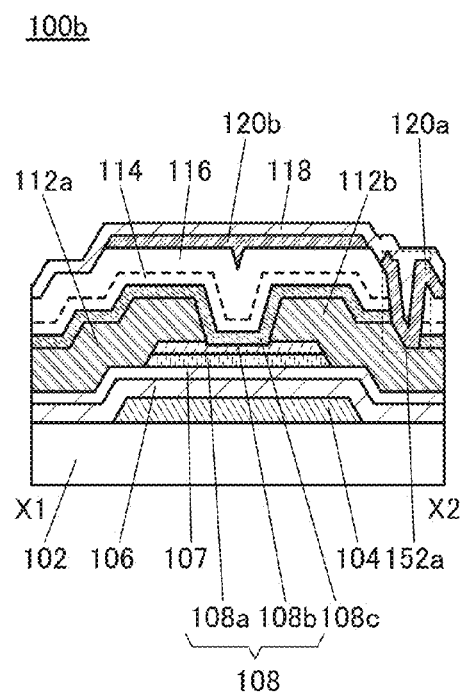
Figure 5C:
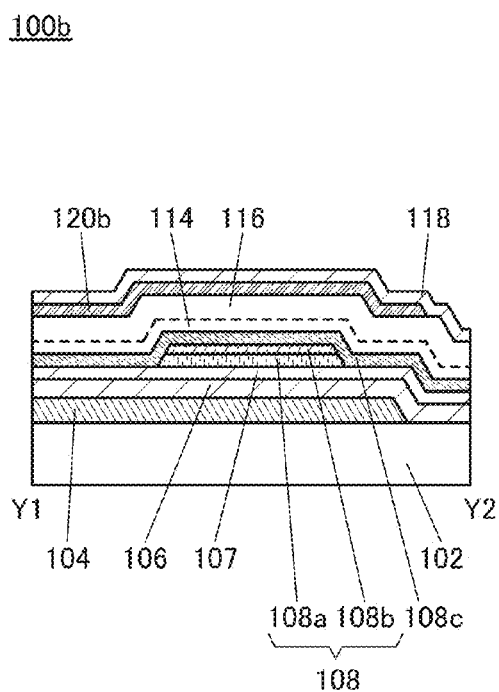

FIG. 5A is a top view of a transistor 100b that is a semiconductor device of one embodiment of the present invention. FIG. 5B is a cross-sectional view taken along the dashed-dotted line X1-X2 in FIG. 5A, and FIG. 5C is a cross-sectional view taken along the dashed-dotted line Y1-Y2 in FIG. 5A.

The transistor 100b is different from the transistor 100 in that the length in the channel length direction and the length in the channel width direction of the conductive film 120b functioning as a second gate electrode are longer than the length in the channel length direction and the length in the channel width direction of the conductive film 104 functioning as a first gate electrode. Other components of the transistor 100b are similar to those of the transistor 100 and have similar effects. Structures different from those in the transistor 100 are described below.

Since the length in the channel length direction and the length in the channel width direction of the conductive film 120b are long, the oxide semiconductor film 108 included in the transistor 100b can be electrically surrounded by electric fields of the conductive films 104 and 120b effectively.

In the case where the conductive film 120b has a light-blocking property and the length in the channel length direction and the length in the channel width direction of the conductive film 120b are long, the oxide semiconductor film 108 can be effectively shielded from light. As a result, the transistor can be highly resistant to light, thereby reducing a fluctuation in electric characteristics of the transistor due to light irradiation.

Figure 6C:
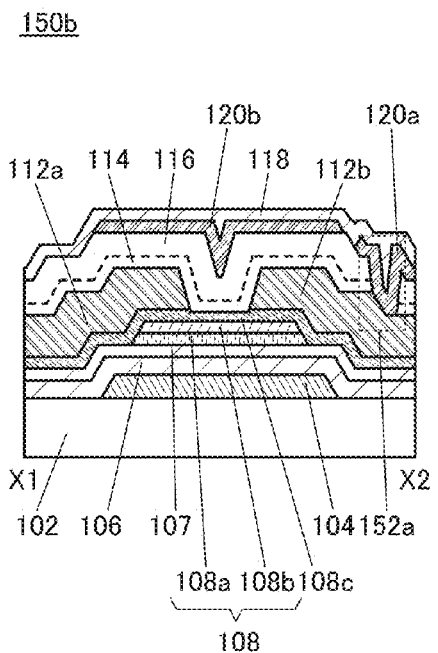
Figure 6D:
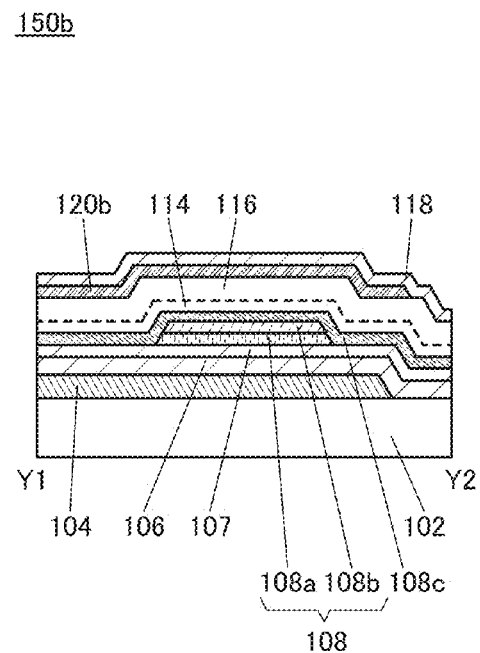

Like a transistor 150b illustrated in FIGS. 6C and 6D, the transistor may include the oxide semiconductor film 108c over the insulating film 107 and the oxide semiconductor film 108, the conductive films 112a and 112b functioning as a pair of electrodes over the oxide semiconductor film 108c, and the insulating film 114 over the oxide semiconductor film 108c and the conductive films 112a and 112b. The top view of the transistor 150b corresponds to the top view of the transistor 100b in FIG. 5A. FIG. 6C is a cross-sectional view taken along the dashed dotted line X1-X2 in FIG. 5A, and FIG. 6D is a cross-sectional view taken along the dashed dotted line Y1-Y2 in FIG. 5A. Other components of the transistor 150b are similar to those of the transistor 150; thus, the structure of the transistor 150 can be referred to.

<<Structural Example 4 of Semiconductor Device>>

Figure 7A:
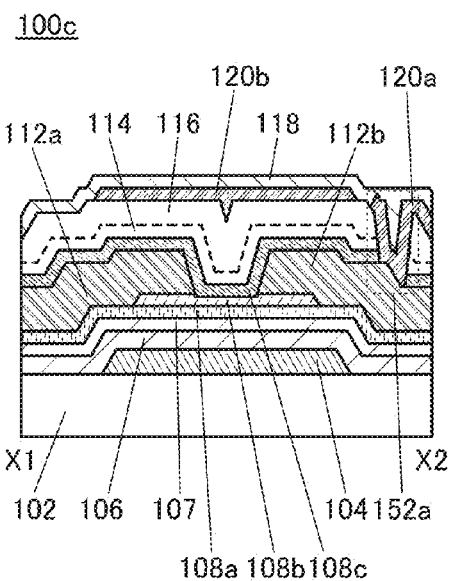
FIGS. 7A to 7D are cross-sectional views each illustrating one embodiment of a semiconductor device.
Figure 7B:
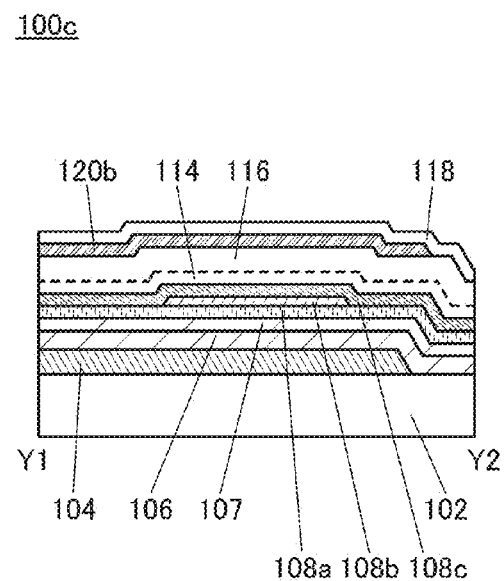

FIGS. 7A and 7B are cross-sectional views of a transistor 100c that is a semiconductor device of one embodiment of the present invention. The top view of the transistor 100c corresponds to the top view of the transistor 100b in FIG. 5A. FIG. 7A is a cross-sectional view taken along the dashed-dotted line X1-X2 in FIG. 5A, and FIG. 7B is a cross-sectional view taken along the dashed-dotted line Y1-Y2 in FIG. 5A.

The transistor 100c is different from the transistor 100b in that it includes the oxide semiconductor film 108a over the insulating film 107, the oxide semiconductor film 108b over the oxide semiconductor film 108a, the conductive films 112a and 112b functioning as a pair of electrodes electrically connected to the oxide semiconductor film 108b and provided over the oxide semiconductor films 108a and 108b, and the oxide semiconductor film 108c over the oxide semiconductor films 108a and 108b and the conductive films 112a and 112b. Other components of the transistor 100c are similar to those of the transistor 100b and have similar effects. Structures different from those in the transistor 100b are described below.

The length in the channel length direction and the length in the channel width direction of the oxide semiconductor film 108a are longer than the length in the channel length direction and the length in the channel width direction of the oxide semiconductor film 108b. The length in the channel length direction and the length in the channel width direction of the oxide semiconductor film 108c are longer than the length in the channel length direction and the length in the channel width direction of the oxide semiconductor film 108b.

In the channel width direction of the transistor 100c, the side surface of the oxide semiconductor film 108b is in contact with the oxide semiconductor film 108c. Therefore, the oxide semiconductor film 108b is entirely covered with the oxide semiconductor films 108a and 108c. In other words, in the channel width direction of the transistor 100c, the side surface of the oxide semiconductor film 108b includes a region in contact with the oxide semiconductor film 108c. Therefore, in the transistor 100c, the oxide semiconductor film 108b does not include a region which is in contact with the first gate insulating film or the second gate insulating film.

The length in the channel length direction and the length in the channel width direction of the oxide semiconductor film 108a are longer than the length in the channel length direction and the length in the channel width direction of the oxide semiconductor film 108b; in this way, generation of oxygen vacancies in the oxide semiconductor film 108b and entry of hydrogen into the oxide semiconductor film 108b can be suppressed effectively.

Figure 7C:
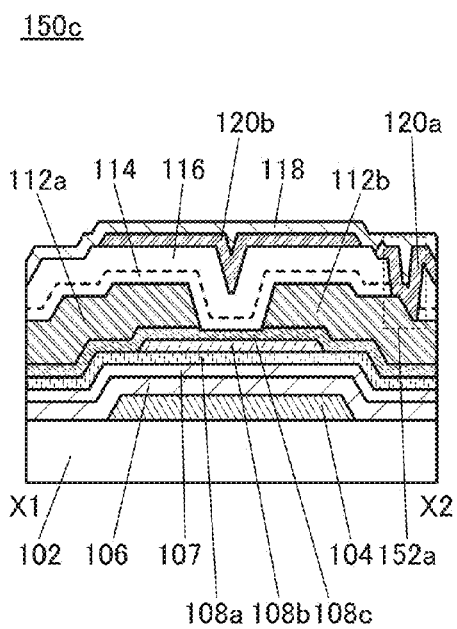
Figure 7D:
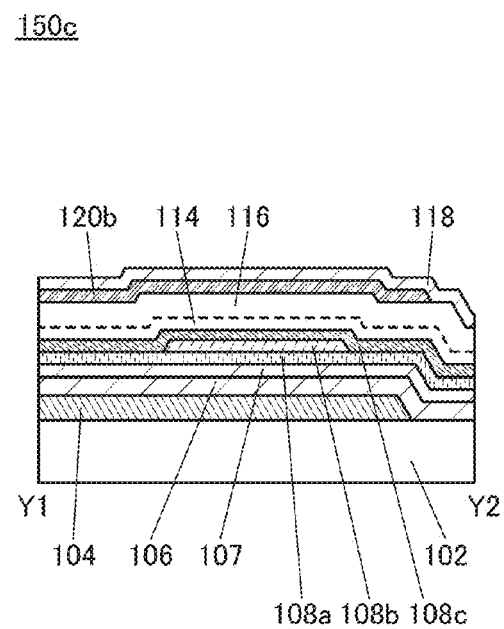

Like a transistor 150c illustrated in FIGS. 7C and 7D, the transistor may include the oxide semiconductor film 108c over the oxide semiconductor films 108a and 108b, the conductive films 112a and 112b functioning as a pair of electrodes over the oxide semiconductor film 108c, and the insulating film 114 over the oxide semiconductor film 108c and the conductive films 112a and 112b. The top view of the transistor 150c corresponds to the top view of the transistor 100b in FIG. 5A. FIG. 7C is a cross-sectional view taken along the dashed dotted line X1-X2 in FIG. 5A, and FIG. 7D is a cross-sectional view taken along the dashed dotted line Y1-Y2 in FIG. 5A. Other components of the transistor 150c are similar to those of the transistor 150b; thus, the structure of the transistor 150b can be referred to.

<<Structural Example 5 of Semiconductor Device>>

Figure 8A:
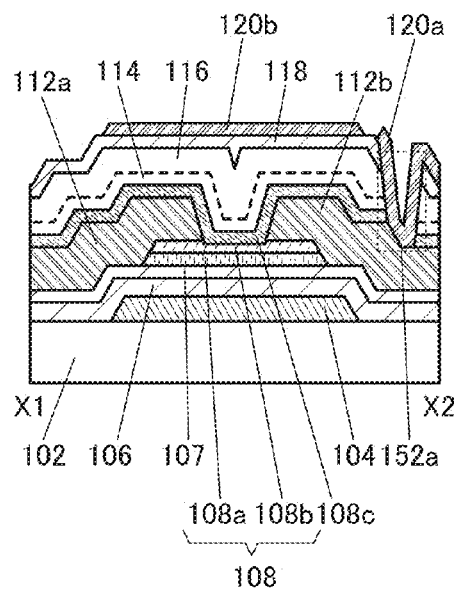
FIGS. 8A to 8D are cross-sectional views each illustrating one embodiment of a semiconductor device.
Figure 8B:
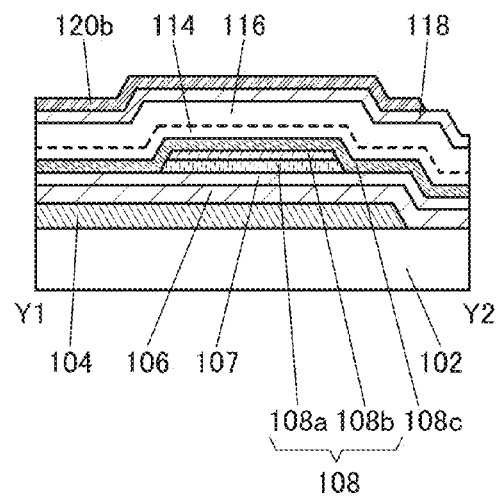

FIGS. 8A and 8B are cross-sectional views of a transistor 160a that is a semiconductor device of one embodiment of the present invention. The top view of the transistor 160a corresponds to the top view of the transistor 100b in FIG. 5A. FIG. 8A is a cross-sectional view taken along the dashed-dotted line X1-X2 in FIG. 5A, and FIG. 8B is a cross-sectional view taken along the dashed-dotted line Y1-Y2 in FIG. 5A.

The transistor 160a is different from the transistor 100b in that it includes the insulating film 118 functioning as a protective insulating film over the insulating film 116, and the conductive film 120b functioning as a second gate electrode and the conductive film 120a functioning as a pixel electrode over the insulating film 118. That is, the transistor 160a includes, as a second gate insulating film, the insulating films 114, 116, and 118. Furthermore, the transistor 160a is different from the transistor 100b in that the conductive film 120a over the insulating film 118 is electrically connected to one of the conductive films 112a and 112b (the conductive film 112b in FIG. 8A) through the opening 152a provided in the oxide semiconductor film 108c and the insulating films 114, 116, and 118. Other components of the transistor 160a are similar to those of the transistor 100b and have similar effects. Structures different from those in the transistor 100b are described below.

The insulating film 118 has an effect of blocking at least hydrogen and oxygen. Preferably, the insulating film 118 has an effect of blocking oxygen, hydrogen, water, alkali metal, alkaline earth metal, and the like. It is possible to effectively prevent outward diffusion of oxygen from the oxide semiconductor film 108 and entry of hydrogen, water, and the like into the oxide semiconductor film 108 from the outside by including the insulating film 118 in the second gate insulating film.

Figure 8C:
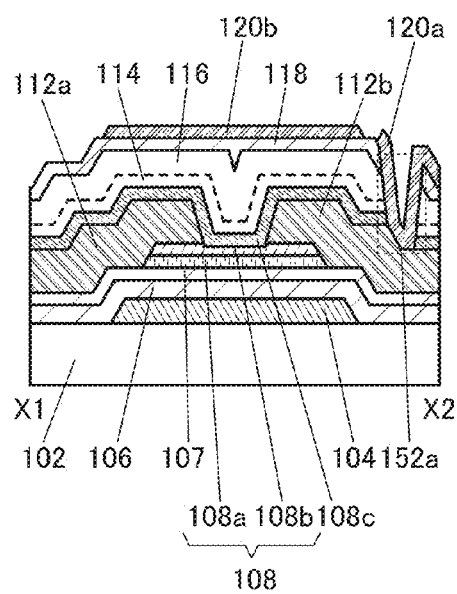
Figure 8D:
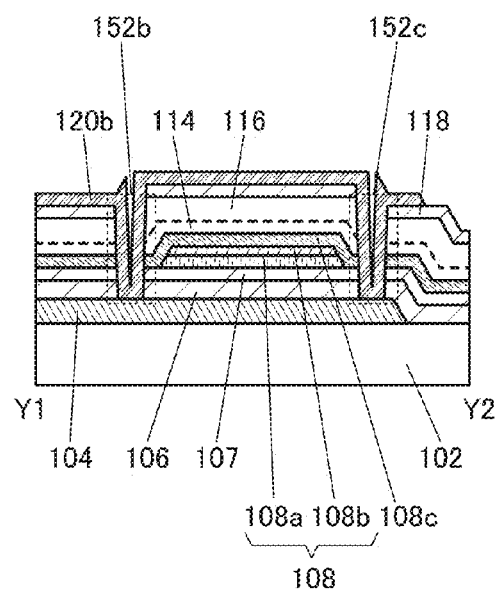

As in a transistor 160b illustrated in FIGS. 8C and 8D, the conductive film 120b functioning as a second gate electrode may be connected to the conductive film 104 functioning as a first gate electrode through the openings 152b and 152c provided in the first gate insulating film (the insulating films 106 and 107), the oxide semiconductor film 108c, and the second gate insulating film (the insulating films 114, 116, and 118). Other components of the transistor 160b are similar to those of the transistor 160a; thus, the structure of the transistor 160a can be referred to.

The transistor 160b has an s-channel structure in which the conductive film 104 is connected to the conductive film 120b through the openings 152b and 152c provided in the first gate insulating film, the oxide semiconductor film 108c, and the second gate insulating film. Accordingly, the oxide semiconductor film 108 included in the transistor 160b can be electrically surrounded by electric fields of the conductive films 104 and 120b effectively.

Figure 9A:
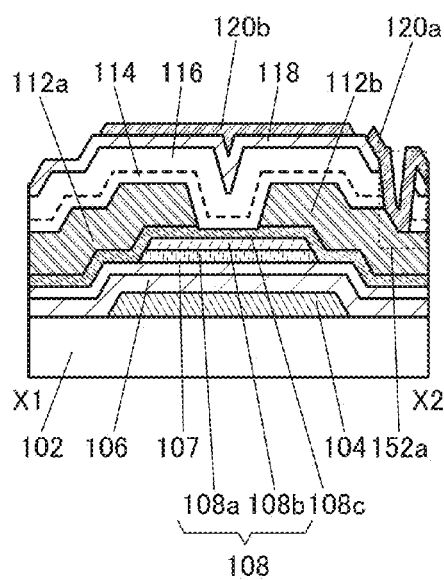
FIGS. 9A to 9D are cross-sectional views each illustrating one embodiment of a semiconductor device.
Figure 9B:
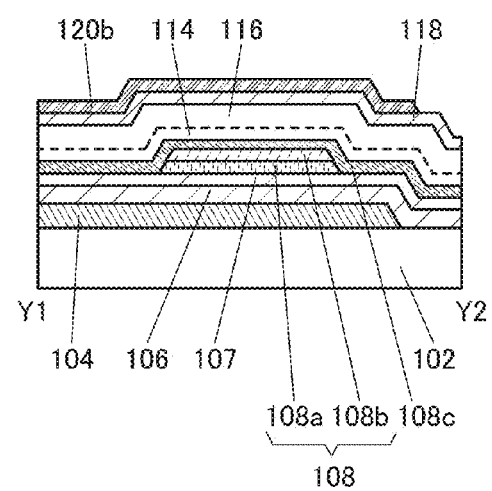

Like a transistor 170a illustrated in FIGS. 9A and 9B, the transistor may include the oxide semiconductor film 108c over the insulating film 107 and the oxide semiconductor film 108, the conductive films 112a and 112b functioning as a pair of electrodes over the oxide semiconductor film 108c, and the insulating film 114 over the oxide semiconductor film 108c and the conductive films 112a and 112b. Other components of the transistor 170a are similar to those of the transistor 150b; thus, the structure of the transistor 150b can be referred to.

Figure 9C:
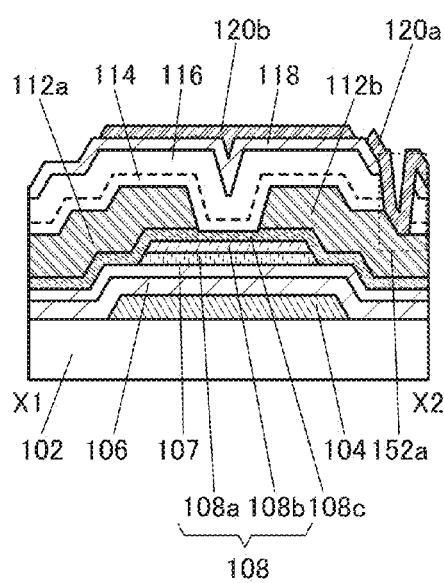
Figure 9D:
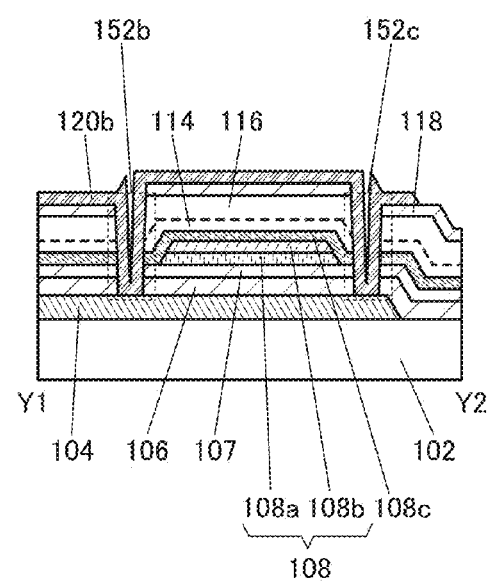

As in a transistor 170b illustrated in FIGS. 9C and 9D, the conductive film 120b functioning as a second gate electrode may be connected to the conductive film 104 functioning as a first gate electrode through the openings 152b and 152c provided in the first gate insulating film (the insulating films 106 and 107), the oxide semiconductor film 108c, and the second gate insulating film (the insulating films 114, 116, and 118). Other components of the transistor 170b are similar to those of the transistor 170a; thus, the structure of the transistor 170a can be referred to.

The transistor 170b has an s-channel structure in which the conductive film 104 is connected to the conductive film 120b through the openings 152b and 152c provided in the first gate insulating film, the oxide semiconductor film 108c, and the second gate insulating film. Accordingly, the oxide semiconductor film 108 included in the transistor 170b can be electrically surrounded by electric fields of the conductive films 104 and 120b effectively.

Figure 10A:
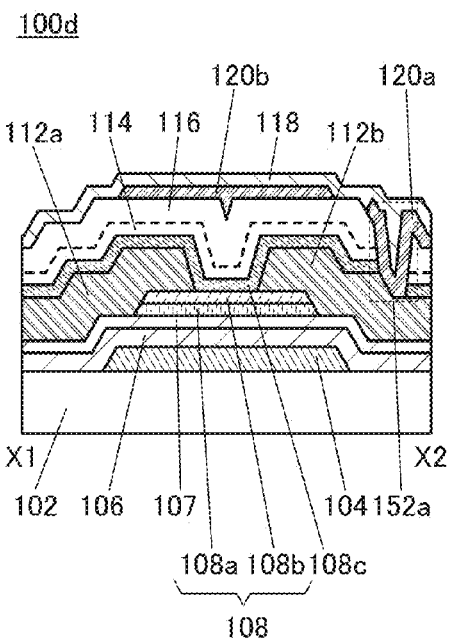
FIGS. 10A to 10D are cross-sectional views each illustrating one embodiment of a semiconductor device.
Figure 10B:
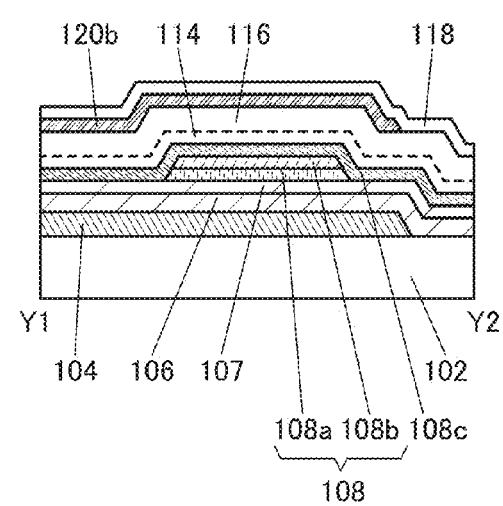
Figure 10C:
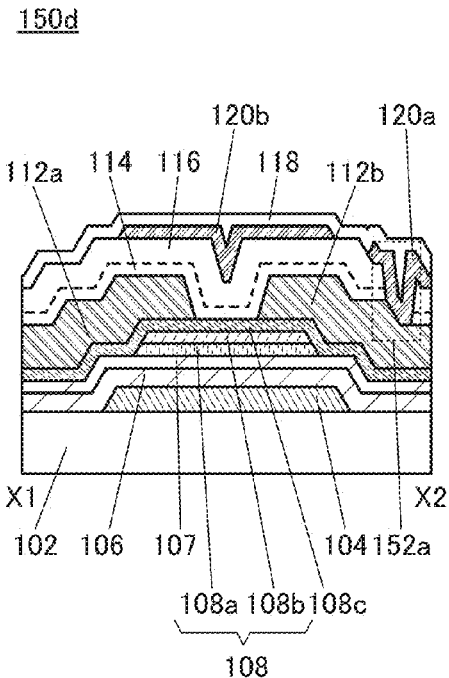
Figure 10D:
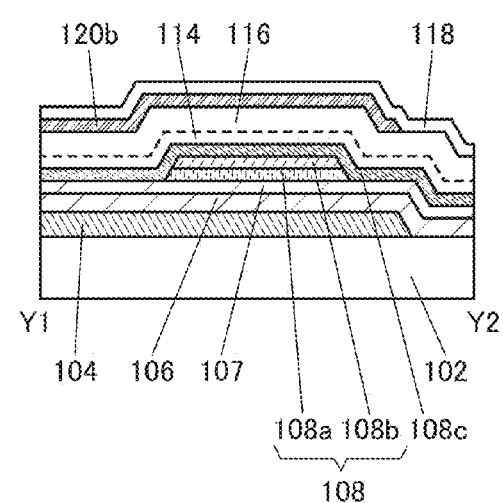

The drawings illustrate an example in which the oxide semiconductor film 108b in the transistor 100 and the oxide semiconductor film 108c in the transistor 150 have a small thickness in a region which is not covered with the conductive films 112a and 112b, that is, an example in which part of the oxide semiconductor film has a depressed portion. However, one embodiment of the present invention is not limited thereto, and the oxide semiconductor film does not necessarily have a depressed portion in a region which is not covered with the conductive films 112a and 112b. FIGS. 10A to 10D illustrate examples in that case. FIGS. 10A to 10D are cross-sectional views illustrating examples of the semiconductor device. FIGS. 10A and 10B illustrate a transistor 100d having a structure in which the oxide semiconductor film 108b in the transistor 100 does not have a depressed portion, and FIGS. 10C and 10D illustrate a transistor 150d having a structure in which the oxide semiconductor film 108c in the transistor 150 does not have a depressed portion.

<<Structure Example 6 of Semiconductor Device>>

Figure 11A:
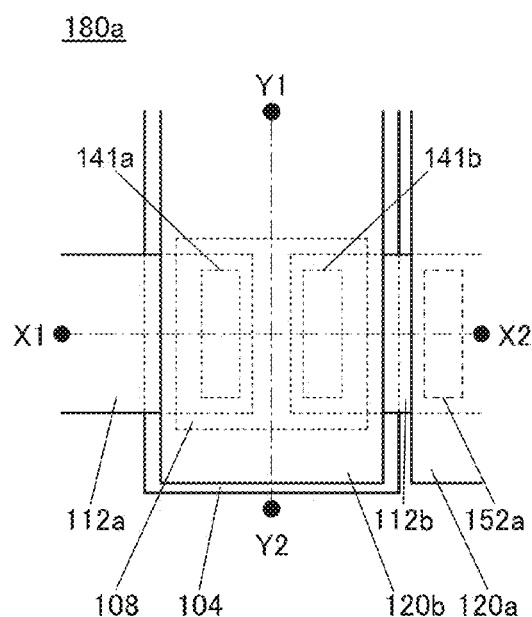
FIGS. 11A to 11C are a top view and cross-sectional views illustrating one embodiment of a semiconductor device.
Figure 11B:
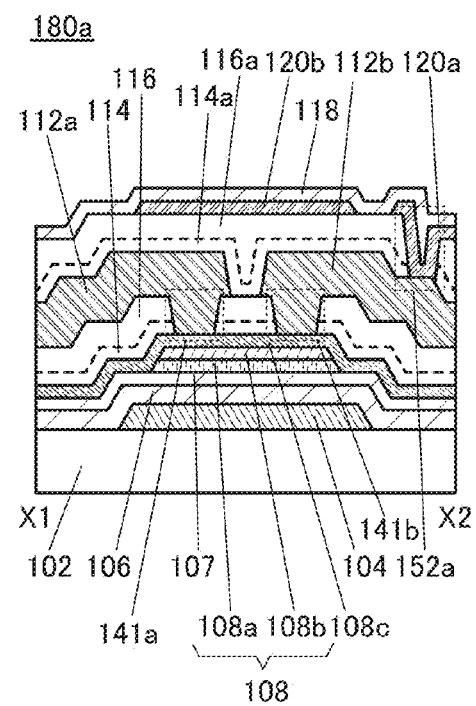

FIG. 11A is a top view of a transistor 180a that is a semiconductor device of one embodiment of the present invention. FIG. 11B is a cross-sectional view taken along the dashed dotted line X1-X2 in FIG. 11A, and FIG. 11C is a cross-sectional view taken along the dashed dotted line Y1-Y2 in FIG. 11A.

The transistor 180a includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the oxide semiconductor film 108c over the oxide semiconductor film 108 and the insulating film 107, the insulating film 114 over the oxide semiconductor film 108c, the insulating film 116 over the insulating film 114, the conductive films 112a and 112b functioning as a pair of electrodes electrically connected to the oxide semiconductor film 108 through openings 141a and 141b provided in the insulating films 114 and 116, an insulating film 114a over the insulating film 116 and the conductive films 112a and 112b, an insulating film 116a over the insulating film 114a, the conductive film 120a electrically connected to one of the conductive films 112a and 112b functioning as a pair of electrodes (the conductive film 112b in FIG. 11B) through the opening 152a provided in the insulating films 114a and 116a, the conductive film 120b functioning as a second gate electrode over the insulating film 116a, and the insulating film 118 over the insulating film 116a and the conductive films 120a and 120b. The oxide semiconductor film 108 includes the oxide semiconductor films 108a and 108b.

Figure 11C:
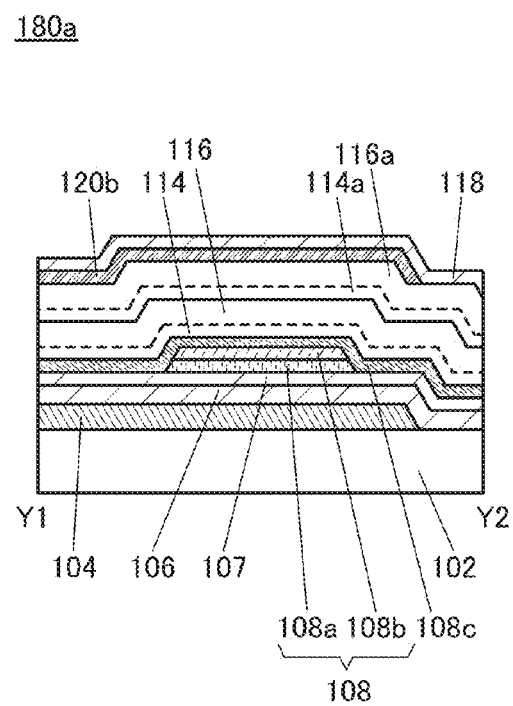

Although the transistor 150 has a channel-etched structure, the transistor 180a in FIGS. 11A to 11C has a channel protective structure. Thus, either the channel-etched structure or the channel protective structure can be applied to the semiconductor device of one embodiment of the present invention.

Like the transistor 150 described above, the transistor 180a includes the oxide semiconductor film 108c over the oxide semiconductor film 108; thus, oxygen vacancies are unlikely to be formed in the oxide semiconductor film 108b, and entry of hydrogen into the oxide semiconductor film 108b can be prevented. The insulating films 114a and 116a have a function similar to that of the insulating films 114 and 116 and can be formed using materials and methods similar to those of the insulating films 114 and 116. Other components of the transistor 180a are similar to those of the transistor 150 and have similar effects.

Figure 13A:
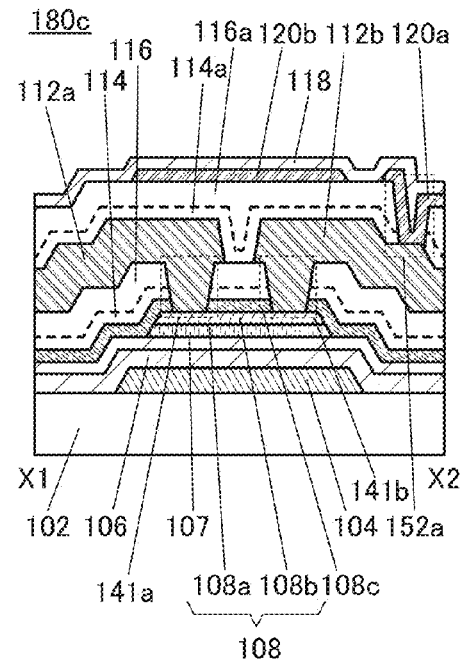
FIGS. 13A to 13D are cross-sectional views each illustrating one embodiment of a semiconductor device.
Figure 13B:
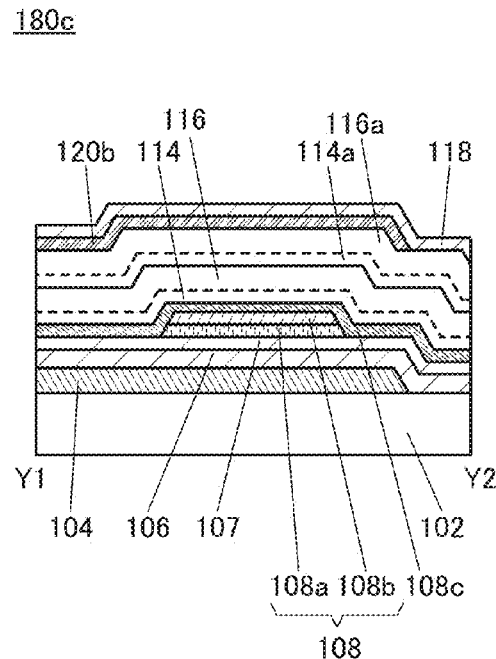

As in a transistor 180c illustrated in FIGS. 13A and 13B, the conductive films 112a and 112b functioning as a pair of electrodes may be connected to the oxide semiconductor film 108 through openings provided in the oxide semiconductor film 108c. The top view of the transistor 180c corresponds to the top view of the transistor 180a in FIG. 11A. FIG. 13A is a cross-sectional view taken along the dashed dotted line X1-X2 in FIG. 11A, and FIG. 13B is a cross-sectional view taken along the dashed dotted line Y1-Y2 in FIG. 11A. Other components of the transistor 180c are similar to those of the transistor 180a; thus, the structure of the transistor 180a can be referred to.

Figure 13C:
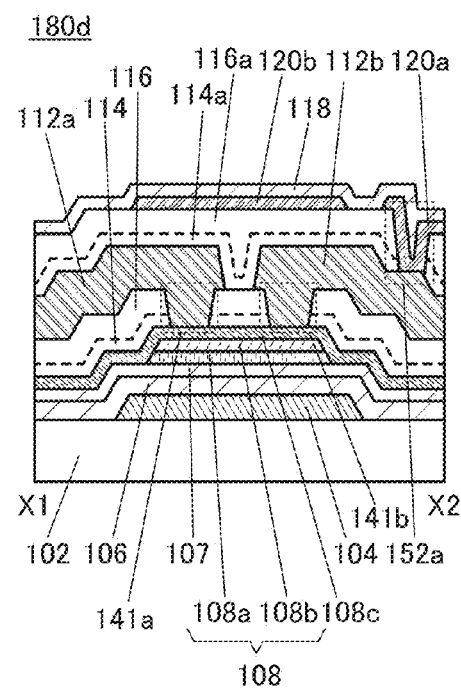
Figure 13D:
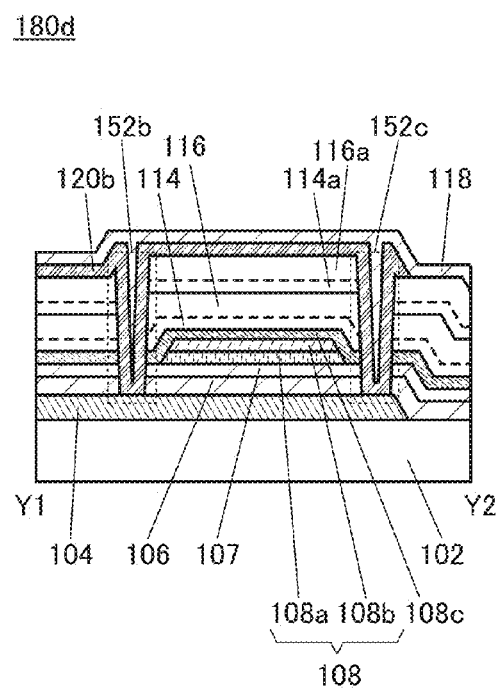

As in a transistor 180d illustrated in FIGS. 13C and 13D, the conductive film 120b functioning as a second gate electrode may be connected to the conductive film 104 functioning as a first gate electrode through the openings 152b and 152c provided in the first gate insulating film (the insulating films 106 and 107), the oxide semiconductor film 108c, and the second gate insulating film (the insulating films 114, 116, 114a, and 116a). Other components of the transistor 180d are similar to those of the transistor 180a; thus, the structure of the transistor 180a can be referred to.

The transistor 180d has an s-channel structure in which the conductive film 104 is connected to the conductive film 120b through the openings 152b and 152c provided in the first gate insulating film, the oxide semiconductor film 108c, and the second gate insulating film. Accordingly, the oxide semiconductor film 108 included in the transistor 180d can be electrically surrounded by electric fields of the conductive films 104 and 120b effectively.

<<Structure Example 7 of Semiconductor Device>>

Figure 12A:
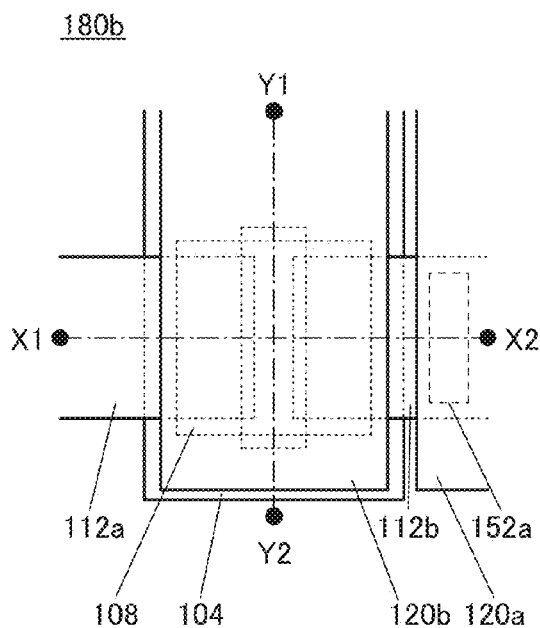
FIGS. 12A to 12C are a top view and cross-sectional views illustrating one embodiment of a semiconductor device.
Figure 12B:
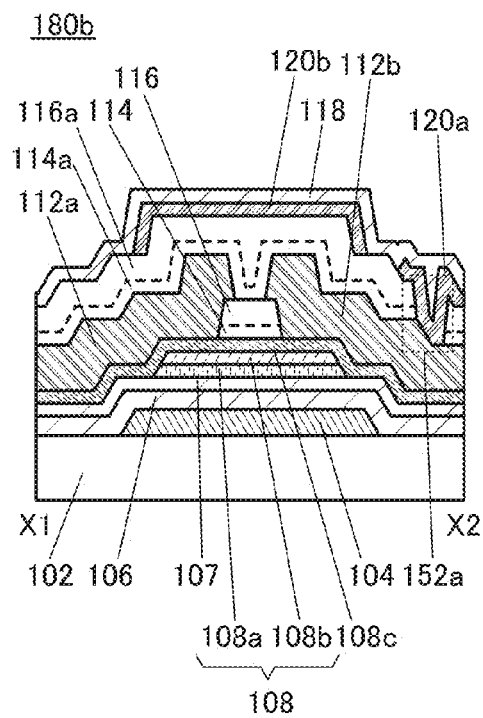
Figure 12C:
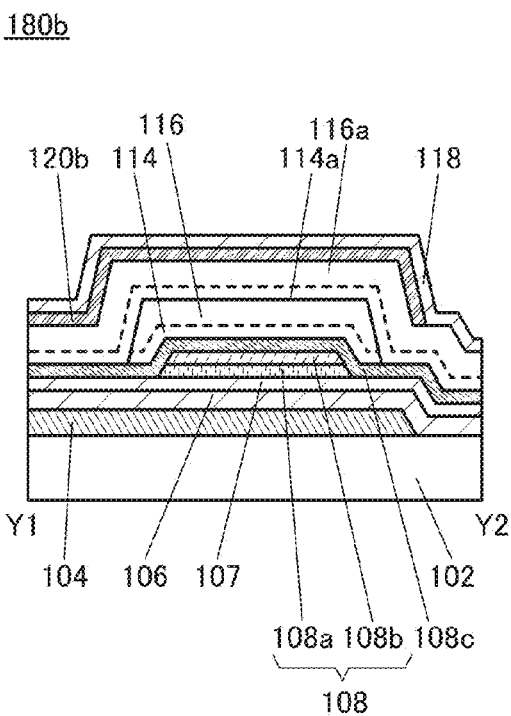

FIG. 12A is a top view of a transistor 180b that is a semiconductor device of one embodiment of the present invention. FIG. 12B is a cross-sectional view taken along the dashed-dotted line X1-X2 in FIG. 12A, and FIG. 12C is a cross-sectional view taken along the dashed-dotted line Y1-Y2 in FIG. 12A. The transistor 180b includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the oxide semiconductor film 108c over the oxide semiconductor film 108 and the insulating film 107, the insulating film 114 over the oxide semiconductor film 108c, the insulating film 116 over the insulating film 114, the conductive films 112a and 112b functioning as a pair of electrodes electrically connected to the oxide semiconductor film 108, the insulating film 114a over the insulating film 116 and the conductive films 112a and 112b, the insulating film 116a over the insulating film 114a, the conductive film 120a electrically connected to one of the conductive films 112a and 112b functioning as a pair of electrodes (the conductive film 112b in FIG. 12B) through the opening 152a provided in the insulating films 114a and 116a, the conductive film 120b functioning as a second gate electrode over the insulating film 116a, and the insulating film 118 over the insulating film 116a and the conductive films 120a and 120b. The oxide semiconductor film 108 includes the oxide semiconductor films 108a and 108b.

The transistor 180b is different from the transistor 180a in FIGS. 11A to 11C in the shapes of the insulating films 114 and 116. Specifically, the insulating films 114 and 116 of the transistor 180b have island shapes and are provided over a channel region of the oxide semiconductor film 108. The transistor 180b has an s-channel structure in which the oxide semiconductor film 108 is surrounded by the conductive films 104 and 120b such that the first gate insulating film (the insulating films 106 and 107) is provided between the oxide semiconductor film 108 and the conductive film 104 and the second gate insulating film (the insulating films 114, 116, 114a, and 116a) is provided between the oxide semiconductor film 108 and the conductive film 120b. Accordingly, the oxide semiconductor film 108 included in the transistor 180b can be electrically surrounded by electric fields of the conductive films 104 and 120b effectively. Other components of the transistor 180b are similar to those of the transistor 180a and have similar effects.

Like the transistor 150 described above, the transistor 180b includes the oxide semiconductor film 108c over the oxide semiconductor film 108; thus, oxygen vacancies are unlikely to be formed in the oxide semiconductor film 108b, and entry of hydrogen into the oxide semiconductor film 108b can be prevented. Other components of the transistor 180b are similar to those of the transistor 150 described above and have similar effects.

The structures of the transistors of this embodiment can be freely combined with each other.

<1-4. Manufacturing Method of Transistor>

Next, a method for manufacturing the transistor 100 that is a semiconductor device of one embodiment of the present invention is described with reference to FIGS. 14A to 14F, FIGS. 15A to 15F, FIGS. 16A to 16F, FIGS. 17A to 17F, and FIGS. 18A and 18B. FIGS. 14A to 14F to FIGS. 18A and 18B are cross sectional views illustrating a method for manufacturing the semiconductor device. Cross-sectional views in the channel length direction along the line X1-X2 and cross-sectional views in the channel width direction along the line Y1-Y2 are used to describe the method for manufacturing the transistor 100.

<<Step of Forming First Gate Electrode and First Gate Insulating Film>>

First, a conductive film is formed over the substrate 102 and processed through a lithography process and an etching process, whereby the conductive film 104 functioning as a first gate electrode is formed. Then, the insulating films 106 and 107 which function as a first gate insulating film are formed over the conductive film 104 (see FIGS. 14A and 14B).

In this embodiment, a glass substrate is used as the substrate 102, and as the conductive film 104 functioning as a first gate electrode, a 100-nm-thick tungsten film is formed by a sputtering method. A 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the insulating film 106 has the three-layer structure of silicon nitride films, for example, in the case where a conductive film containing copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve the withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film containing oxygen to improve characteristics of an interface with the oxide semiconductor film 108 (specifically, the oxide semiconductor film 108b) formed later.

<<Step 1 of Forming Oxide Semiconductor Film>>

Next, an oxide semiconductor film 108a_0 and an oxide semiconductor film 108b_0 are formed over the insulating film 107 (see FIGS. 14C to 14F).

Figure 14A:
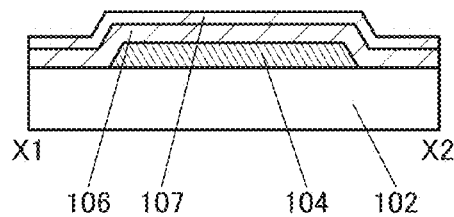
FIGS. 14A to 14F are cross-sectional views illustrating an example of a manufacturing process of a semiconductor device.
Figure 14B:
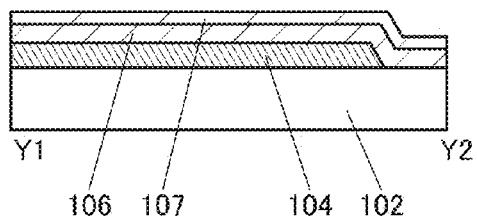
Figure 14C:
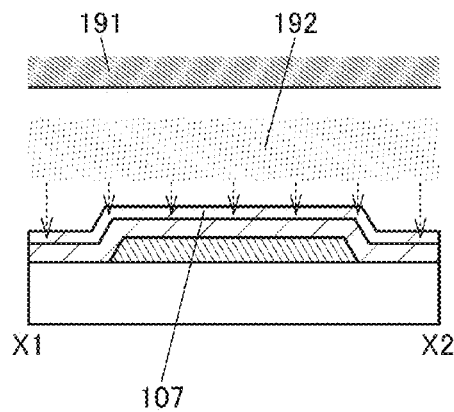
Figure 14D:
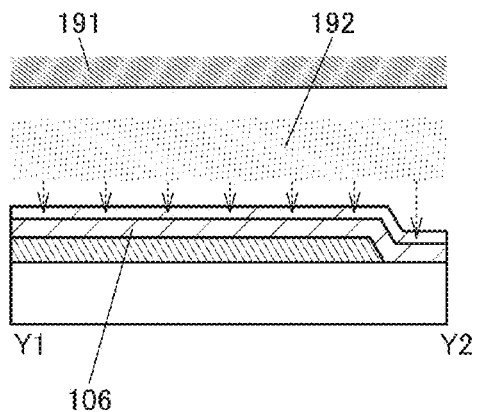
Figure 14E:
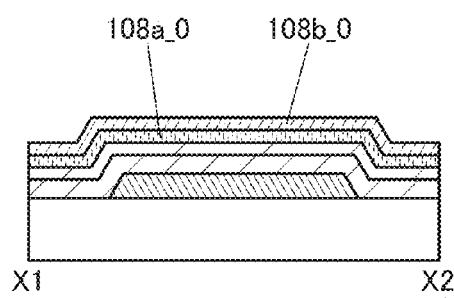
Figure 14F:
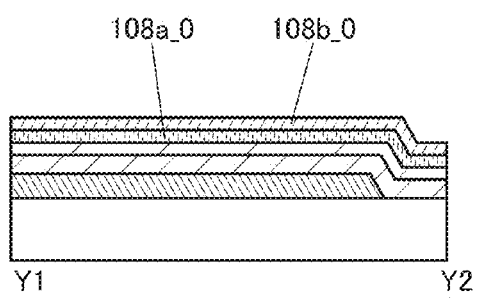

FIGS. 14C and 14D are schematic cross-sectional views illustrating an inner portion of a deposition apparatus when the oxide semiconductor film 108a_0 is formed over the insulating film 107. In FIGS. 14C and 14D, a sputtering apparatus is used as the deposition apparatus, and a target 191 placed inside the sputtering apparatus and plasma 192 formed under the target 191 are schematically illustrated.

When the oxide semiconductor film 108a_0 is formed, plasma discharge is performed in an atmosphere containing a first oxygen gas. At that time, oxygen is added to the insulating film 107 over which the oxide semiconductor film 108a_0 is formed. When the oxide semiconductor film 108a_0 is formed, an inert gas (e.g., a helium gas, an argon gas, or a xenon gas) and the first oxygen gas may be mixed.

The first oxygen gas is at least mixed when the oxide semiconductor film 108a_0 is formed. The proportion of the first oxygen gas in a deposition gas for forming the oxide semiconductor film 108a_0 is higher than 0% and lower than or equal to 100%, preferably higher than or equal to 10% and lower than or equal to 100%, more preferably higher than or equal to 30% and lower than or equal to 100%.

In FIGS. 14C and 14D, oxygen or excess oxygen added to the insulating film 107 is schematically illustrated by arrows of broken lines.

The oxide semiconductor films 108a_0 and 108b_0 may be formed at the same substrate temperature or different substrate temperatures. Note that the oxide semiconductor films 108a_0 and 108b_0 are preferably formed at the same substrate temperature, in which case the manufacturing cost can reduced.

The oxide semiconductor film 108 is formed at a substrate temperature of higher than or equal to room temperature and lower than 340° C., preferably higher than or equal to room temperature and lower than or equal to 300° C., more preferably higher than or equal to 100° C. and lower than or equal to 250° C., more preferably higher than or equal to 100° C. and lower than or equal to 200° C., for example. The oxide semiconductor film 108 is formed while being heated, so that the crystallinity of the oxide semiconductor film 108 can be increased. On the other hand, in the case where a large-sized glass substrate (e.g., the 6th generation to the 10th generation) is used as the substrate 102 and the oxide semiconductor film 108 is formed at a substrate temperature of higher than or equal to 150° C. and lower than 340° C., the substrate 102 might be changed in shape (distorted or warped). Therefore, in the case where a large-sized glass substrate is used, the change in the shape of the glass substrate can be suppressed by forming the oxide semiconductor film 108 at a substrate temperature of higher than or equal to 100° C. and lower than 150° C.

In addition, increasing the purity of a sputtering gas is necessary. For example, when a gas, i.e., an oxygen gas or an argon gas, which is highly purified to have a dew point of lower than or equal to −40° C., preferably lower than or equal to −80° C., more preferably lower than or equal to −100° C., more preferably lower than or equal to −120° C., is used as a sputtering gas, entry of moisture or the like into the oxide semiconductor film can be minimized.

In the case where the oxide semiconductor film is formed by a sputtering method, a chamber in a sputtering apparatus is preferably evacuated to a high vacuum state (to a degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film, as much as possible. Alternatively, a turbo molecular pump and a cold trap are preferably combined so as to prevent a backflow of a gas, especially a gas containing carbon or hydrogen, from an exhaust system to the inside of the chamber.

After the oxide semiconductor film 108a_0 is formed, the oxide semiconductor film 108b_0 is successively formed over the oxide semiconductor film 108a_0. Note that when the oxide semiconductor film 108b_0 is formed, plasma discharge may be performed in an atmosphere containing a second oxygen gas.

Note that the proportion of the first oxygen gas for forming the oxide semiconductor film 108a_0 may be the same as or different from the proportion of the second oxygen gas for forming the oxide semiconductor film 108b_0. For example, the proportion of the second oxygen gas in a deposition gas for forming the oxide semiconductor film 108b_0 is higher than 0% and lower than or equal to 100%, preferably higher than or equal to 10% and lower than or equal to 100%, more preferably higher than or equal to 30% and lower than or equal to 100%.

In this embodiment, the oxide semiconductor film 108a_0 is formed by a sputtering method using an In—Ga—Zn metal oxide target (In:Ga:Zn=1:3:2 [atomic ratio]) and then the oxide semiconductor film 108b_0 is successively formed in a vacuum by a sputtering method using an In—Ga—Zn metal oxide target (In:Ga:Zn=3:1:2 [atomic ratio]). The substrate temperature when the oxide semiconductor film 108a_0 is formed is set to 170° C., and the substrate temperature when the oxide semiconductor film 108b_0 is formed is set to 170° C. As the deposition gas for forming the oxide semiconductor film 108a_0, an oxygen gas at a flow rate of 60 sccm and an argon gas at a flow rate of 140 sccm are used. As the deposition gas for forming the oxide semiconductor film 108b_0, an oxygen gas at a flow rate of 100 sccm and an argon gas at a flow rate of 100 sccm are used.

Figure 15A:
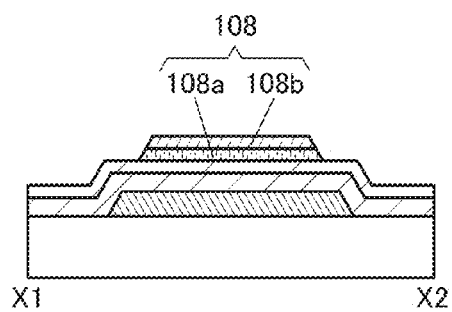
FIGS. 15A to 15F are cross-sectional views illustrating an example of a manufacturing process of a semiconductor device.
Figure 15B:
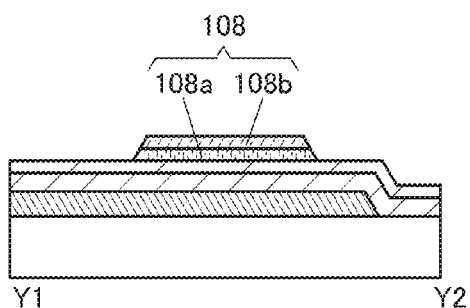

Next, the oxide semiconductor films 108a_0 and 108b_0 are processed into desired shapes, so that the island-shaped oxide semiconductor films 108a and 108b are formed (see FIGS. 15A and 15B).

<<Step of Forming Source Electrode and Drain Electrode>>

Figure 15C:
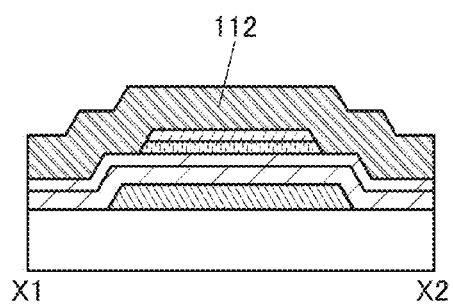
Figure 15D:
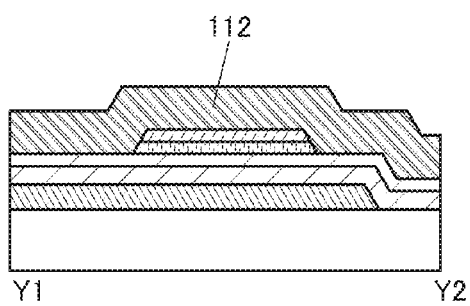

Next, a conductive film 112 to be a source electrode and a drain electrode is formed over the insulating film 107 and the oxide semiconductor film 108 by a sputtering method (see FIGS. 15C and 15D).

In this embodiment, as the conductive film 112, a stacked film in which a 50-nm-thick tungsten film and a 400-nm-thick aluminum film are sequentially stacked is formed by a sputtering method. Although the conductive film 112 has a two-layer structure in this embodiment, one embodiment of the present invention is not limited thereto. For example, the conductive film 112 may have a three-layer structure in which a 400-nm-thick aluminum film is stacked over a 50-nm-thick tungsten film, and a 100-nm-thick titanium film is stacked over the 400-nm-thick aluminum film.

Figure 15E:
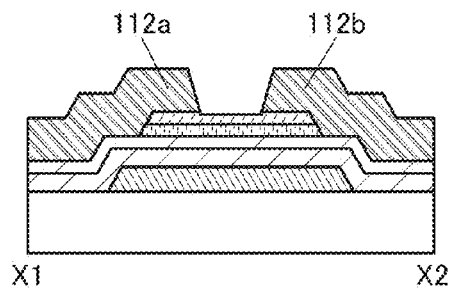
Figure 15F:
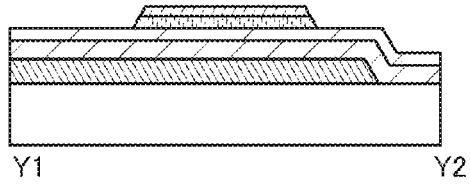

Next, the conductive film 112 is processed into a desired shape, so that the separate conductive films 112a and 112b are formed (see FIGS. 15E and 15F).

In this embodiment, the conductive film 112 is processed with a dry etching apparatus. Note that the method for processing the conductive film 112 is not limited thereto, and a wet etching apparatus may be used, for example. Note that a finer pattern can be formed when a dry etching apparatus is used for processing the conductive film 112 than when a wet etching apparatus is used. However, when a wet etching apparatus is used for processing the conductive film 112, manufacturing cost can be more reduced than when a dry etching apparatus is used.

After the conductive films 112a and 112b are formed, a surface (on the back channel side) of the oxide semiconductor film 108 (specifically, the oxide semiconductor film 108b) may be cleaned. The cleaning may be performed, for example, using a chemical solution such as phosphoric acid. The cleaning using a chemical solution such as phosphoric acid can remove impurities (e.g., elements included in the conductive films 112a and 112b) attached to the surface of the oxide semiconductor film 108b. Note that the cleaning is not necessarily performed; in some cases, the cleaning is not performed.

In the step of forming the conductive films 112a and 112b and/or the cleaning step, the thickness of a region of the oxide semiconductor film 108 which is not covered with the conductive films 112a and 112b might be reduced.

Figure 16A:
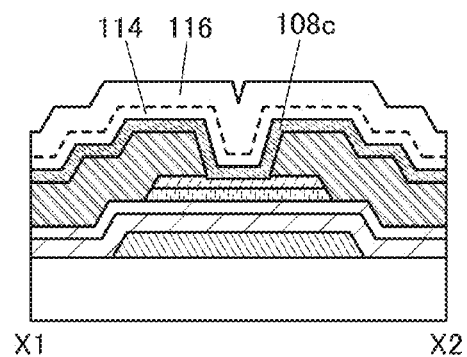
FIGS. 16A to 16F are cross-sectional views illustrating an example of a manufacturing process of a semiconductor device.
Figure 16B:
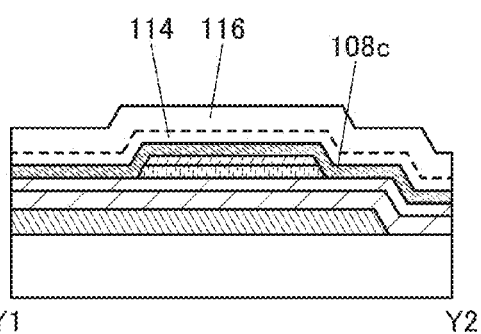
Figure 16C:
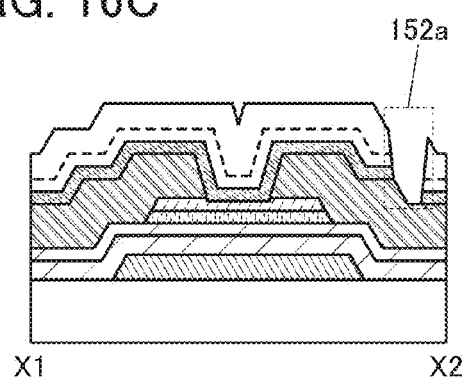
Figure 16D:
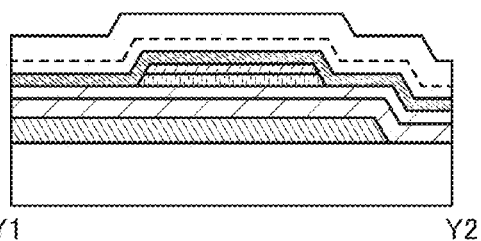

Next, the oxide semiconductor film 108c and the insulating films 114 and 116 are formed over the oxide semiconductor film 108 and the conductive films 112a and 112b (see FIGS. 16A and 16B).

<<Step 2 of Forming Oxide Semiconductor Film>>

When the oxide semiconductor film 108c is formed, plasma discharge may be performed in an atmosphere containing a third oxygen gas.

Note that the proportion of the third oxygen gas for forming the oxide semiconductor film 108c may be the same as or different from the proportion of the first oxygen gas for forming the oxide semiconductor film 108a_0 and the proportion of the second oxygen gas for forming the oxide semiconductor film 108b_0. For example, the proportion of the third oxygen gas in a deposition gas for forming the oxide semiconductor film 108c is higher than 0% and lower than or equal to 100%, preferably higher than or equal to 10% and lower than or equal to 100%, more preferably higher than or equal to 30% and lower than or equal to 100%.

Note that in the case where the third oxygen gas and an argon gas are used when the oxide semiconductor film 108c is formed, the flow rate of the argon gas is preferably higher than the flow rate of the third oxygen gas. When the flow rate of the argon gas is set higher, a dense film can be formed as the oxide semiconductor film 108c. Alternatively, to form a dense film as the oxide semiconductor film 108c, the substrate temperature when the oxide semiconductor film 108c is formed may be set high. The substrate temperature when the oxide semiconductor film 108c is formed is typically lower than or equal to 250° C., preferably higher than or equal to 150° C. and lower than or equal to 190° C. The dense film formed as the oxide semiconductor film 108c can suppress entry of impurities contained in the insulating film 114 into the oxide semiconductor film 108b.

In this embodiment, the oxide semiconductor film 108c is formed by a sputtering method using an In—Ga—Zn metal oxide target (In:Ga:Zn=1:1:1.2 [atomic ratio]). The substrate temperature when the oxide semiconductor film 108c is formed is set to 170° C. As the deposition gas for forming the oxide semiconductor film 108c, an oxygen gas at a flow rate of 100 sccm and an argon gas at a flow rate of 100 sccm are used.

<<Step of Forming Second Gate Insulating Film>>

Next, the insulating films 114 and 116 are formed over the oxide semiconductor film 108c.

Note that after the insulating film 114 is formed, the insulating film 116 is preferably formed successively without exposure to the air. After the insulating film 114 is formed, the insulating film 116 is formed successively without exposure to the air while at least one of the flow rate of a source gas, the pressure, high-frequency power, and the substrate temperature is adjusted, whereby the concentration of impurities attributed to the atmospheric component at the interface between the insulating films 114 and 116 can be reduced, and oxygen in the insulating films 114 and 116 can be transferred to the oxide semiconductor film 108; accordingly, the amount of oxygen vacancies in the oxide semiconductor film 108 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small amount of defects can be formed as the insulating film 114 by a PECVD method under the conditions where the flow rate of the oxidizing gas is more than 20 times and less than 100 times, preferably more than or equal to 40 times and less than or equal to 80 times, that of the deposition gas, and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e. the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, more preferably lower than or equal to $1.5 \times 10^{17}$ spins/cm$^3$ by ESR measurement. As a result, the reliability of the transistor 100 can be improved.

Heat treatment (hereinafter referred to as first heat treatment) is preferably performed after the insulating films 114 and 116 are formed. The first heat treatment can reduce nitrogen oxide included in the insulating films 114 and 116. By the first heat treatment, part of oxygen contained in the insulating films 114 and 116 can be transferred to the oxide semiconductor film 108, so that the amount of oxygen vacancies included in the oxide semiconductor film 108 can be reduced.

The temperature of the first heat treatment is typically lower than 400° C., preferably lower than 375° C., more preferably higher than or equal to 150° C. and lower than or equal to 350° C. The first heat treatment may be performed in an atmosphere of nitrogen, oxygen, ultra-dry air (air with a water content of less than or equal to 20 ppm, preferably less than or equal to 1 ppm, more preferably less than or equal to 10 ppb), or a rare gas (argon, helium, or the like). Note that an electric furnace, rapid thermal anneal (RTA), or the like can be used for the heat treatment, in which it is preferable that hydrogen, water, and the like be not contained in the nitrogen, oxygen, ultra-dry air, or rare gas.

Next, a mask is formed over the insulating film 116 through a lithography process, and the opening 152a is formed in desired regions in the oxide semiconductor film 108c and the insulating films 114 and 116. Note that the opening 152a is formed so as to reach the conductive film 112b (see FIGS. 16C and 16D).

<<Step of Forming Second Gate Electrode>>

Next, a conductive film 120 is formed over the insulating film 116 so as to cover the opening 152a (see FIGS. 16E and 16F and FIGS. 17A and 17B).

Figure 16E:
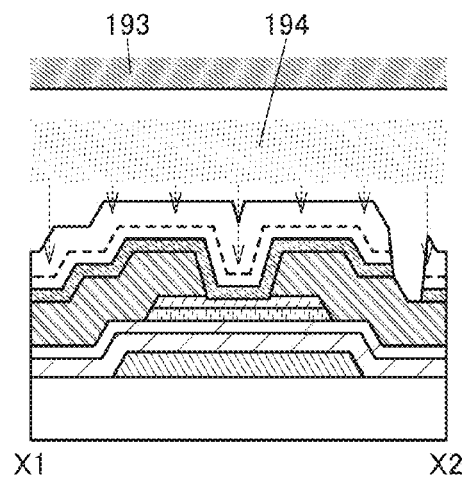
Figure 16F:
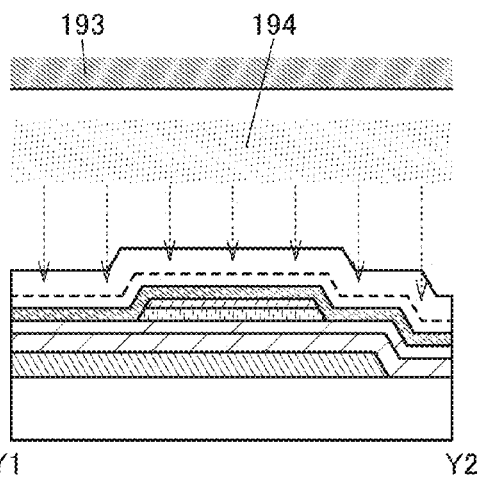

FIGS. 16E and 16F are schematic cross-sectional views illustrating the inner portion of the deposition apparatus when the conductive film 120 is formed over the insulating film 116. In FIGS. 16E and 16F, a sputtering apparatus is used as the deposition apparatus, and a target 193 placed inside the sputtering apparatus and plasma 194 formed under the target 193 are schematically illustrated.

When the conductive film 120 is formed, plasma discharge is performed in an atmosphere containing a fourth oxygen gas. At that time, oxygen is added to the insulating film 116 over which the conductive film 120 is formed. When the conductive film 120 is formed, an inert gas (e.g., a helium gas, an argon gas, or a xenon gas) and the fourth oxygen gas may be mixed. For example, it is preferable to use the argon gas and the fourth oxygen gas with a flow rate higher than that of the argon gas. When the flow rate of the fourth oxygen gas is set higher, oxygen can be favorably added to the insulating film 116. As an example of the conditions for forming the conductive film 120, the proportion of the fourth oxygen gas in a whole deposition gas is higher than or equal to 50% and lower than or equal to 100%, preferably higher than or equal to 80% and lower than or equal to 100%.

In FIGS. 16E and 16F, oxygen or excess oxygen added to the insulating film 116 is schematically illustrated by arrows of broken lines.

The conductive film 120 is formed at a substrate temperature of higher than or equal to room temperature and lower than 340° C., preferably higher than or equal to room temperature and lower than or equal to 300° C., more preferably higher than or equal to 100° C. and lower than or equal to 250° C., more preferably higher than or equal to 100° C. and lower than or equal to 200° C. The conductive film 120 is formed while being heated, so that the crystallinity of the conductive film 120 can be increased. On the other hand, in the case where a large-sized glass substrate (e.g., the 6th generation to the 10th generation) is used as the substrate 102 and the conductive film 120 is formed at a substrate temperature of higher than or equal to 150° C. and lower than 340° C., the substrate 102 might be changed in shape (distorted or warped). Therefore, in the case where a large-sized glass substrate is used, the change in the shape of the glass substrate can be suppressed by forming the conductive film 120 at a substrate temperature of higher than or equal to 100° C. and lower than 150° C.

In this embodiment, the conductive film 120 is formed by a sputtering method using an In—Ga—Zn metal oxide target (In:Ga:Zn=1:3:6 [atomic ratio]). The substrate temperature when the conductive film 120 is formed is set to 170° C. As the deposition gas for forming the conductive film 120, an oxygen gas at a flow rate of 100 sccm is used.

As the conductive film 120, the above-described oxide semiconductor film (with an atomic ratio of In:Ga:Zn=1:1:1, In:Ga:Zn=1:3:2, In:Ga:Zn=1:3:4, In:Ga:Zn=1:3:6, In:Ga:Zn=3:1:2, In:Ga:Zn=4:2:3, or In:Ga:Zn=5:1:6 for example) may be used.

Figure 17A:
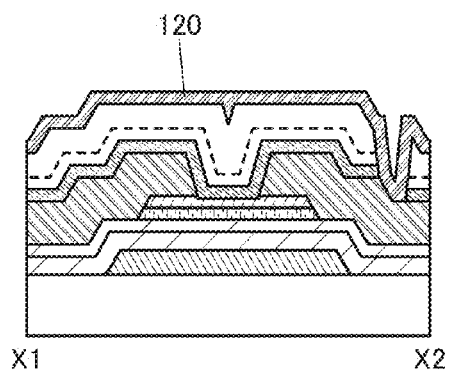
FIGS. 17A to 17F are cross-sectional views illustrating an example of a manufacturing process of a semiconductor device.
Figure 17B:
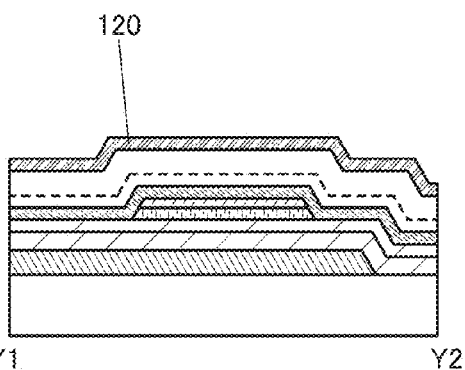
Figure 17C:
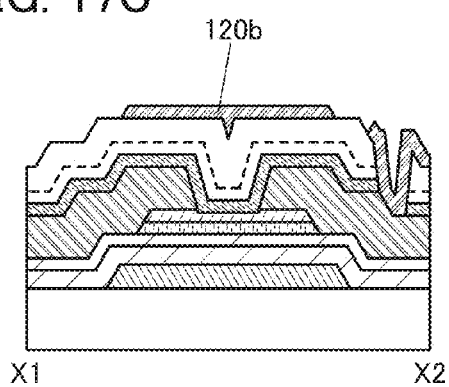
Figure 17D:
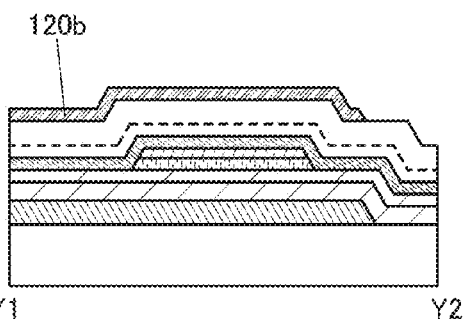

Next, the conductive film 120 is processed into a desired shape, so that the island-shaped conductive films 120a and 120b are formed (see FIGS. 17C and 17D).

<Step of Forming Protective Insulating Film>

Figure 17E:
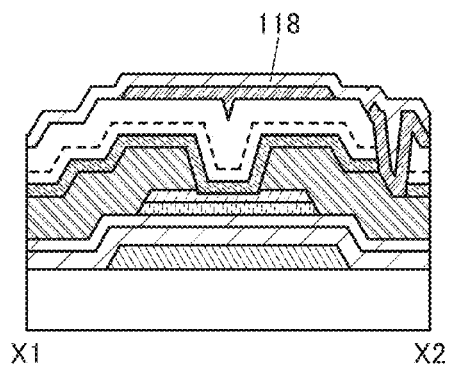
Figure 17F:
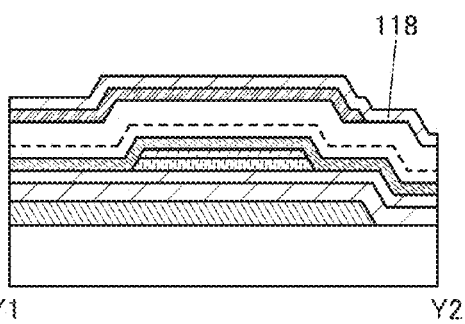

Next, the insulating film 118 is formed over the insulating film 116 and the conductive films 120a and 120b (see FIGS. 17E and 17F).

The insulating film 118 contains one of or both hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., more preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be transferred to the oxide semiconductor film 108.

After the insulating film 118 is formed, heat treatment similar to the first heat treatment (hereinafter referred to as second heat treatment) may be performed. Through such heat treatment at a temperature of lower than 400° C., preferably lower than 375° C., more preferably higher than or equal to 180° C. and lower than or equal to 350° C. after the addition of oxygen to the insulating film 116 when the conductive film 120 is formed, oxygen or excess oxygen in the insulating film 116 can be transferred to the oxide semiconductor film 108 (particularly, the oxide semiconductor film 108b) and compensate oxygen vacancies in the oxide semiconductor film 108.

Figure 18A:
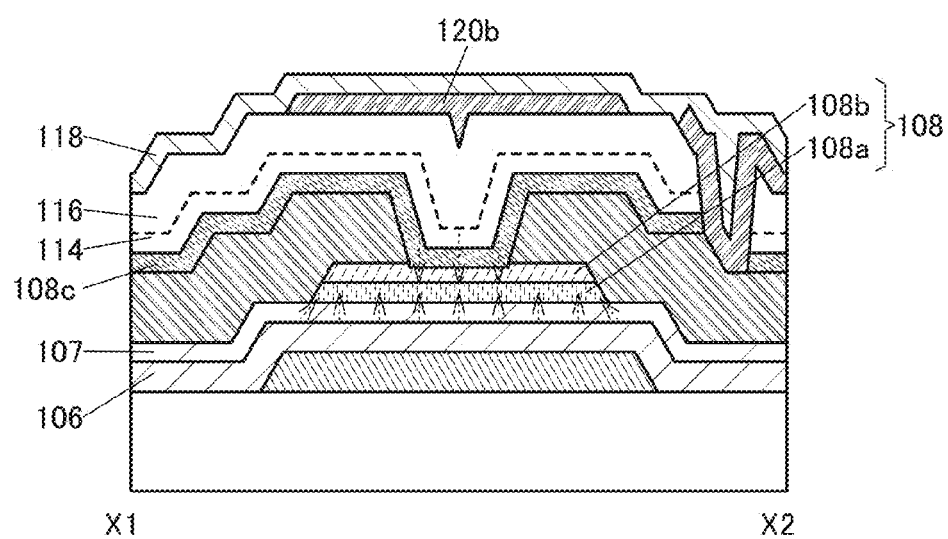
FIGS. 18A and 18B are cross-sectional views illustrating an example of a manufacturing process of a semiconductor device.
Figure 18B:
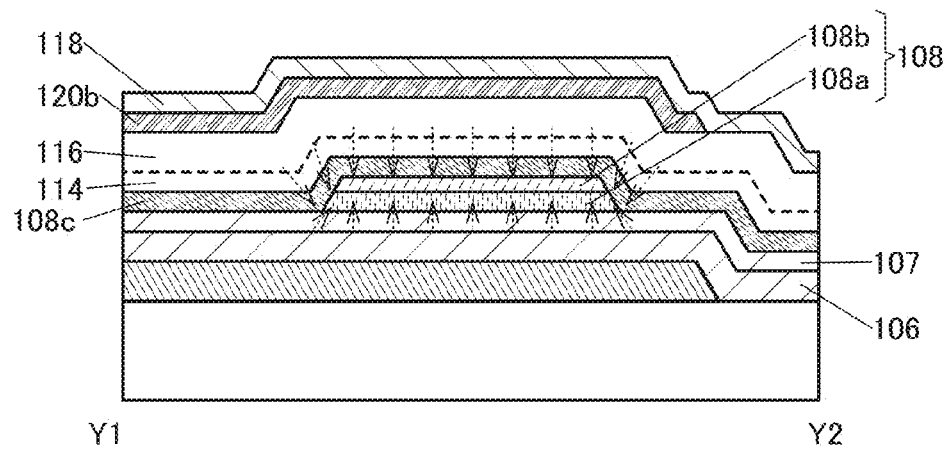

Oxygen transferred to the oxide semiconductor film 108 is described with reference to FIGS. 18A and 18B. FIGS. 18A and 18B are model diagrams illustrating oxygen transferred to the oxide semiconductor film 108 due to the substrate temperature at the time of forming the insulating film 118 (typically, lower than 375° C.) or the second heat treatment after the formation of the insulating film 118 (typically, lower than 375° C.). In FIGS. 18A and 18B, oxygen (oxygen radicals, oxygen atoms, or oxygen molecules) in the oxide semiconductor film 108 is illustrated by arrows of broken lines.

In the oxide semiconductor film 108 in FIGS. 18A and 18B, oxygen vacancies are compensated with oxygen transferred from films that are very close to the oxide semiconductor film 108 (here, the insulating films 107 and 114). Specifically, in the semiconductor device of one embodiment of the present invention, the insulating film 107 includes an excess oxygen region because an oxygen gas is used at the time of forming the oxide semiconductor film 108b by sputtering and oxygen is added to the insulating film 107. Furthermore, the insulating film 116 includes an excess oxygen region because an oxygen gas is used at the time of forming the conductive film 120 by sputtering and oxygen is added to the insulating film 116. In the oxide semiconductor film 108 between the insulating films including the excess oxygen regions, oxygen vacancies can be favorably compensated.

Furthermore, the insulating film 106 is provided below the insulating film 107, and the insulating film 118 is provided over the insulating films 114 and 116. When the insulating films 106 and 118 are each formed using a material having low oxygen permeability, e.g., silicon nitride, oxygen contained in the insulating films 107, 114, and 116 can be confined on the oxide semiconductor film 108 side; thus, oxygen can be favorably transferred to the oxide semiconductor film 108.

The insulating film 118 contains one of or both hydrogen and nitrogen. Thus, one of or both hydrogen and nitrogen is/are added to the conductive films 120a and 120b in contact with the formed insulating film 118, so that the conductive films 120a and 120b have a high carrier density and can function as oxide conductor films.

In the case where a silicon nitride film is formed by a PECVD method as the insulating film 118, a deposition gas containing silicon, nitrogen, and ammonia are preferably used as a source gas. As the source gas, ammonia whose amount is smaller than that of nitrogen is used, whereby ammonia is dissociated in the plasma and activated species are generated. The activated species cleave a bond between silicon and hydrogen which are contained in the deposition gas containing silicon and a triple bond between nitrogen molecules. As a result, a dense silicon nitride film having few defects can be formed, in which bonds between silicon and nitrogen are promoted and bonds between silicon and hydrogen are few. On the other hand, when the amount of ammonia with respect to nitrogen is large, decomposition of the deposition gas containing silicon and decomposition of nitrogen are not promoted, so that a sparse silicon nitride film in which bonds between silicon and hydrogen remain and defects are increased is formed. Therefore, the flow rate ratio of nitrogen to ammonia in the source gas is set to be greater than or equal to 5:1 and less than or equal to 50:1, preferably greater than or equal to 10:1 and less than or equal to 50:1.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and a high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Through the above process, the transistor 100 illustrated in FIGS. 1A to 1C can be manufactured.

In the entire manufacturing process of the transistor 100, the substrate temperature is preferably lower than 400° C., more preferably lower than 375° C., more preferably higher than or equal to 180° C. and lower than or equal to 350° C. because the change in the shape of the substrate (distortion or warp) can be reduced even when a large-sized substrate is used. Typical examples of a step in which the substrate temperature is increased in the manufacturing process of the transistor 100 are as follows: the substrate temperature at the time of forming the insulating films 106 and 107 (lower than 400° C., preferably higher than or equal to 250° C. and lower than or equal to 350° C.), the substrate temperature at the time forming the oxide semiconductor film 108 (higher than or equal to room temperature and lower than 340° C., preferably higher than or equal to 100° C. and lower than or equal to 200° C., more preferably higher than or equal to 100° C. and lower than 150° C.), the substrate temperature at the time of forming the insulating films 116 and 118 (lower than 400° C., preferably lower than 375° C., more preferably higher than or equal to 180° C. and lower than or equal to 350° C.), and the first heat treatment or the second heat treatment after the addition of oxygen (lower than 400° C., preferably lower than 375° C., more preferably higher than or equal to 180° C. and lower than or equal to 350° C.).

The structure and method described in this embodiment can be implemented by being combined as appropriate with any of the structures and methods described in the other embodiments.

Embodiment 2

In this embodiment, the structure of an oxide semiconductor and the like will be described with reference to FIGS. 19A to 19D to FIGS. 28A to 28G.

<2-1. Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time contains a void and has an unstable structure. For this reason, an a-like OS has physical properties similar to those of an amorphous oxide semiconductor.

For the oxide semiconductor film of one embodiment of the present invention, a CAAC-OS is particularly preferred to the other oxide semiconductors described above. When a CAAC-OS is used for the oxide semiconductor film, the crystallinity of the oxide semiconductor film can be increased, and impurities, oxygen vacancies, or the density of defect states in the oxide semiconductor film can be reduced.

<2-2. Caac-Os>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, a plurality of pellets can be observed. However, in the high-resolution TEM image, a boundary between pellets, that is, a grain boundary is not clearly observed. Thus, in a CAAC-OS, a reduction in electron mobility due to a grain boundary is less likely to occur.

Figure 19A:
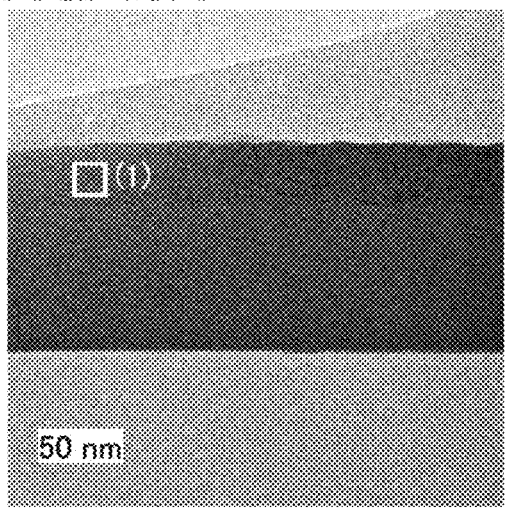
FIGS. 19A to 19D are Cs-corrected high-resolution TEM images of a cross section of a CAAC-OS and a cross-sectional schematic view of a CAAC-OS.

A CAAC-OS observed with a TEM is described below. FIG. 19A is a high-resolution TEM image of a cross section of a CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 19B:
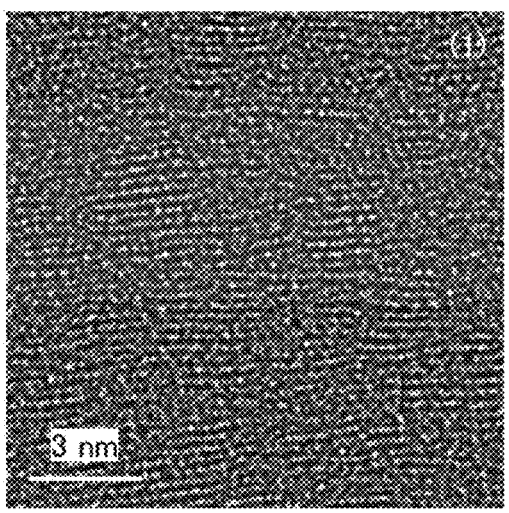

FIG. 19B is an enlarged Cs-corrected high-resolution TEM image of a region (1) in FIG. 19A. FIG. 19B shows that metal atoms are arranged in a layered manner in a pellet. Each metal atom layer has a configuration reflecting unevenness of a surface over which a CAAC-OS is formed (hereinafter, the surface is referred to as a formation surface) or a top surface of a CAAC-OS, and is arranged parallel to the formation surface or the top surface of a CAAC-OS.

Figure 19C:
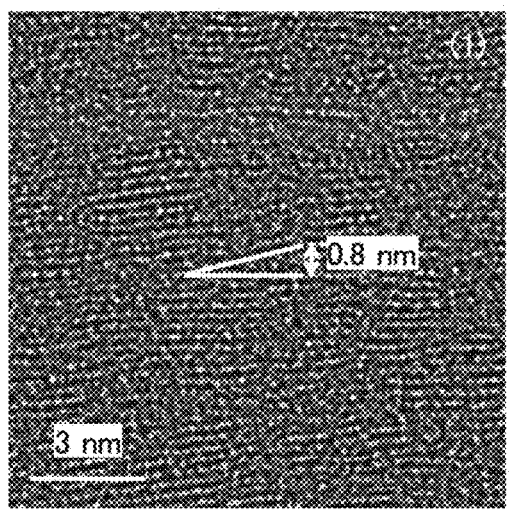

As shown in FIG. 19B, a CAAC-OS has a characteristic atomic arrangement. The characteristic atomic arrangement is denoted by an auxiliary line in FIG. 19C. FIGS. 19B and 19C prove that the size of a pellet is approximately 1 nm to 3 nm, and the size of a space caused by tilt of the pellets is approximately 0.8 nm. Therefore, the pellet can also be referred to as a nanocrystal (nc). Furthermore, a CAAC-OS can also be referred to as an oxide semiconductor including c-axis aligned nanocrystals (CANC).

Figure 19D:
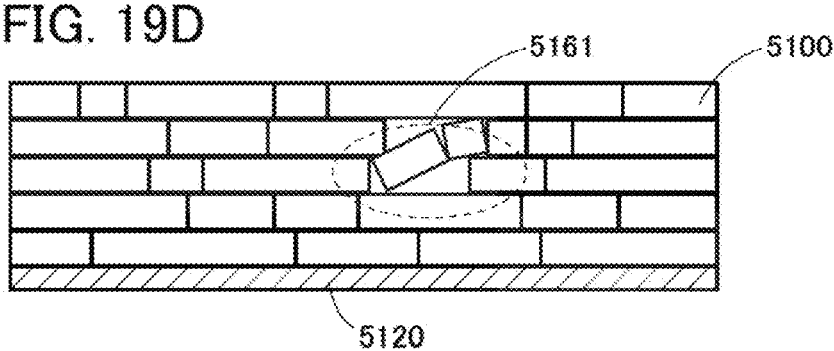

Here, according to the Cs-corrected high-resolution TEM image, the schematic arrangement of pellets 5100 of a CAAC-OS over a substrate 5120 is illustrated by such a structure in which bricks or blocks are stacked (see FIG. 19D). The part in which the pellets are tilted as observed in FIG. 19C corresponds to a region 5161 shown in FIG. 19D.

FIG. 20A shows a Cs-corrected high-resolution TEM image of a plane of a CAAC-OS observed from a direction substantially perpendicular to the sample surface. FIGS. 20B, 20C, and 20D are enlarged Cs-corrected high-resolution TEM images of regions (1), (2), and (3) in FIG. 20A, respectively. FIGS. 20B, 20C, and 20D indicate that metal atoms are arranged in a triangular, quadrangular, or hexagonal configuration in a pellet. However, there is no regularity of arrangement of metal atoms between different pellets.

Figure 21A:
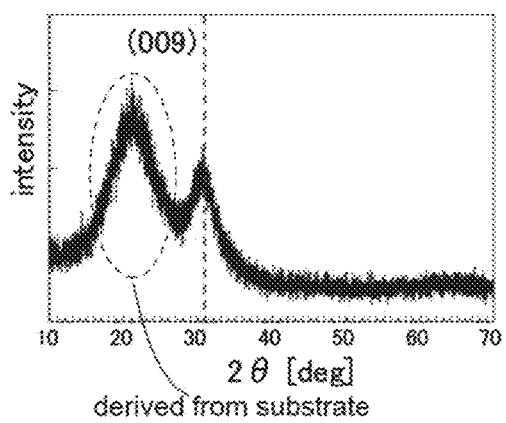
FIGS. 21A to 21C show structural analyses of a CAAC-OS and a single crystal oxide semiconductor by XRD.

Next, a CAAC-OS analyzed by XRD is described. For example, when the structure of a CAAC-OS including an $InGaZnO_4$ crystal is analyzed by an out-of-plane method, a peak appears at a diffraction angle ($2\theta$) of around 31° as shown in FIG. 21A. This peak is derived from the (009)

plane of the InGaZnO$_4$ crystal, which indicates that crystals in a CAAC-OS have c-axis alignment, and that the c-axes are aligned in a direction substantially perpendicular to the formation surface or the top surface of a CAAC-OS.

Note that in structural analysis of a CAAC-OS by an out-of-plane method, another peak may appear when 2θ is around 36°, in addition to the peak at 2θ of around 31°. The peak of 2f at around 36° indicates that a crystal having no c-axis alignment is included in part of a CAAC-OS. It is preferable that in a CAAC-OS analyzed by an out-of-plane method, a peak appear when 2θ is around 31° and that a peak not appear when 2θ is around 36°.

Figure 21B:
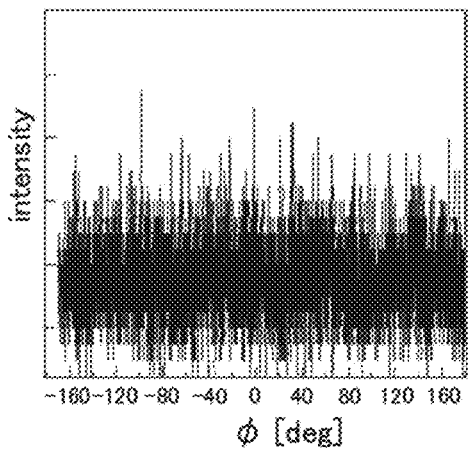
Figure 21C:
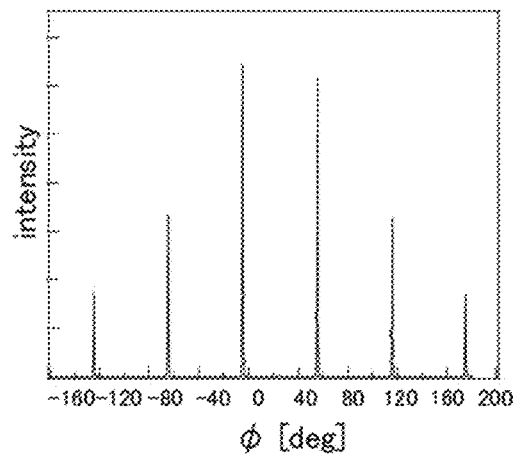

On the other hand, in structural analysis of a CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of a CAAC-OS, when analysis (φ scan) is performed with 2θ fixed at around 56° and with the sample rotated using a normal vector of the sample surface as an axis (φ axis), as shown in FIG. 21B, a peak is not clearly observed. In contrast, in the case of a single crystal oxide semiconductor of InGaZnO$_4$, when φ scan is performed with 2θ fixed at around 56°, as shown in FIG. 21C, six peaks which are derived from crystal planes equivalent to the (110) plane are observed. Accordingly, the structural analysis using XRD shows that the directions of a-axes and b-axes are irregularly oriented in a CAAC-OS.

Figure 22A:
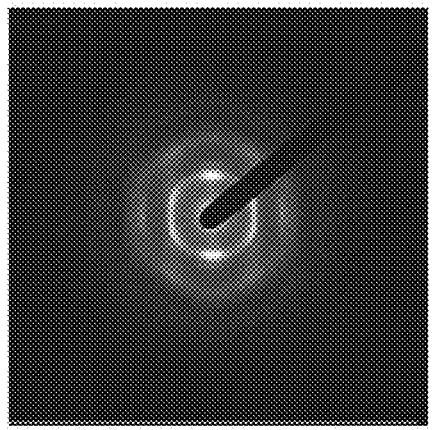
FIGS. 22A and 22B show electron diffraction patterns of a CAAC-OS.
Figure 22B:
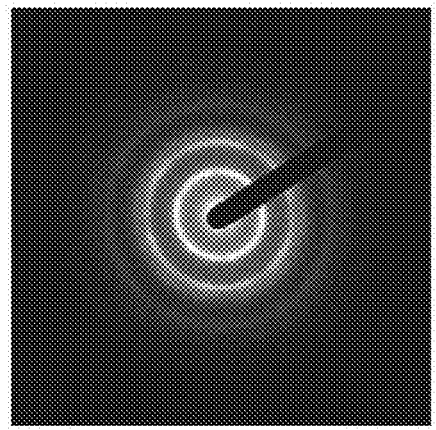

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 22A can be obtained. In this diffraction pattern, spots derived from the (009) plane of an InGaZnO$_4$ crystal are included. Thus, the electron diffraction also indicates that pellets included in a CAAC-OS have c-axis alignment and that the c-axes are aligned in a direction substantially perpendicular to the formation surface or the top surface of a CAAC-OS. Meanwhile, FIG. 22B shows a diffraction pattern obtained in such a manner that an electron beam with a probe diameter of 300 nm is incident on the same sample in a direction perpendicular to the sample surface. As shown in FIG. 22B, a ring-like diffraction pattern is observed. Thus, the electron diffraction also indicates that the a-axes and b-axes of the pellets included in a CAAC-OS do not have regular alignment. The first ring in FIG. 22B is considered to be derived from the (010) plane, the (100) plane, and the like of the InGaZnO$_4$ crystal. The second ring in FIG. 22B is considered to be derived from the (110) plane and the like.

As described above, a CAAC-OS is an oxide semiconductor with high crystallinity. Entry of impurities, formation of defects, or the like might decrease the crystallinity of an oxide semiconductor. This means that a CAAC-OS has negligible amounts of impurities and defects (e.g., oxygen vacancies).

Note that the impurity means an element other than the main components of an oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius) and thus disturbs the atomic arrangement of the oxide semiconductor and decreases the crystallinity.

The characteristics of an oxide semiconductor having impurities or defects might be changed by light, heat, or the like. Impurities contained in an oxide semiconductor might serve as carrier traps or carrier generation sources, for example. Furthermore, oxygen vacancies in an oxide semiconductor serve as carrier traps or serve as carrier generation sources when hydrogen is captured therein.

A CAAC-OS having small amounts of impurities and oxygen vacancies is an oxide semiconductor with a low carrier density (specifically, lower than $8\times10^{11}$/cm$^3$, preferably lower than $1\times10^{11}$/cm$^3$, more preferably lower than $1\times10^{10}$/cm$^3$, and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<2-3. nc-OS>

Next, an nc-OS is described.

An nc-OS has a region in which a crystal part is observed and a region in which a crystal part is not clearly observed in a high-resolution TEM image. In most cases, the size of a crystal part included in an nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of an nc-OS, for example, a grain boundary is not always found clearly. Note that there is a possibility that the origin of a nanocrystal is the same as that of a pellet in a CAAC-OS. Therefore, a crystal part of an nc-OS may also be referred to as a pellet in the following description.

In an nc-OS, a microscopic region (for example, a region with a size of greater than or equal to 1 nm and less than or equal to 10 nm, in particular, a region with a size of greater than or equal to 1 nm and less than or equal to 3 nm) has a periodic atomic arrangement. There is no regularity of crystal orientation between different pellets in an nc-OS. Thus, the orientation of the whole film is not observed. Accordingly, an nc-OS cannot be distinguished from an a-like OS or an amorphous oxide semiconductor, depending on an analysis method. For example, when an nc-OS is analyzed by an out-of-plane method using an X-ray beam having a diameter larger than the size of a pellet, a peak which shows a crystal plane cannot be detected. Furthermore, a diffraction pattern like a halo pattern is observed when an nc-OS is subjected to electron diffraction using an electron beam with a probe diameter (e.g., greater than or equal to 50 nm) that is larger than the size of a pellet. Meanwhile, spots appear in a nanobeam electron diffraction pattern of an nc-OS when an electron beam having a probe diameter close to or smaller than the size of a pellet is applied. Moreover, in a nanobeam electron diffraction pattern of an nc-OS, regions with high luminance in a circular (ring) pattern are shown in some cases. Also in a nanobeam electron diffraction pattern of an nc-OS, a plurality of spots are shown in a ring-like region in some cases.

Since there is no regularity of crystal orientation between the pellets (nanocrystals) as mentioned above, an nc-OS can also be referred to as an oxide semiconductor including random aligned nanocrystals (RANC) or an oxide semiconductor including non-aligned nanocrystals (NANC).

An nc-OS is an oxide semiconductor that has high regularity as compared with an amorphous oxide semiconductor. Therefore, an nc-OS is likely to have a lower density of defect states than an a-like OS and an amorphous oxide semiconductor. Note that there is no regularity of crystal orientation between different pellets in an nc-OS. Therefore, an nc-OS has a higher density of defect states than a CAAC-OS.

<2-4. a-Like OS>

An a-like OS has a structure between those of an nc-OS and an amorphous oxide semiconductor.

In a high-resolution TEM image of an a-like OS, a void may be observed. Furthermore, in the high-resolution TEM image, there are a region where a crystal part is clearly observed and a region where a crystal part is not observed.

An a-like OS has an unstable structure because it contains a void. To verify that an a-like OS has an unstable structure as compared with a CAAC-OS and an nc-OS, a change in structure induced by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 23:
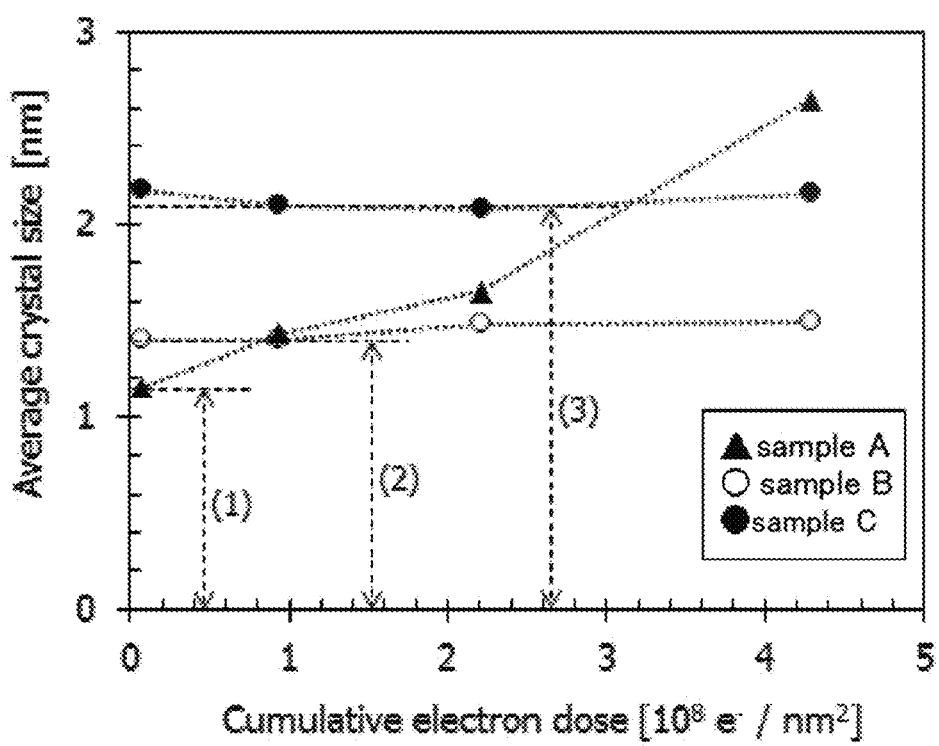
FIG. 23 shows changes in crystal parts of In—Ga—Zn oxides induced by electron irradiation.

FIG. 23 shows a change in the average size of crystal parts (at 22 points to 45 points) in each sample. Note that the crystal part size corresponds to the length of a lattice fringe. FIG. 23 indicates that the crystal part size in an a-like OS increases with an increase in the cumulative electron dose. Specifically, as shown by (1) in FIG. 23, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in an nc-OS and a CAAC-OS shows little change from the start of electron irradiation to a cumulative electron dose of $4.2 \times 10^8$ e$^-$/nm$^2$. Specifically, as shown by (2) and (3) in FIG. 23, the average crystal sizes in an nc-OS and a CAAC-OS are approximately 1.4 nm and approximately 2.1 nm, respectively, regardless of the cumulative electron dose.

In this manner, growth of the crystal part in an a-like OS is induced by electron irradiation. In contrast, in an nc-OS and a CAAC-OS, growth of the crystal part is hardly induced by electron irradiation. Therefore, an a-like OS has an unstable structure as compared with an nc-OS and a CAAC-OS.

An a-like OS has a lower density than an nc-OS and a CAAC-OS because it contains a void. Specifically, the density of an a-like OS is higher than or equal to 78.6% and lower than 92.3% of the density of a single crystal oxide semiconductor having the same composition. The density of each of an nc-OS and a CAAC-OS is higher than or equal to 92.3% and lower than 100% of the density of a single crystal oxide semiconductor having the same composition. Note that it is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of an a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of an nc-OS and a CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors having different compositions are combined at an adequate ratio, which makes it possible to calculate density equivalent to that of a single crystal oxide semiconductor having a desired composition. The density of the single crystal oxide semiconductor having a desired composition can be calculated using a weighted average according to the combination ratio of the single crystal oxide semiconductors having different compositions. Note that it is preferable to use as few kinds of single crystal oxide semiconductors as possible to calculate the density.

As described above, an oxide semiconductor has various structures and various properties. Note that an oxide semiconductor may be a stacked layer including two or more of an amorphous oxide semiconductor, an a-like OS, an nc-OS, and a CAAC-OS, for example.

<2-5. Deposition Method of CAAC-OS>

An example of a method for depositing a CAAC-OS is described below.

Figure 24:
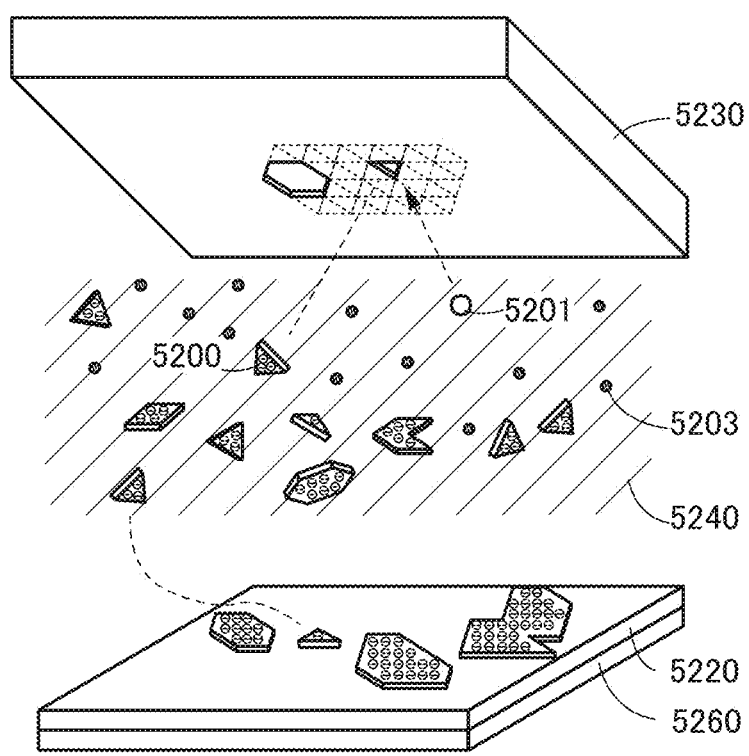
FIG. 24 illustrates a deposition method of a CAAC-OS.

FIG. 24 is a schematic view of the inside of a deposition chamber. A CAAC-OS can be deposited by a sputtering method.

As illustrated in FIG. 24, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets are arranged to face the target 5230 with the backing plate provided therebetween. A sputtering method in which the deposition speed is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at higher than or equal to 5 vol %) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion

5201 is generated. Examples of the ion 5201 include an oxygen cation (O⁺) and an argon cation (Ar⁺).

Figure 25A:
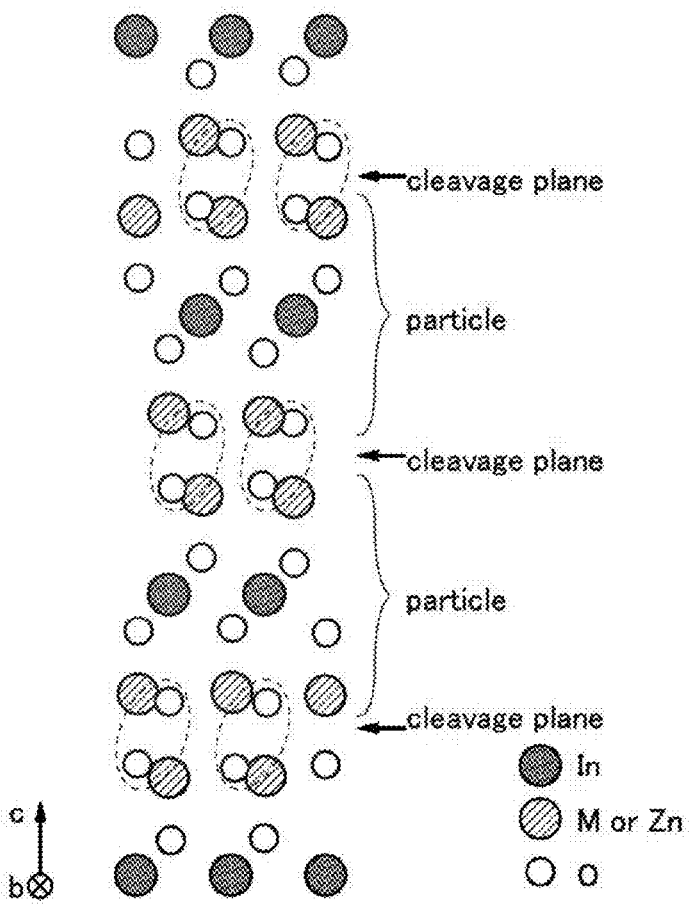
FIGS. 25A to 25C illustrate a crystal of $InMZnO_4$.
Figures 25B, 25C:
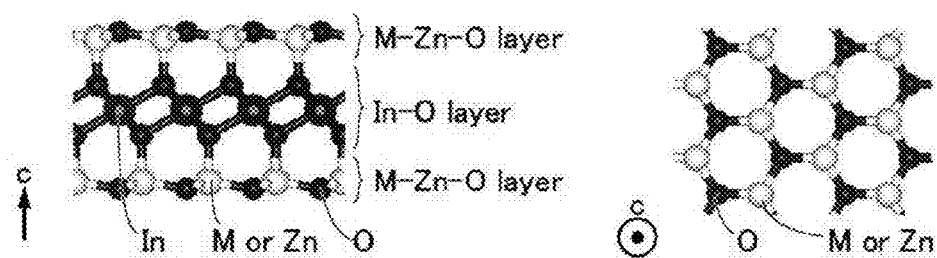

The target 5230 has a polycrystalline structure which includes a plurality of crystal grains and in which a cleavage plane exists in any of the crystal grains. FIGS. 25A to 25C illustrate the crystal structure of InMZnO₄ (an element M is Al, Ga, Y, or Sn, for example) included in the target 5230 as an example. Note that FIG. 25A illustrates the crystal structure of InMZnO₄ observed from a direction parallel to a b-axis. In the crystal of InMZnO₄, oxygen atoms are negatively charged, whereby repulsive force is generated between the two adjacent M-Zn—O layers. Thus, the InMZnO₄ crystal has a cleavage plane between the two adjacent M-Zn—O layers.

The ion 5201 generated in the high-density plasma region is accelerated toward the target 5230 side by an electric field and then collides with the target 5230. At this time, a pellet 5200 which is a flat-plate-like or pellet-like sputtered particle is separated from the cleavage plane (FIG. 24). The pellet 5200 is between the two cleavage planes illustrated in FIG. 25A. Thus, when the pellet 5200 is observed, the cross-section thereof is as illustrated in FIG. 25B, and the top surface thereof is as illustrated in FIG. 25C. Note that the structure of the pellet 5200 may be distorted by an impact of collision of the ion 5201.

The pellet 5200 is a flat-plate-like or pellet-like sputtered particle having a triangle plane, e.g., regular triangle plane. Alternatively, the pellet 5200 is a flat-plate-like or pellet-like sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 100 nm, preferably greater than or equal to 2 nm and less than or equal to 50 nm, more preferably greater than or equal to 3 nm and less than or equal to 30 nm. For example, the ion 5201 collides with the target 5230 including an In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can also be referred to as an atomic particle.

The pellet 5200 may receive charge when passing through the plasma 5240, so that surfaces thereof are negatively or positively charged. For example, the pellet 5200 receives negative charge from O²⁻ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that some of the particles 5203 are discharged to the outside by a vacuum pump or the like because the particle 5203 is small in mass.

Next, deposition of the pellet 5200 and the particle 5203 over the surface of the substrate 5220 is described with reference to FIGS. 26A to 26F.

First, a first of the pellets 5200 is deposited over the substrate 5220. Since the pellet 5200 has a flat-plate-like shape, it is deposited so that the flat plane faces the surface of the substrate 5220. Here, charge on a surface of the pellet 5200 on the substrate 5220 side is lost through the substrate 5220.

Next, a second of the pellets 5200 reaches the substrate 5220. Since a surface of the first pellet 5200 and a surface of the second pellet 5200 are charged, they repel each other. As a result, the second pellet 5200 avoids being deposited over the first pellet 5200 and is deposited with its flat plane facing the surface of the substrate 5220 so as to be a little distance away from the first pellet 5200. With repetition of this, millions of the pellets 5200 are deposited over the surface of the substrate 5220 to have a thickness of one layer. A region where no pellet 5200 is deposited is generated between adjacent pellets 5200 (see FIG. 26A).

Then, the particles 5203 that have received energy from plasma reach the surface of the substrate 5220. The particle 5203 cannot be deposited over an active region such as the surface of the pellet 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 26B).

Figure 26A:
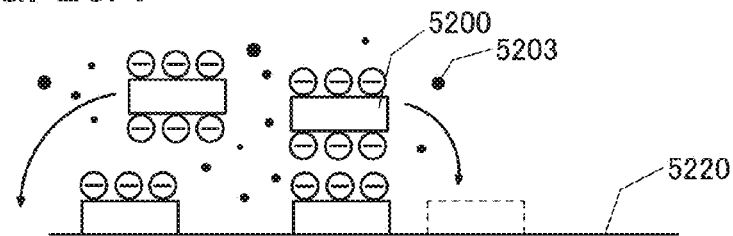
FIGS. 26A to 26F illustrate a deposition method of a CAAC-OS.
Figure 26B:
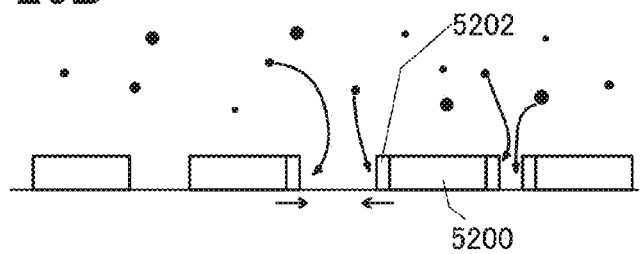
Figure 26C:
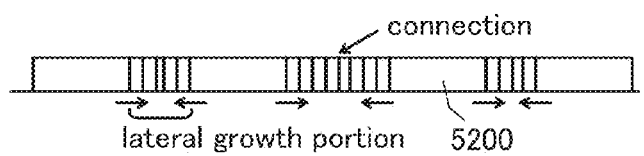

The lateral growth portions 5202 then further grow laterally so that the pellets 5200 are anchored to each other (see FIG. 26C). In this manner, the lateral growth portions 5202 are formed until they fill regions where no pellet 5200 is deposited. This mechanism is similar to a deposition mechanism of an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. The regions filling the gaps between the crystal regions are distorted crystal regions, and thus, it will not be appropriate to say that the regions have an amorphous structure.

Figure 26D:
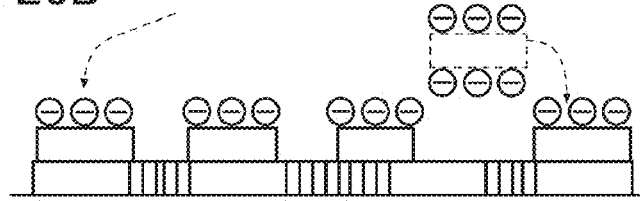
Figure 26E:
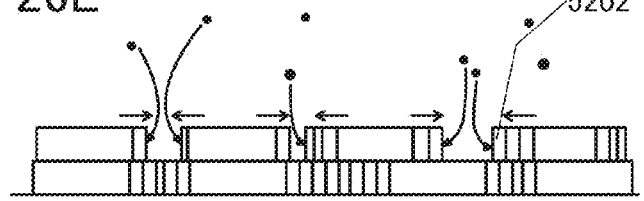
Figure 26F:
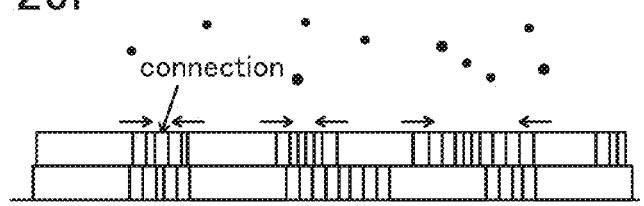

Next, new pellets 5200 are deposited with their flat planes facing the surface (see FIG. 26D). After that, the particles 5203 are deposited so as to fill regions where no pellet 5200 is deposited, thereby forming the lateral growth portions 5202 (see FIG. 26E). In such a manner, the particles 5203 are attached to side surfaces of the pellets 5200 and the lateral growth portions 5202 cause a lateral growth so that the pellets 5200 in the second layer are anchored to each other (see FIG. 26F). Deposition continues until an m-th layer (m is an integer of two or more) is formed; as a result, a stacked-layer thin film structure is formed.

A deposition way of the pellets 5200 changes depending on the surface temperature of the substrate 5220 or the like. For example, if the surface temperature of the substrate 5220 is high, migration of the pellets 5200 occurs over the surface of the substrate 5220. As a result, the proportion of the pellets 5200 that are directly connected to each other without the particles 5203 increases, whereby a CAAC-OS with high orientation is formed. The surface temperature of the substrate 5220 for deposition of a CAAC-OS is higher than or equal to room temperature and lower than 340° C., preferably higher than or equal to room temperature and lower than or equal to 300° C., more preferably higher than or equal to 100° C. and lower than or equal to 250° C., more preferably higher than or equal to 100° C. and lower than or equal to 200° C. Therefore, even when a large-sized substrate of the 8th generation or more is used as the substrate 5220, a warp or the like due to the deposition of a CAAC-OS hardly occurs.

On the other hand, if the surface temperature of the substrate 5220 is low, the migration of the pellets 5200 over the surface of the substrate 5220 does not easily occur. As a result, the pellets 5200 are stacked to form an nc-OS or the like with low orientation. In an nc-OS, the pellets 5200 are possibly deposited with certain gaps when the pellets 5200 are negatively charged. Therefore, an nc-OS has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are considered to be deposited on the surface of the substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be formed.

In addition, even when the surface of the substrate (formation surface) has an uneven shape, the pellets are aligned along the shape.

The above-described deposition model suggests that a CAAC-OS with high crystallinity can be formed in the following manner: deposition is performed in a high vacuum state to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In-M-Zn oxide, and any of the crystal grains has a cleavage plane, but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around the target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then M-Zn—O layers are bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

<2-6. Lateral Growth>

The following description explains that a lateral growth occurs when the particles 5203 are attached to (bonded to or adsorbed on) the pellet 5200 laterally.

FIGS. 27A to 27E illustrate the structure of the pellet 5200 and positions to which metal ions can be attached. A model assumed as the pellet 5200 is a cluster having an InMZnO$_4$ crystal structure from which 84 atoms are extracted and which holds the stoichiometric composition. The case where the element M is Ga is described below. FIG. 27F illustrates the structure of the pellet 5200 seen in the direction parallel to the c-axis. FIG. 27G illustrates the structure of the pellet 5200 seen in the direction parallel to the a-axis.

The positions where metal ions attach are represented as a position A, a position B, a position a, a position b, and a position c. The position A is an upper part of an interstitial site surrounded by one gallium atom and two zinc atoms on the top surface of the pellet 5200. The position B is an upper part of an interstitial site surrounded by two gallium atoms and one zinc atom on the top surface of the pellet 5200. The position a is in an indium site on a side surface of the pellet 5200. The position b is in an interstitial site between an In—O layer and a Ga—Zn—O layer on a side surface of the pellet 5200. The position c is in a gallium site on a side surface of the pellet 5200.

The relative energies in the case where metal ions are located in the assumed positions (the position A, the position B, the position a, the position b, and the position c) were estimated with first principles calculation. In the calculation, first principles calculation software VASP (Vienna Ab initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 400 eV, and F-only k-point sampling was used. Table 1 shows the relative energies in the case where an indium ion (In$^{3+}$), a gallium ion (Ga$^{3+}$), and a zinc ion (Zn$^{2+}$) are located in the position A, the position B, the position a, the position b, and the position c. Note that the relative energy is a relative value under the condition where the energy of the model with the lowest energy among the calculated models is set to 0 eV.

TABLE 1

| | Relative energy [eV] | | | | |
|---|---|---|---|---|---|
| | Top surface of pellet | | Side surface of pellet | | |
| Ion | A | B | a | b | c |
| In$^{3+}$ | 2.1 | 1.5 | 0.0 | 1.8 | 1.9 |
| Ga$^{3+}$ | 3.7 | 3.0 | 0.6 | 0.0 | 3.5 |
| Zn$^{2+}$ | 2.3 | 1.8 | 0.0 | 0.6 | 2.9 |

It is found that any metal ion is more likely to be attached to the side surface of the pellet 5200 than to the top surface thereof. In particular, in the indium site of the position a, a zinc ion as well as an indium ion is most likely to attach.

Figure 28A:
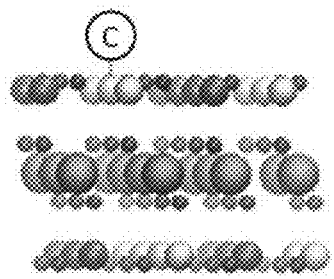
FIGS. 28A to 28G illustrate the position where a particle is attached to a pellet.
Figure 28B:
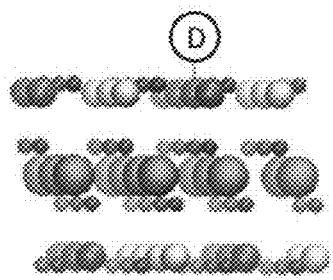
Figure 28C:
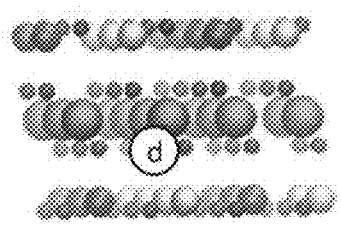
Figure 28D:
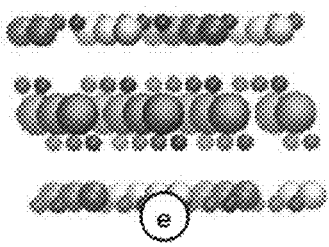
Figure 28E:
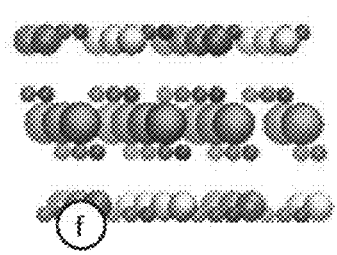
Figure 28F:
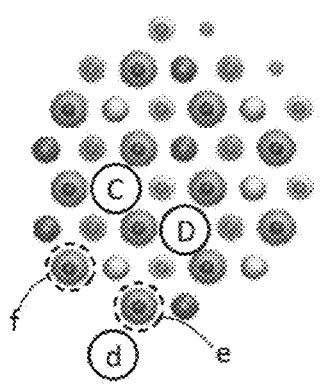
Figure 28G:
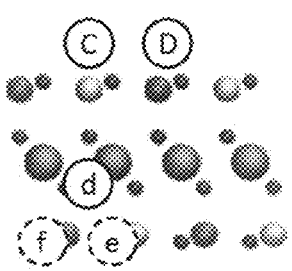

In a similar manner, ease of oxygen ion ($O^{2-}$) attachment to the pellet 5200 was examined. FIGS. 28A to 28E illustrate the structure of the pellet 5200 and positions to which oxygen ions can be attached. FIG. 28F illustrates the structure of the pellet 5200 seen in the direction parallel to the c-axis. FIG. 28G illustrates the structure of the pellet 5200 seen in the direction parallel to the b-axis.

The positions where oxygen ions attach are represented as a position C, a position D, a position d, a position e, and a position f. In the position C, an oxygen ion is bonded to gallium on the top surface of the pellet 5200. In the position D, an oxygen ion is bonded to zinc on the top surface of the pellet 5200. In the position d, an oxygen ion is bonded to indium on a side surface of the pellet 5200. In the position e, an oxygen ion is bonded to gallium on a side surface of the pellet 5200. In the position f, an oxygen ion is bonded to zinc on a side surface of the pellet 5200.

Next, the relative energies in the case where oxygen ions are located in the assumed positions (the position C, the position D, the position d, the position e, and the position f) were estimated with first principles calculation. Table 2 shows the relative energies in the case where oxygen ions ($O^{2-}$) are located in the position C, the position D, the position d, the position e, and the position f.

TABLE 2

| | Relative energy [eV] | | | | |
|---|---|---|---|---|---|
| | Top surface of pellet | | Side surface of pellet | | |
| Ion | C | D | d | e | f |
| $O^{2-}$ | 3.9 | 3.6 | 0.0 | 0.5 | 1.5 |

It is found that an oxygen ion is also likely to be attached to the side surface of the pellet 5200 than to the top surface thereof.

According to the above, the particle 5203 that has approached the pellet 5200 is preferentially attached to the side surface of the pellet 5200. This suggests that the deposition model in which a lateral growth of the pellet 5200 occurs with the particles 5203 attached to the side surface of the pellet 5200 has high validity.

The structure described in this embodiment can be combined with any of the structures described in the other embodiments as appropriate.

Embodiment 3

In this embodiment, a display device including a semiconductor device of one embodiment of the present invention will be described with reference to FIGS. 29A and 29B to FIG. 47. Note that a structure in which a liquid crystal element is used as a display element of a display device (a liquid crystal display device) will be specifically described in this embodiment.

<3-1. Liquid Crystal Display Device>

Figure 29A:
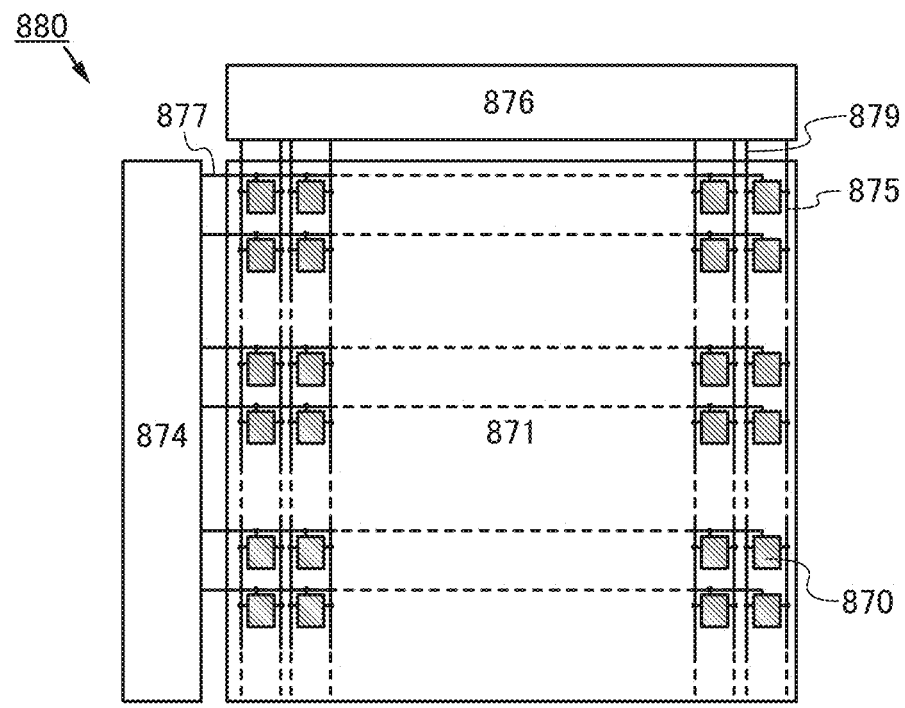
FIGS. 29A and 29B are a top view illustrating one embodiment of a display device and a circuit diagram illustrating one embodiment of a pixel.

A liquid crystal display device 880 in FIG. 29A includes a pixel portion 871, a gate driver 874, a source driver 876, m scan lines 877 which are arranged parallel or substantially parallel to each other and whose potentials are controlled by the gate driver 874, and n signal lines 879 which are arranged parallel or substantially parallel to each other and whose potentials are controlled by the source driver 876. The pixel portion 871 further includes a plurality of pixels 870 arranged in a matrix. Common lines 875 are arranged parallel or substantially parallel to each other along the signal lines 879. The gate driver 874 and the source driver 876 are collectively referred to as a driver circuit portion in some cases.

Each of the scan lines 877 is electrically connected to n pixels 870 arranged in the corresponding row among the plurality of pixels 870 arranged in m rows and n columns in the pixel portion 871. Each of the signal lines 879 is electrically connected to m pixels 870 arranged in the corresponding column among the plurality of pixels 870 arranged in m rows and n columns. Note that m and n are each an integer of 1 or more. Each of the common lines 875 is electrically connected to m pixels 870 arranged in the corresponding column among the pixels 870 arranged in m rows and n columns.

Figure 29B:
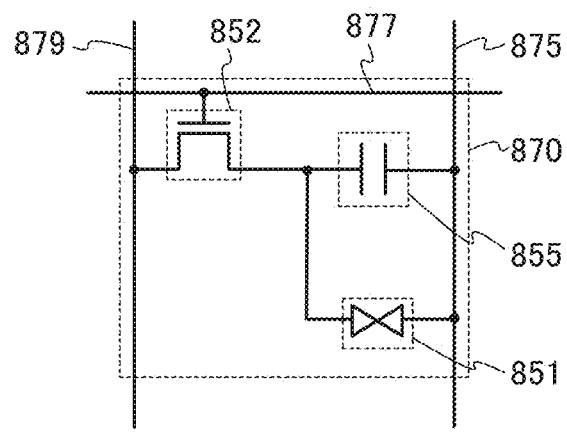

FIG. 29B illustrates an example of a circuit structure that can be used for the pixel 870 in the liquid crystal display device 880 illustrated in FIG. 29A.

The pixel 870 illustrated in FIG. 29B includes a liquid crystal element 851, a transistor 852, and a capacitor 855.

Any of the transistors described in Embodiment 1 can be used as the transistor 852.

One of a pair of electrodes of the liquid crystal element 851 is connected to the transistor 852, and the potential thereof is set according to the specifications of the pixel 870 as appropriate. The other of the pair of electrodes of the liquid crystal element 851 is connected to the common line 875, and a common potential is applied thereto. The orientation state of liquid crystal in the liquid crystal element 851 is controlled in accordance with data written to the transistor 852.

The liquid crystal element 851 is an element which controls transmission or non-transmission of light utilizing optical modulation action of liquid crystal. Note that optical modulation action of liquid crystal is controlled by an electric field applied to the liquid crystal (including a horizontal electric field, a vertical electric field, and an oblique electric field). As the liquid crystal used for the liquid crystal element 851, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented, and defects and damage of the liquid crystal display device in the manufacturing process can be reduced.

As a driving method of the liquid crystal display device 880 including the liquid crystal element 851, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

The liquid crystal display device 880 may be a normally black liquid crystal display device such as a transmissive liquid crystal display device utilizing a vertical alignment (VA) mode. Examples of the vertical alignment mode include a multi-domain vertical alignment (MVA) mode, a patterned vertical alignment (PVA) mode, and an advanced super view (ASV) mode.

<3-2. Horizontal Electric Field Mode Liquid Crystal Display Device>

First, liquid crystal display devices using a horizontal electric field mode, typically, liquid crystal display devices using an FFS mode and an IPS mode are described.

In the structure of the pixel 870 illustrated in FIG. 29B, one of a source electrode and a drain electrode of the transistor 852 is electrically connected to the signal line 879, and the other is electrically connected to the one of the pair of electrodes of the liquid crystal element 851. A gate electrode of the transistor 852 is electrically connected to the scan line 877. The transistor 852 has a function of controlling whether to write a data signal.

In the structure of the pixel 870 illustrated in FIG. 29B, one of a pair of electrodes of the capacitor 855 is connected to the other of the source electrode and the drain electrode of the transistor 852. The other of the pair of electrodes of the capacitor 855 is electrically connected to the common line 875. The potential of the common line 875 is set in accordance with the specifications of the pixel 870 as appropriate. The capacitor 855 functions as a storage capacitor for holding written data. Note that in the liquid crystal display device 880 driven in an FFS mode, the one of the pair of electrodes of the capacitor 855 is partly or entirely the one of the pair of electrodes of the liquid crystal element 851, and the other of the pair of electrodes of the capacitor 855 is partly or entirely the other of the pair of electrodes of the liquid crystal element 851.

<3-3. Structure Example 1 of Horizontal Electric Field Mode Element Substrate>

Figure 30:
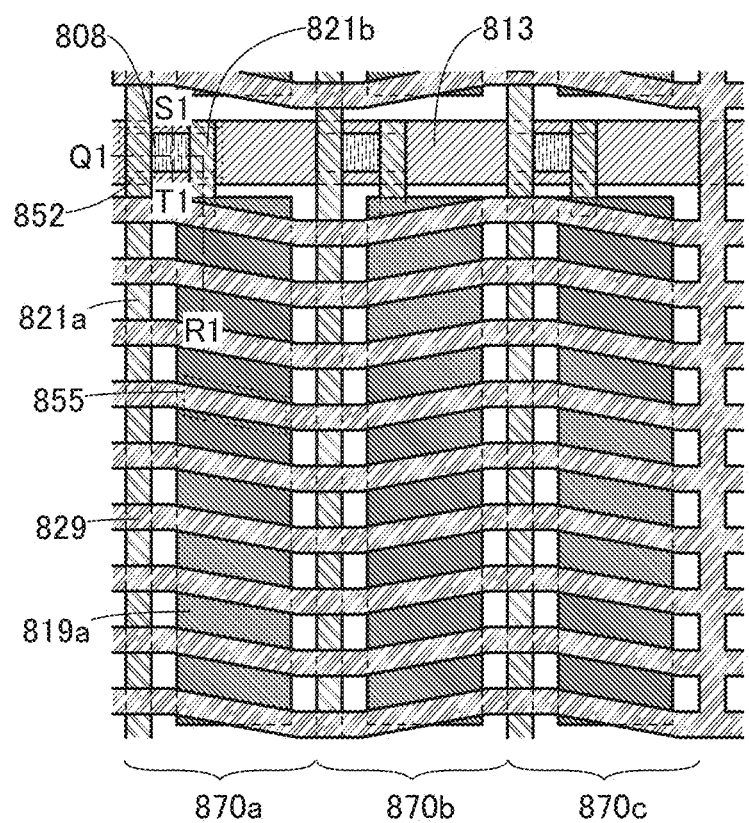
FIG. 30 is a top view illustrating pixels of one embodiment.

A specific structure of an element substrate included in the liquid crystal display device 880 is described. FIG. 30 is a top view of a plurality of pixels 870a, 870b, and 870c included in the liquid crystal display device 880 driven in an FFS mode.

In FIG. 30, a conductive film 813 functioning as a scan line extends substantially perpendicularly to the signal line (in the horizontal direction in the drawing). A conductive film 821a functioning as a signal line extends substantially perpendicularly to the scan line (in the vertical direction in the drawing). The conductive film 813 functioning as a scan line is electrically connected to the gate driver 874, and the conductive film 821a functioning as a signal line is electrically connected to the source driver 876 (see FIG. 29A).

The transistor 852 is provided in the vicinity of the intersection of the scan line and the signal line. The transistor 852 includes the conductive film 813 functioning as a first gate electrode, a gate insulating film (not illustrated in FIG. 30), an oxide semiconductor film 808 where a channel region is formed over the gate insulating film, and the conductive film 821a and a conductive film 821b functioning as a source electrode and a drain electrode. The conductive film 813 also functions as a scan line, and a region of the conductive film 813 that overlaps with the oxide semiconductor film 808 functions as a first gate electrode of the transistor 852. The conductive film 821a functions as a signal line, and a region of the conductive film 821a that overlaps with the oxide semiconductor film 808 functions as a source electrode or a drain electrode of the transistor 852. In the top view of FIG. 30, an end portion of the scan line is located on the outer side of an end portion of the oxide semiconductor film 808. Thus, the scan line functions as a light-blocking film for blocking light from a light source such as a backlight. For this reason, the oxide semiconductor film 808 included in the transistor is not irradiated with light, so that a fluctuation in the electric characteristics of the transistor can be suppressed.

The conductive film 821b is electrically connected to a conductive film 819a functioning as a pixel electrode. A common electrode 829 is provided over the conductive film 819a with an insulating film (not illustrated in FIG. 30) provided therebetween.

The common electrode 829 includes stripe regions extending in a direction intersecting with the signal line. The stripe region is connected to a region extending in a direction parallel or substantially parallel to the signal line. Accordingly, the stripe regions of the common electrode 829 are at the same potential in a plurality of pixels included in the liquid crystal display device 880.

The capacitor 855 is formed in a region where the conductive film 819a and the common electrode 829 overlap with each other. The conductive film 819a and the common electrode 829 each have a light-transmitting property. That is, the capacitor 855 has a light-transmitting property.

Owing to the light-transmitting property of the capacitor 855, the capacitor 855 can be formed large (in a large area) in the pixel 870. Thus, a display device with a large amount of charge as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charge stored in the capacitor is small in the high-resolution display device. However, since the capacitor 855 of this embodiment transmits light, when it is provided in a pixel, a sufficient amount of charge can be obtained in the pixel and the aperture ratio can be improved. Typically, the capacitor 855 can be favorably used for a high-resolution display device with a pixel density of 200 pixels per inch (ppi) or more, 300 ppi or more, or furthermore, 500 ppi or more.

In a liquid crystal display device, as the capacitance of a capacitor is increased, a period can be made longer during which the orientation of liquid crystal molecules of a liquid crystal element can be kept constant in the state where an electric field is applied. When the period can be made longer in a display device which displays a still image, the number of times of rewriting of image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 31:
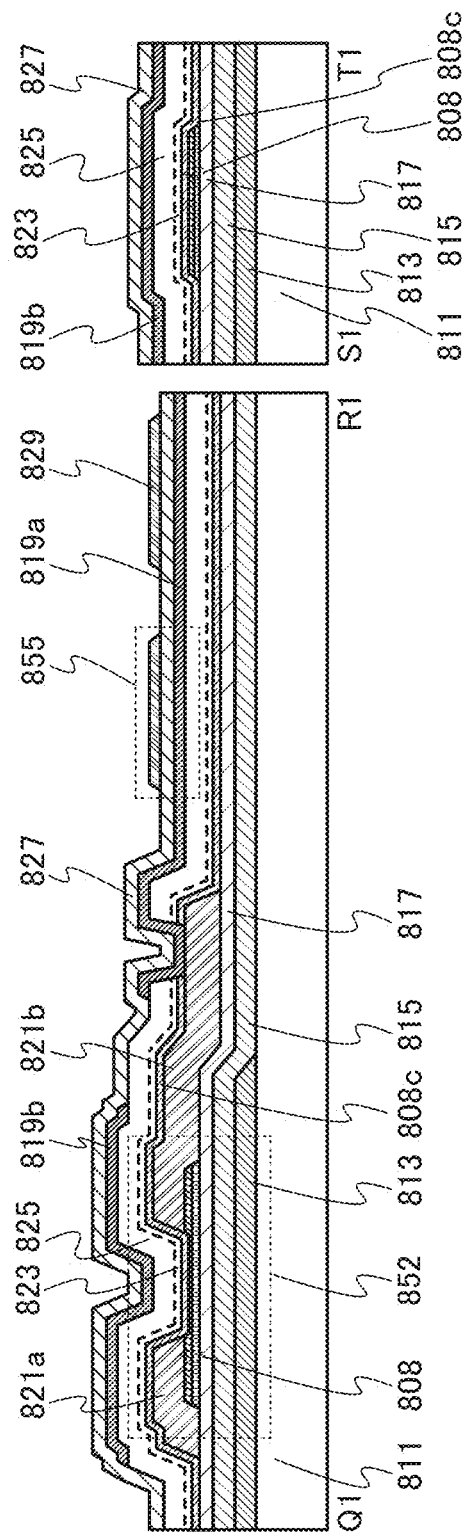
FIG. 31 is a cross-sectional view illustrating one embodiment of a pixel.

FIG. 31 is a cross-sectional view taken along the dashed-dotted line Q1-R1 and the dashed-dotted line S1-T1 in FIG.

30. The transistor 852 illustrated in FIG. 31 is a channel-etched transistor. Note that the transistor 852 in the channel length direction and the capacitor 855 are illustrated in the cross-sectional view taken along the dashed-dotted line Q1-R1, and the transistor 852 in the channel width direction is illustrated in the cross-sectional view taken along dashed-dotted line S1-T1. Note that the conductive film 819b functioning as a second gate electrode is not illustrated in FIG. 30 for simplicity of the drawing.

The transistor 852 illustrated in FIG. 31 includes the conductive film 813 functioning as a first gate electrode over a substrate 811, an insulating film 815 formed over the substrate 811 and the conductive film 813 functioning as a first gate electrode, an insulating film 817 formed over the insulating film 815, the oxide semiconductor film 808 overlapping with the conductive film 813 functioning as a first gate electrode with the insulating films 815 and 817 provided therebetween, the conductive films 821a and 821b functioning as a source electrode and a drain electrode and electrically connected to the oxide semiconductor film 808, an oxide semiconductor film 808c and insulating films 823 and 825 provided over the oxide semiconductor film 808 and the conductive films 821a and 821b functioning as a source electrode and a drain electrode, the conductive film 819b functioning as a second gate electrode over the insulating film 825, and an insulating film 827 over the insulating film 825 and the conductive film 819b.

The conductive film 819a is formed over the insulating film 825. The conductive film 819a is electrically connected to one of the conductive films 821a and 821b functioning as a source electrode and a drain electrode (here, the conductive film 821b) through an opening provided in the insulating films 823 and 825. The insulating film 827 is formed over the insulating film 825 and the conductive film 819a. The common electrode 829 is formed over the insulating film 827.

A region where the conductive film 819a, the insulating film 827, and the common electrode 829 overlap with each other functions as the capacitor 855.

Note that the cross-sectional structure of one embodiment of the present invention is not limited thereto. For example, the conductive film 819a may have a slit. Alternatively, the conductive film 819a may have a comb-like shape.

Figure 32:
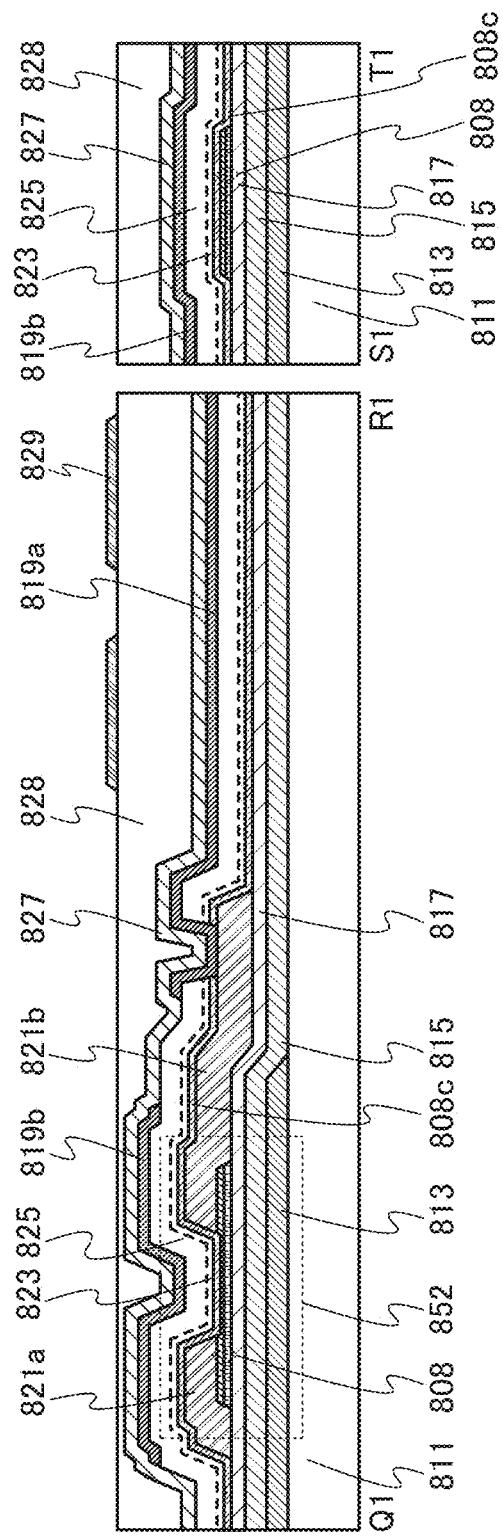
FIG. 32 is a cross-sectional view illustrating one embodiment of a pixel.

Note that as illustrated in FIG. 32, the common electrode 829 may be provided over an insulating film 828 provided over the insulating film 827. The insulating film 828 functions as a planarization film.

<3-4. Structure Example 2 of Horizontal Electric Field Mode Element Substrate>

Figure 33:
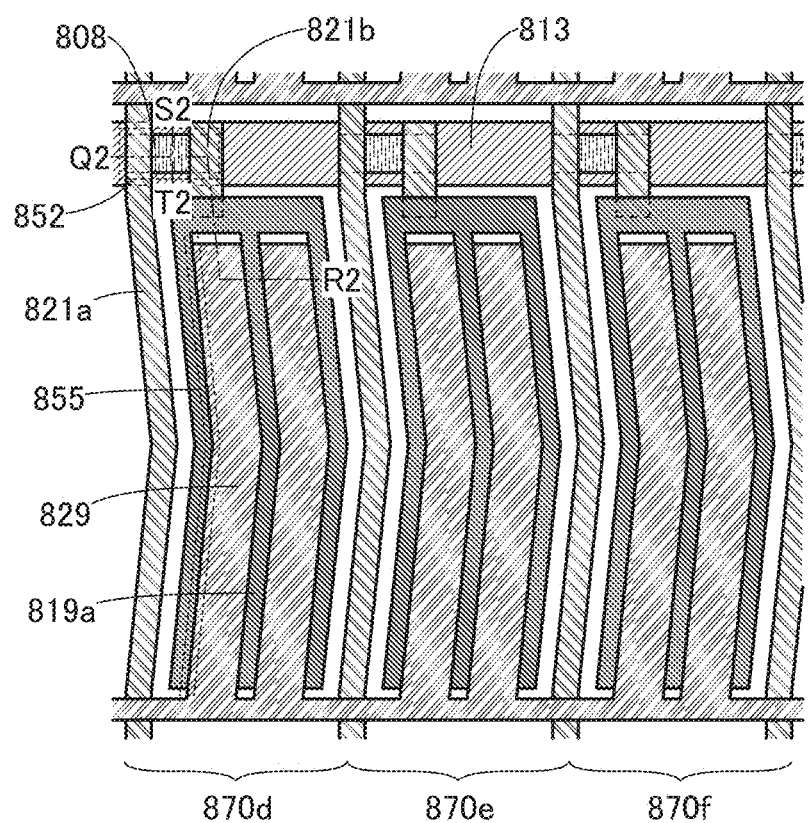
FIG. 33 is a top view illustrating pixels of one embodiment.

FIG. 33 is a top view of a plurality of pixels 870d, 870e, and 870f included in the liquid crystal display device 880. The structures of the pixels 870d, 870e, and 870f are different from those of the pixels illustrated in FIG. 30. The liquid crystal display device 880 illustrated in FIG. 33 is driven in an IPS mode.

In FIG. 33, the conductive film 813 functioning as a scan line extends in the horizontal direction in the drawing. The conductive film 821a functioning as a signal line extends substantially perpendicularly to the scan line (in the vertical direction in the drawing) so as to have a partly bent dogleg shape (V-like shape). The conductive film 813 functioning as a scan line is electrically connected to the gate driver 874, and the conductive film 821a functioning as a signal line is electrically connected to the source driver 876 (see FIG. 29A).

The transistor 852 is provided in the vicinity of the intersection of the scan line and the signal line. The transistor 852 includes the conductive film 813 functioning as a first gate electrode, the gate insulating film (not illustrated in FIG. 33), the oxide semiconductor film 808 where a channel region is formed over the gate insulating film, and the conductive film 821a and the conductive film 821b functioning as a source electrode and a drain electrode. The conductive film 813 also functions as a scan line, and a region of the conductive film 813 that overlaps with the oxide semiconductor film 808 functions as a first gate electrode of the transistor 852. The conductive film 821a functions as a signal line, and a region of the conductive film 821a that overlaps with the oxide semiconductor film 808 functions as a source electrode or a drain electrode of the transistor 852. In the top view of FIG. 33, an end portion of the scan line is located on the outer side of an end portion of the oxide semiconductor film 808. Thus, the scan line functions as a light-blocking film for blocking light from a light source such as a backlight. For this reason, the oxide semiconductor film 808 included in the transistor is not irradiated with light, so that a fluctuation in the electric characteristics of the transistor can be suppressed.

The conductive film 821b is electrically connected to the conductive film 819a functioning as a pixel electrode. The conductive film 819a is formed in a comb-like shape. An insulating film (not illustrated in FIG. 33) is provided over the conductive film 819a, and the common electrode 829 is provided over the insulating film. The common electrode 829 has a comb-like shape so as to overlap with part of the conductive film 819a and engage with the conductive film 819a in the top view. The common electrode 829 is connected to a region extending in a direction parallel or substantially parallel to the scan line. Accordingly, protruding regions of the common electrode 829 are at the same potential in a plurality of pixels included in the liquid crystal display device 880. Note that the conductive film 819a and the common electrode 829 have a dogleg shape (V-like shape) bent along the signal line (the conductive film 821a).

The capacitor 855 is formed in a region where the conductive film 819a and the common electrode 829 overlap with each other. The conductive film 819a and the common electrode 829 each have a light-transmitting property. That is, the capacitor 855 has a light-transmitting property.

Figure 34:
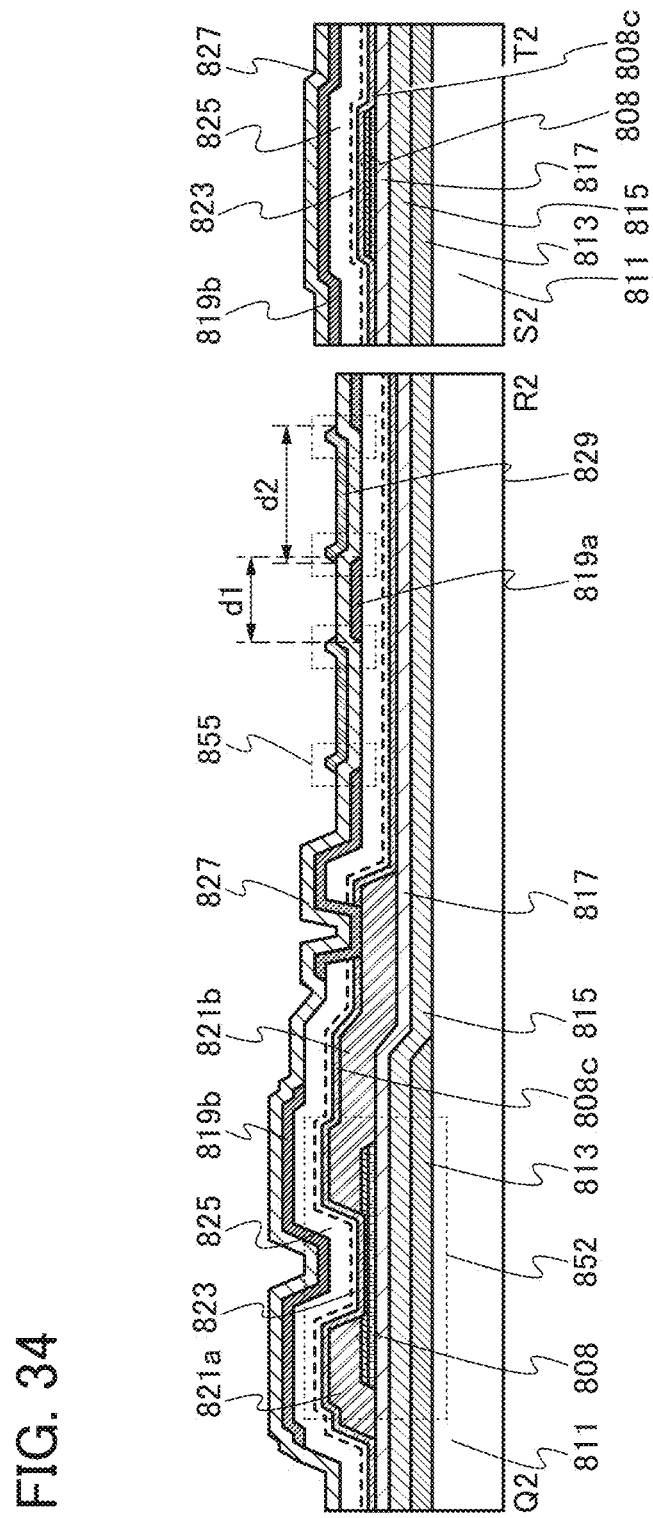
FIG. 34 is a cross-sectional view illustrating one embodiment of a pixel.

FIG. 34 is a cross-sectional view taken along the dashed-dotted line Q2-R2 and the dashed-dotted line S2-T2 in FIG. 30. The transistor 852 illustrated in FIG. 34 is a channel-etched transistor. Note that the transistor 852 in the channel length direction and the capacitor 855 are illustrated in the cross-sectional view taken along the dashed-dotted line Q2-R2, and the transistor 852 in the channel width direction is illustrated in the cross-sectional view taken along the dashed-dotted line S2-T2. Note that the conductive film 819b functioning as a second gate electrode is not illustrated in FIG. 33 for simplicity of the drawing.

The transistor 852 illustrated in FIG. 34 includes the conductive film 813 functioning as a first gate electrode over the substrate 811, the insulating film 815 formed over the substrate 811 and the conductive film 813 functioning as a first gate electrode, the insulating film 817 formed over the insulating film 815, the oxide semiconductor film 808 overlapping with the conductive film 813 functioning as a first gate electrode with the insulating films 815 and 817 provided therebetween, the conductive films 821a and 821b functioning as a source electrode and a drain electrode and in contact with the oxide semiconductor film 808, the oxide semiconductor film 808c and the insulating films 823 and 825 provided over the oxide semiconductor film 808, the conductive films 821a and 821b functioning as a source electrode and a drain electrode, and the insulating film 817, the conductive film 819*b* functioning as a second gate electrode over the insulating film 825, and the insulating film 827 over the insulating film 825 and the conductive film 819*b*.

The conductive film 819*a* is formed over the insulating film 825. The conductive film 819*a* is electrically connected to one of the conductive films 821*a* and 821*b* functioning as a source electrode and a drain electrode (here, the conductive film 821*b*) through an opening provided in the insulating films 823 and 825. The insulating film 827 is formed over the insulating film 825 and the conductive film 819*a*. The common electrode 829 is formed over the insulating film 827.

A region where the conductive film 819*a*, the insulating film 827, and the common electrode 829 overlap with each other functions as the capacitor 855.

In the liquid crystal display device illustrated in FIG. 33 and FIG. 34, the capacitor included in the pixel has a structure in which an end portion and the vicinity of the end portion of the conductive film 819*a* overlap with an end portion and the vicinity of the end portion of the common electrode 829. With this structure, a capacitor with a suitable size, not a too large size, can be formed in a large liquid crystal display device.

Figure 35:
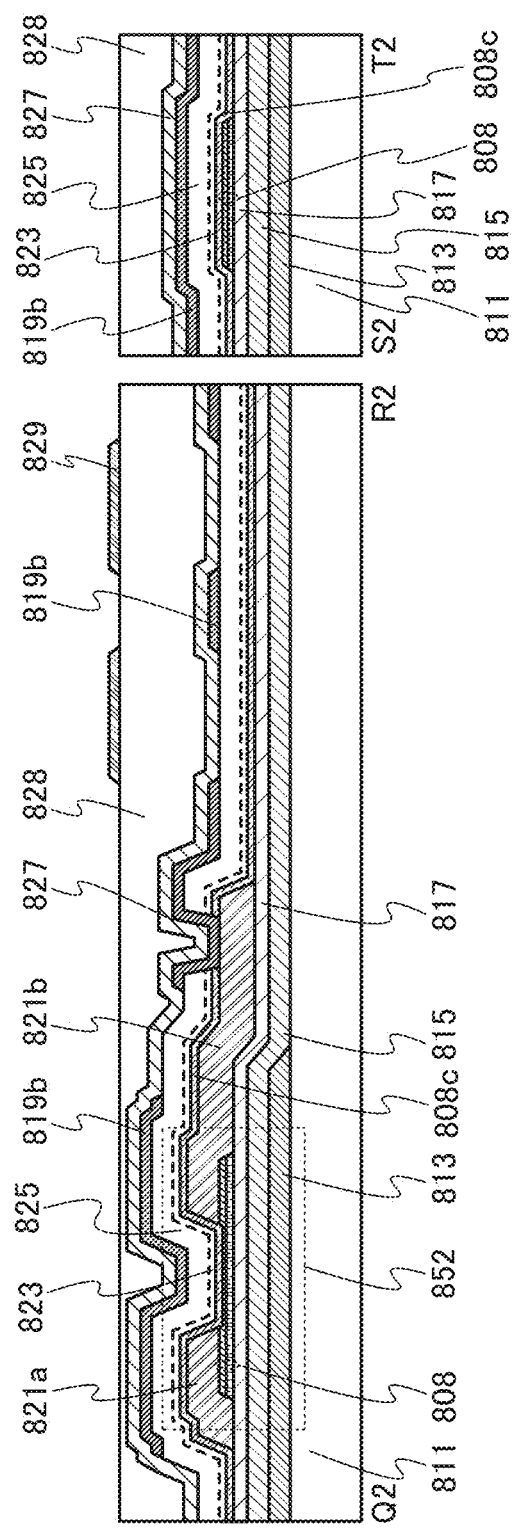
FIG. 35 is a cross-sectional view illustrating one embodiment of a pixel.

Note that as illustrated in FIG. 35, the common electrode 829 may be provided over the insulating film 828 provided over the insulating film 827.

Figure 36:
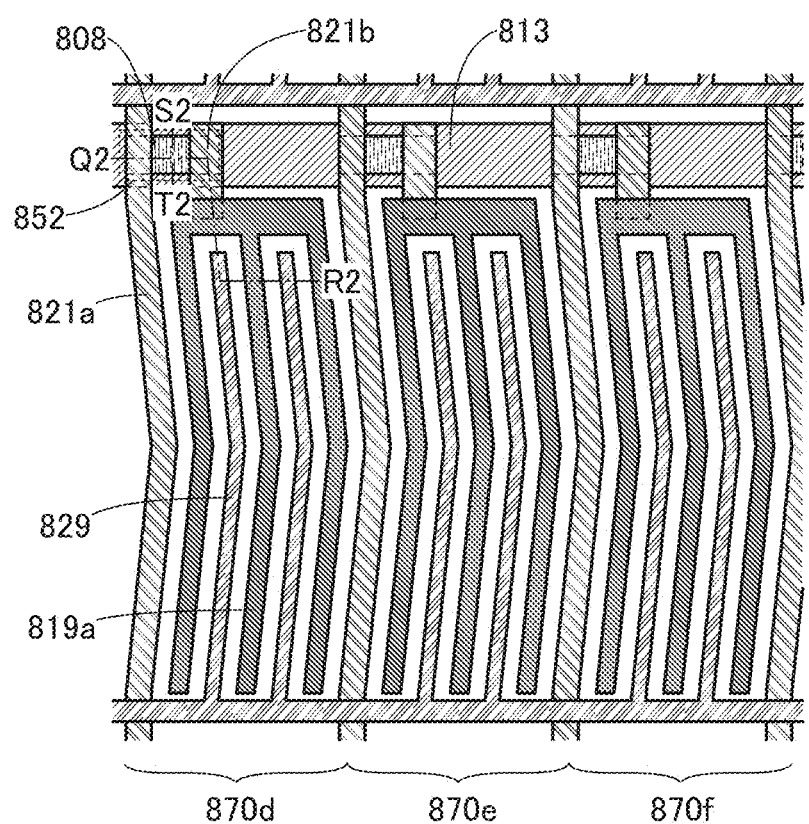
FIG. 36 is a top view illustrating pixels of one embodiment.
Figure 37:
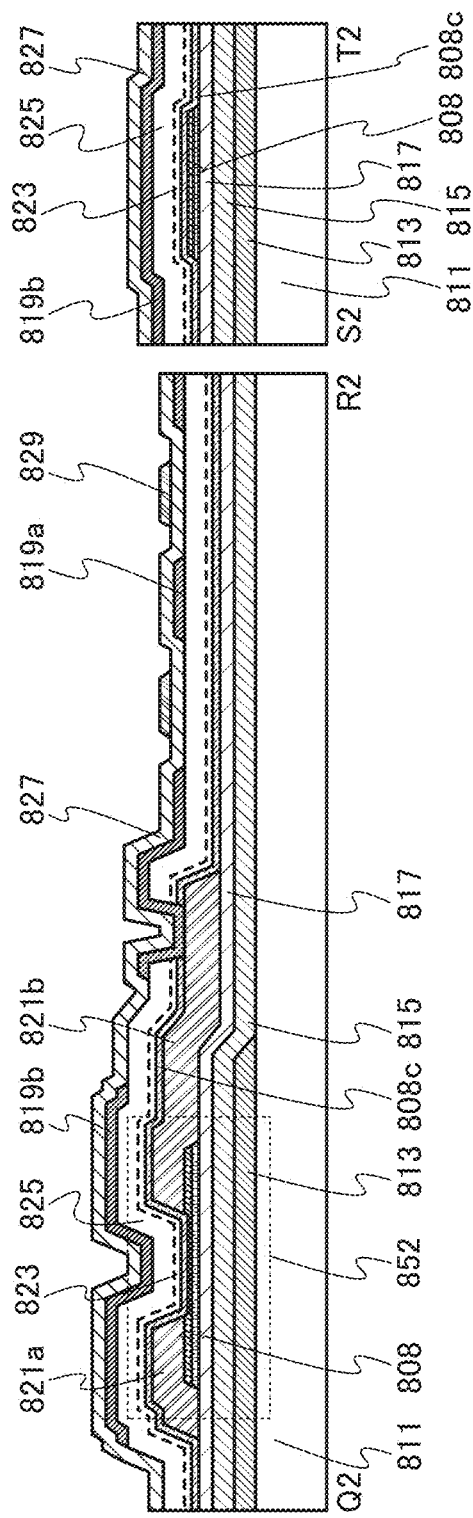
FIG. 37 is a cross-sectional view illustrating one embodiment of a pixel.
Figure 38:
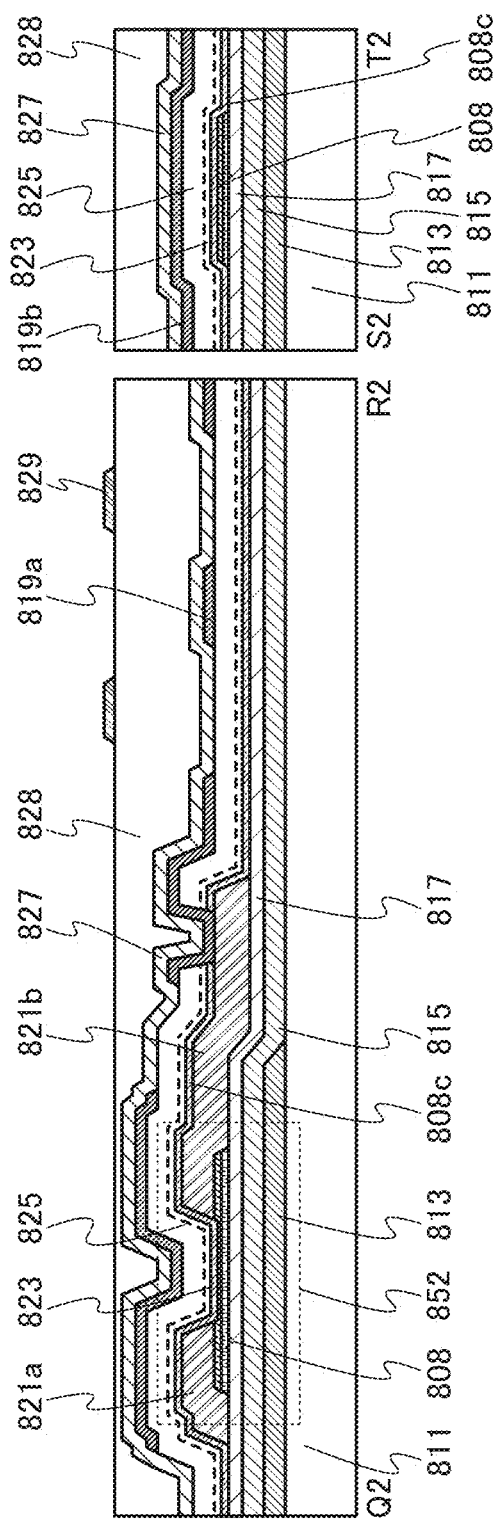
FIG. 38 is a cross-sectional view illustrating one embodiment of a pixel.

A structure in which the conductive film 819*a* does not overlap with the common electrode 829 as illustrated in FIG. 36 and FIG. 37 may also be used. The positional relation of the conductive film 819*a* and the common electrode 829 can be determined as appropriate depending on the size of a capacitor in accordance with the driving method and the resolution of the display device. Note that the common electrode 829 included in the display device illustrated in FIG. 37 may be provided over the insulating film 828 functioning as a planarization film (see FIG. 38).

Figure 39:
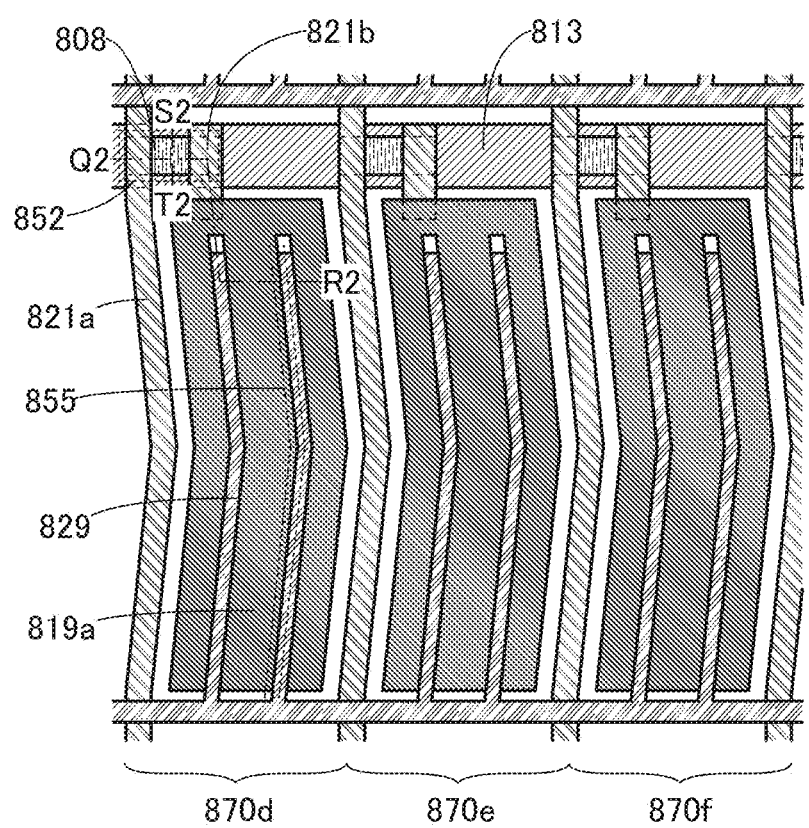
FIG. 39 is a top view illustrating pixels of one embodiment.
Figure 40:
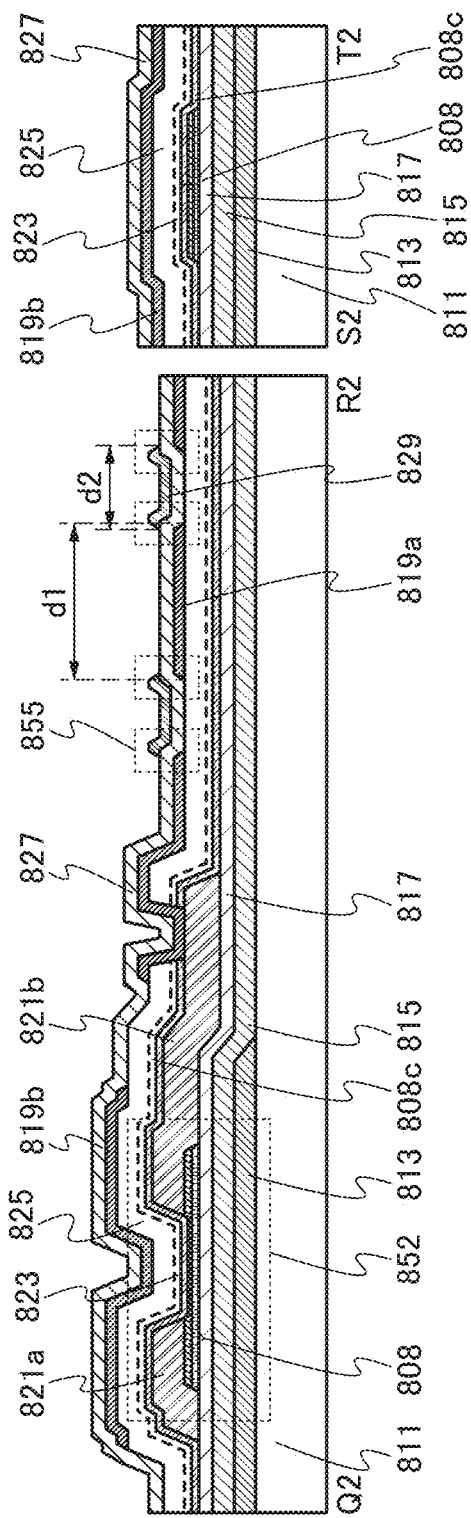
FIG. 40 is a cross-sectional view illustrating one embodiment of a pixel.

In the liquid crystal display device illustrated in FIG. 33 and FIG. 34, a width (d1 in FIG. 34) of a region extending in a direction parallel or substantially parallel to the signal line (the conductive film 821*a*) in the conductive film 819*a* is smaller than a width (d2 in FIG. 34) of a region extending in a direction parallel or substantially parallel to the signal line in the common electrode 829; however, the liquid crystal display device is not limited to this structure. As illustrated in FIG. 39 and FIG. 40, the width d1 may be larger than the width d2. Alternatively, the width d1 may be equal to the width d2. In one pixel (e.g., the pixel 870*d*), widths of a plurality of regions extending in a direction parallel or substantially parallel to the signal line in the conductive film 819*a* and/or the common electrode 829 may be different from each other.

Figure 41:
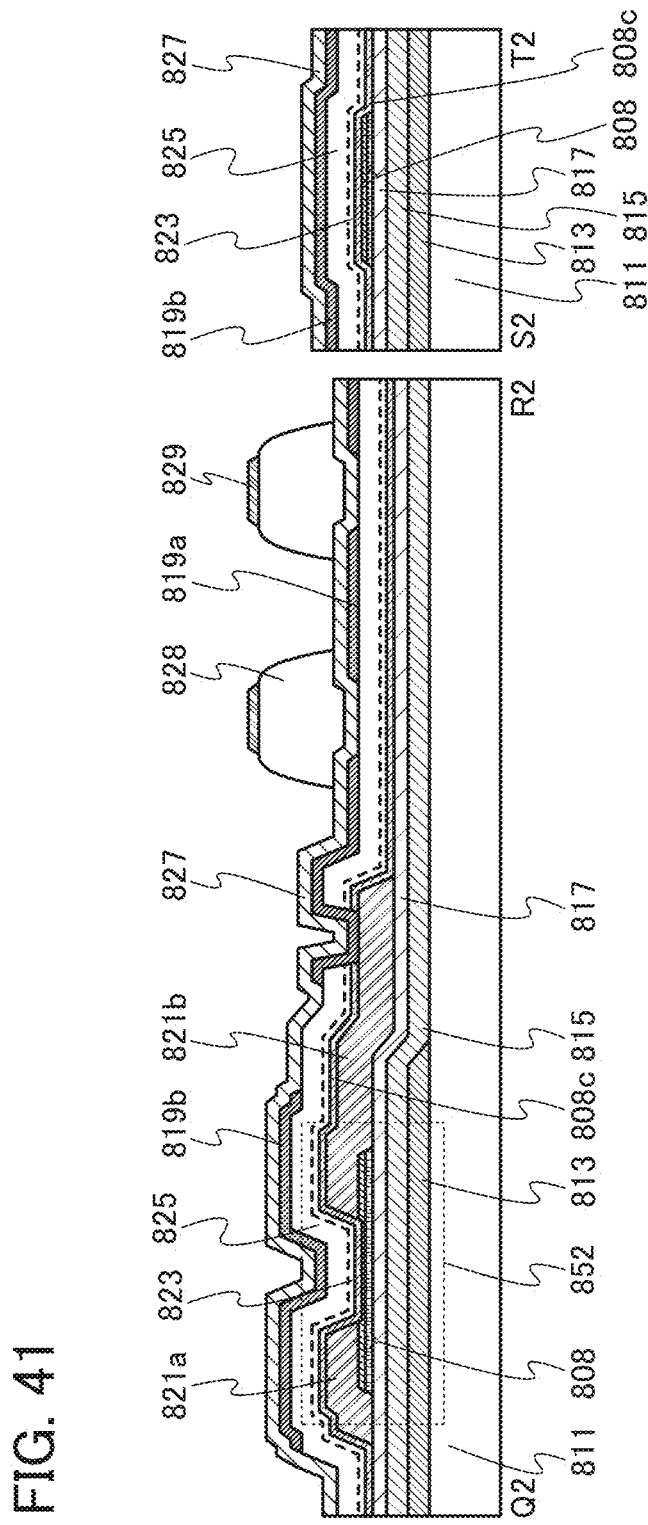
FIG. 41 is a cross-sectional view illustrating one embodiment of a pixel.
Figure 42:
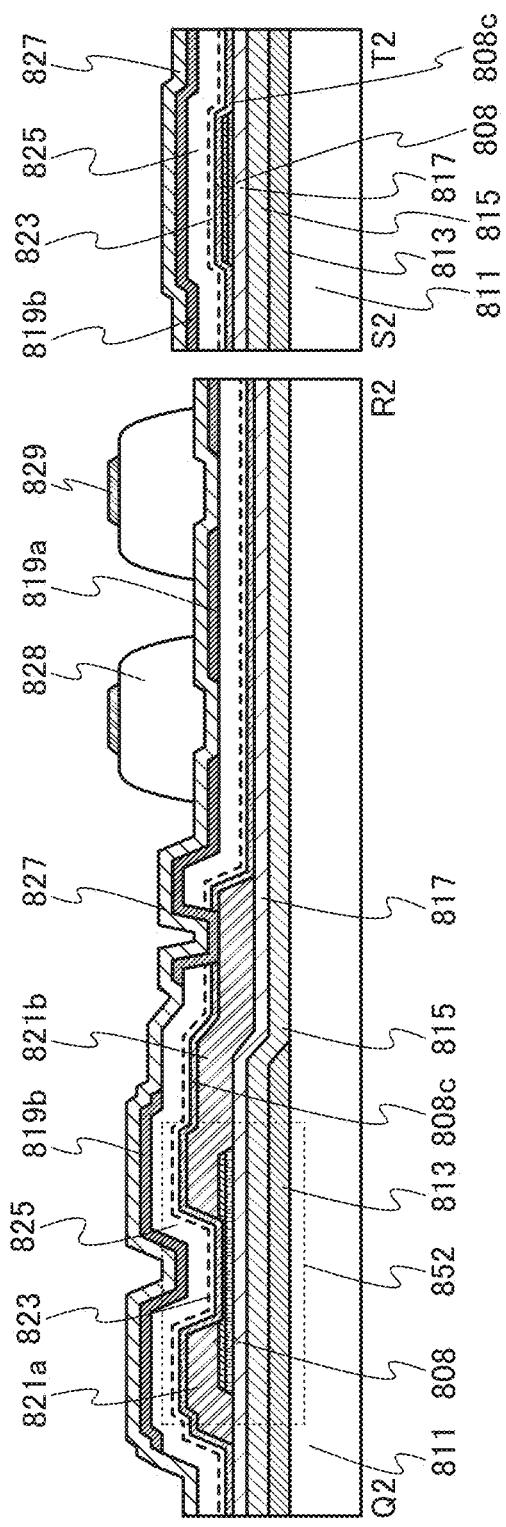
FIG. 42 is a cross-sectional view illustrating one embodiment of a pixel.

A structure as illustrated in FIG. 41 may also be used in which, in the insulating film 828 over the insulating film 827, only a region overlapping with the common electrode 829 over the insulating film 828 is left and the other region is removed. In that case, the insulating film 828 can be etched using the common electrode 829 as a mask. The unevenness of the common electrode 829 over the insulating film 828 functioning as a planarization film can be suppressed, and the insulating film 828 has a gently-sloping side surface in a region from an end portion of the common electrode 829 toward the insulating film 827. Alternatively, a structure as illustrated in FIG. 42 may also be used in which, in a surface of the insulating film 828, part of a region parallel to the substrate 811 is not covered with the common electrode 829.

Figure 43:
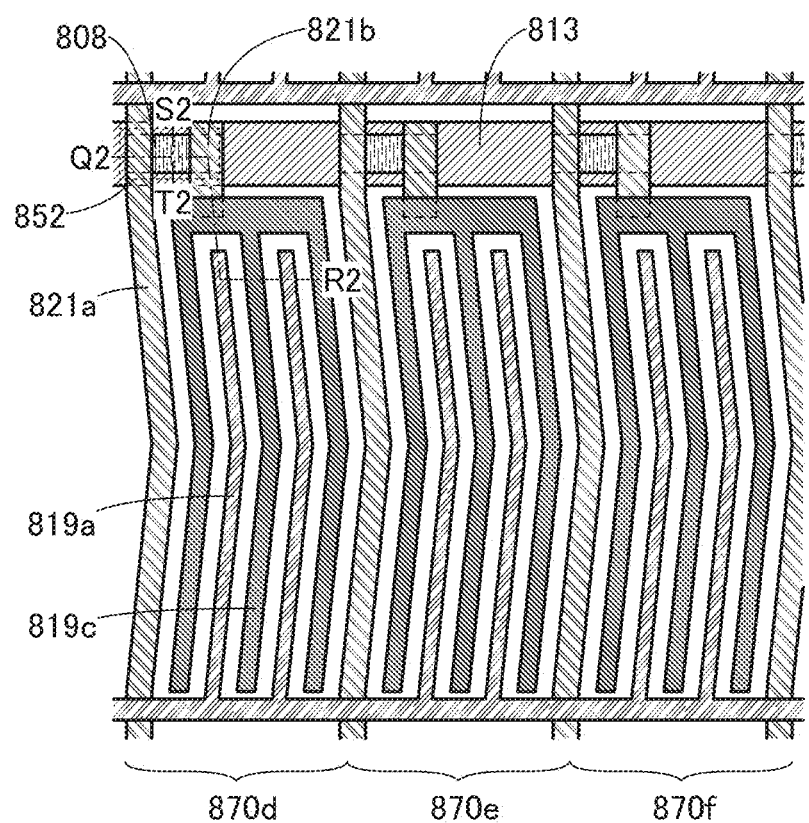
FIG. 43 is a top view illustrating pixels of one embodiment.
Figure 44:
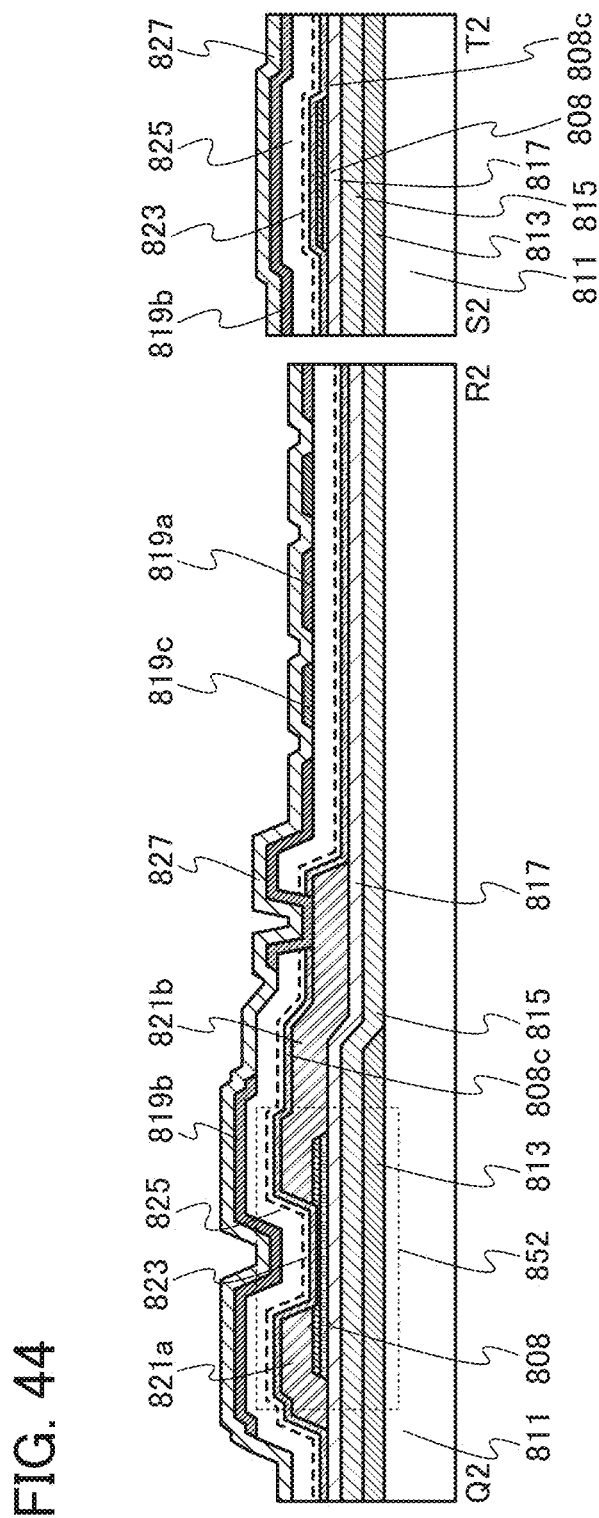
FIG. 44 is a cross-sectional view illustrating one embodiment of a pixel.

As illustrated in FIG. 43 and FIG. 44, the common electrode may be provided over a film over which the conductive film 819*a* is formed, i.e., over the insulating film 825. A common electrode 819*c* illustrated in FIG. 43 and FIG. 44 can be formed using a material used for forming the conductive film 819*a*, i.e., by processing an oxide semiconductor film used for forming the conductive film 819*a*.

<3-5. Vertical Alignment Mode Liquid Crystal Display Device>

Figure 45:
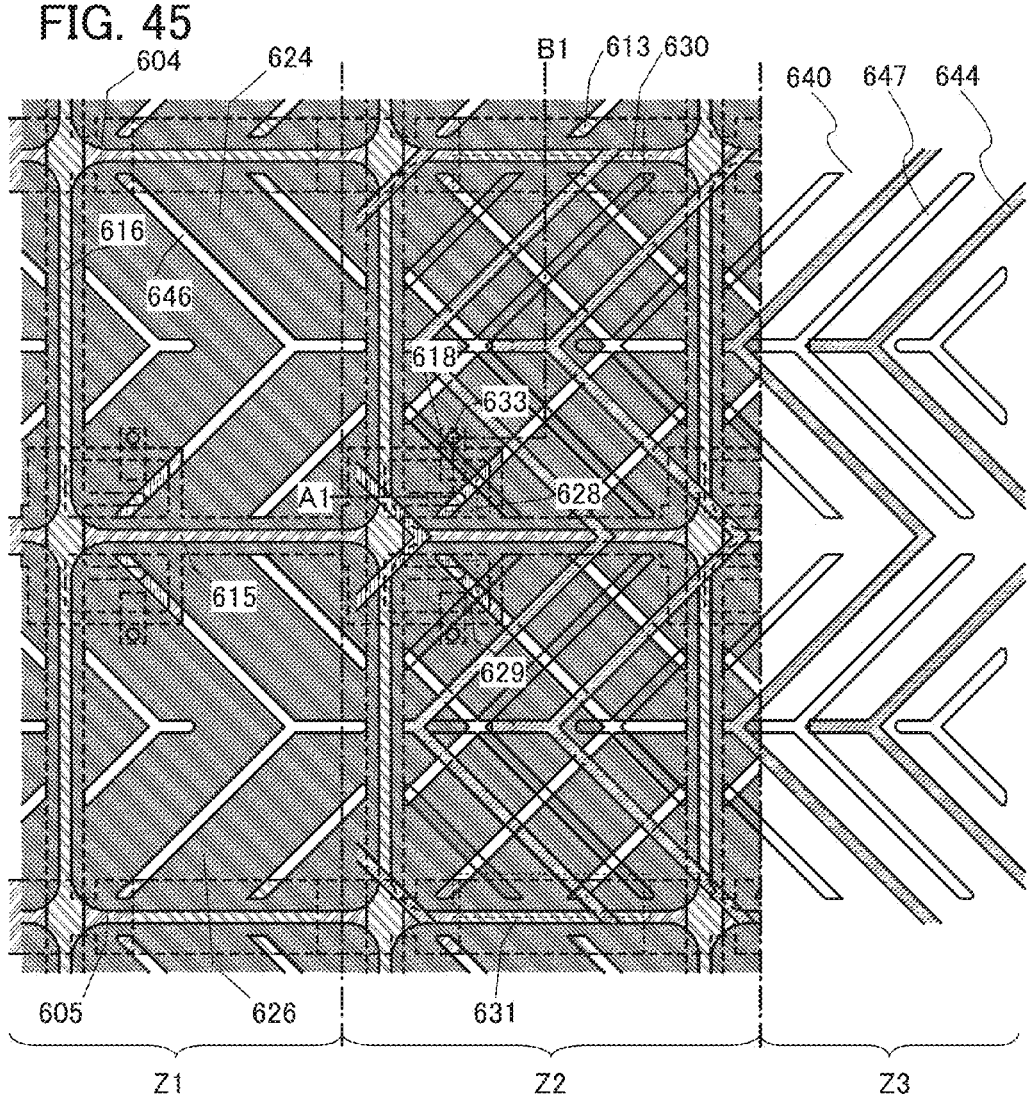
FIG. 45 is a top view illustrating a pixel of one embodiment.
Figure 46:
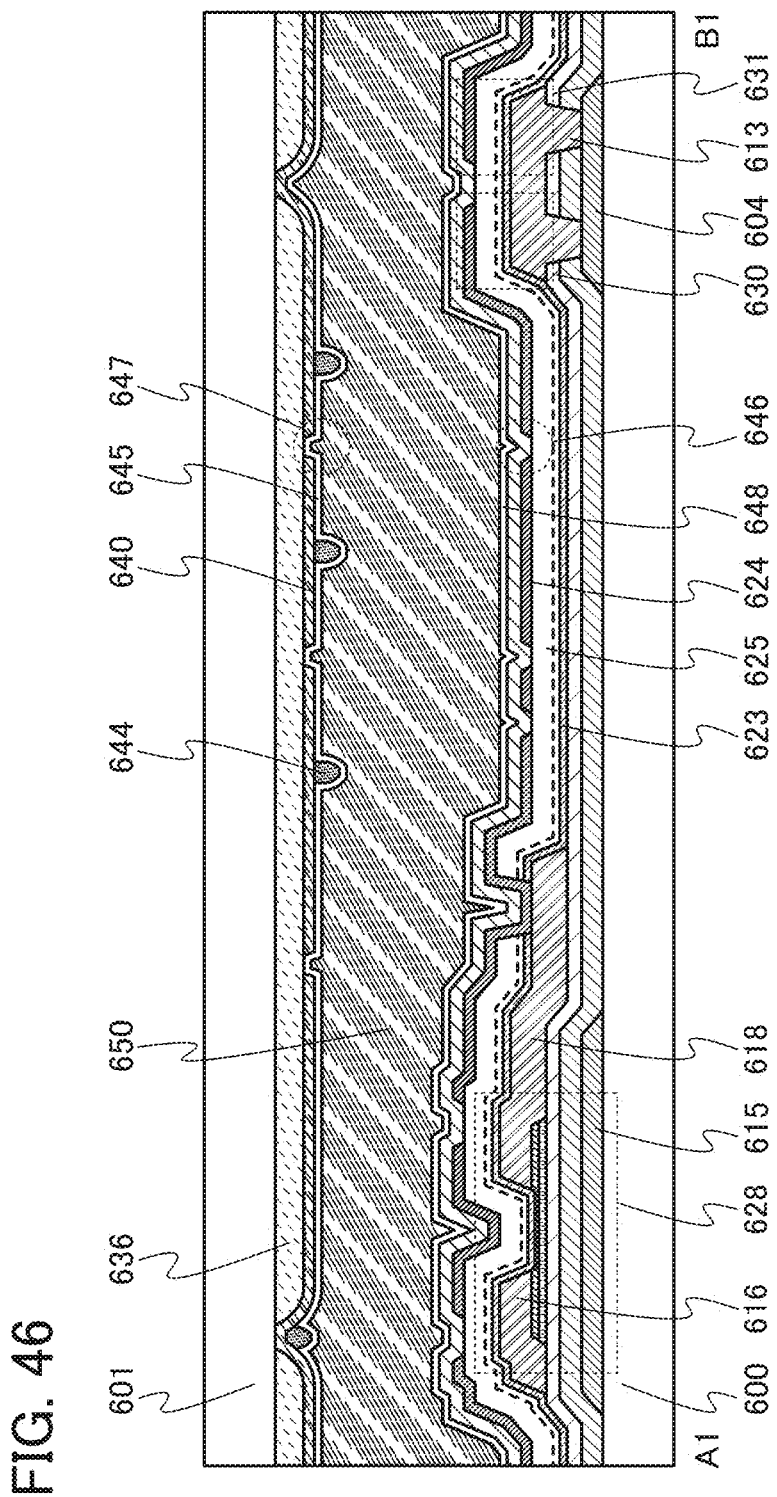
FIG. 46 is a cross-sectional view illustrating one embodiment of a pixel.
Figure 47:
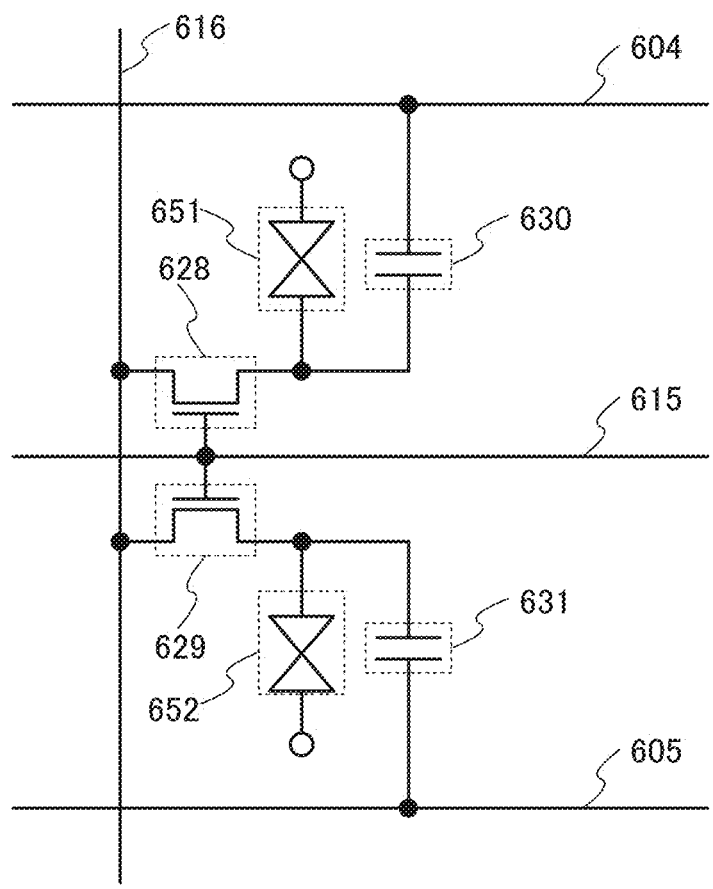
FIG. 47 is a circuit diagram illustrating one embodiment of a pixel.

The structure of a pixel including a liquid crystal element which operates in a vertical alignment (VA) mode is described with reference to FIG. 45 and FIG. 46. FIG. 45 is a top view of a pixel included in the liquid crystal display device. FIG. 46 is a side view including the cross section taken along the section line A1-B1 in FIG. 45. FIG. 47 is an equivalent circuit diagram of the pixel included in the liquid crystal display device.

A vertical alignment (VA) is a mode for controlling orientation of liquid crystal molecules of a liquid crystal display panel. In the VA liquid crystal display device, liquid crystal molecules are aligned in a vertical direction with respect to a panel surface when no voltage is applied.

In the following description, it is devised to particularly separate a pixel into some regions (sub-pixels) so that molecules are oriented in different directions in the respective regions. This is referred to as multi-domain or multi-domain design. In the following description, a liquid crystal display device with multi-domain design is described.

In FIG. 45, Z1 is a top view of a substrate 600 provided with a pixel electrode 624. Z3 is a top view of a substrate 601 provided with a common electrode 640. Z2 is a top view illustrating a state where the substrate 601 provided with the common electrode 640 overlaps with the substrate 600 provided with the pixel electrode 624.

A transistor 628, the pixel electrode 624 connected thereto, and a capacitor 630 are formed over the substrate 600. A drain electrode 618 of the transistor 628 is electrically connected to the pixel electrode 624 through an opening 633 provided in an insulating film 623 and an insulating film 625.

Any of the transistors described in Embodiment 1 can be used as the transistor 628.

The capacitor 630 includes a wiring 613 over a capacitor wiring 604 which is a first capacitor wiring, the insulating films 623 and 625, and the pixel electrode 624. The capacitor wiring 604 can be formed simultaneously with and using the same material as that of a gate wiring 615 of the transistor 628. In addition, the wiring 613 can be formed simultaneously with and using the same material as that of the drain electrode 618 and a wiring 616.

The oxide semiconductor film having become a conductor which is described in Embodiment 1 can be used for the pixel electrode 624.

The pixel electrode 624 is provided with a slit 646. The slit 646 is provided for controlling the orientation of the liquid crystal.

A transistor 629, a pixel electrode 626 connected thereto, and a capacitor 631 can be formed in manners similar to those of the transistor 628, the pixel electrode 624, and the capacitor 630, respectively. Both the transistors 628 and 629 are connected to the wiring 616. The wiring 616 functions as a source electrode in each of the transistors 628 and 629. A pixel of the liquid crystal display panel described in this embodiment includes the pixel electrodes 624 and 626. Each of the pixel electrodes 624 and 626 is used for a sub-pixel.

The substrate 601 is provided with a coloring film 636 and the common electrode 640, and the common electrode 640 is provided with a structure body 644. The common electrode 640 is provided with a slit 647. An alignment film 648 is formed over the pixel electrode 624. Similarly, an alignment film 645 is formed on the common electrode 640 and the structure body 644. A liquid crystal layer 650 is formed between the substrate 600 and the substrate 601.

The slit 647 formed in the common electrode 640 and the structure body 644 each have a function of controlling the orientation of liquid crystal.

When voltage is applied to the pixel electrode 624 provided with the slit 646, a distorted electric field (an oblique electric field) is generated in the vicinity of the slit 646. The slit 646 and the structure body 644 on the substrate 601 side and the slit 647 are alternately arranged in an engaging manner; thus, an oblique electric field is effectively generated to control orientation of the liquid crystal, so that a direction of orientation of the liquid crystal varies depending on location. That is, the viewing angle of the liquid crystal display panel is increased by employing multi-domain. Note that one of the structure body 644 and the slit 647 may be provided on the substrate 601 side.

FIG. 46 illustrates a state where the substrate 600 and the substrate 601 overlap with each other and liquid crystal is injected therebetween. A liquid crystal element is formed by overlapping of the pixel electrode 624, the liquid crystal layer 650, and the common electrode 640.

FIG. 47 illustrates an equivalent circuit of this pixel structure. Both the transistors 628 and 629 are connected to the gate wiring 615 and the wiring 616. In that case, by making the potential of the capacitor wiring 604 different from that of a capacitor wiring 605, operation of a liquid crystal element 651 can be different from that of a liquid crystal element 652. In other words, potentials of the capacitor wirings 604 and 605 are individually controlled, whereby orientation of liquid crystal is precisely controlled to expand a viewing angle.

This embodiment can be combined with any of the other embodiments in this specification as appropriate.

Embodiment 4

In this embodiment, a display device that includes a semiconductor device of one embodiment of the present invention will be described with reference to FIGS. 48A and 48B and FIGS. 49A and 49B. Note that in this embodiment, a structure in which an electroluminescence (EL) element is included as a display element of the display device will be specifically described.

<4-1. Display Device>

The display device illustrated in FIG. 48A includes a region including pixels of display elements (hereinafter, the region is referred to as a pixel portion 502), a circuit portion provided outside the pixel portion 502 and including circuits for driving the pixels (hereinafter, the portion is referred to as a driver circuit portion 504), circuits each having a function of protecting an element (hereinafter, the circuits are referred to as protection circuits 506), and a terminal portion 507. Note that the protection circuits 506 are not necessarily provided.

Part or the whole of the driver circuit portion 504 is preferably formed over the substrate over which the pixel portion 502 is formed. Thus, the number of components and the number of terminals can be reduced. When part or the whole of the driver circuit portion 504 is not formed over the substrate over which the pixel portion 502 is formed, part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply other signals. For example, as illustrated in FIG. 48A, the gate driver 504a is electrically connected to wirings for controlling the potentials of the light-emitting elements (hereinafter, such wirings are referred to as ANODE_1 to ANODE_X).

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 based on the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter, such wirings are referred to as data lines DL_1 to DL_Y). Alternatively, the source driver 504b has a function of supplying an initialization signal. Without being limited thereto, the source driver 504b can supply other signals.

The source driver 504b includes a plurality of analog switches or the like, for example. The source driver 504b can output, as the data signals, signals obtained by time-dividing the image signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 48A:
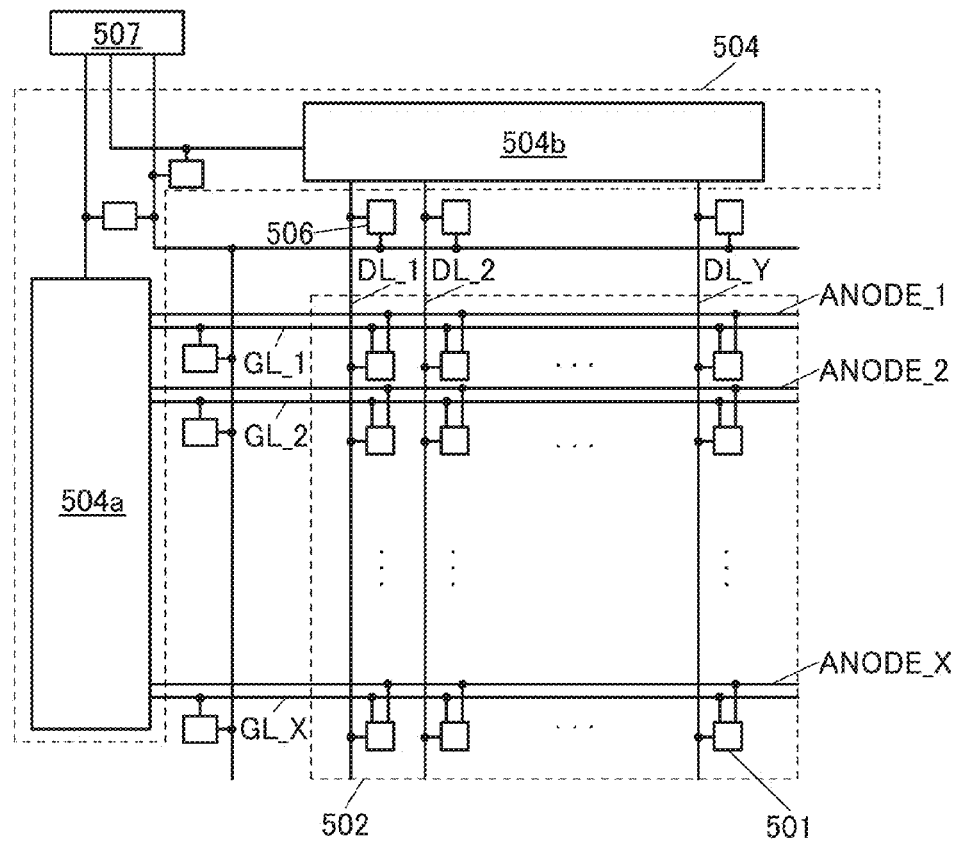
FIGS. 48A and 48B are a block diagram and a circuit diagram illustrating a display device.

The protection circuit 506 illustrated in FIG. 48A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and image signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 48A, the protection circuits 506 are provided in the pixel portion 502 and the driver circuit portion 504, so that the resistance of the display device to overcurrent generated by electrostatic discharge (ESD) or the like can be improved. Note that the structure of the protection circuits 506 is not limited thereto; for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 48A, an example in which the driver circuit portion 504 includes the gate driver 504a and the source driver 504b is illustrated; however, the structure is not limited thereto. For example, only the gate driver 504a may be formed and a separately prepared substrate over which a source driver circuit is formed (e.g., a driver circuit substrate formed with a single crystal semiconductor film or a polycrystalline semiconductor film) may be mounted.

<4-2. Structure Example of Pixel Circuit>

Figure 48B:
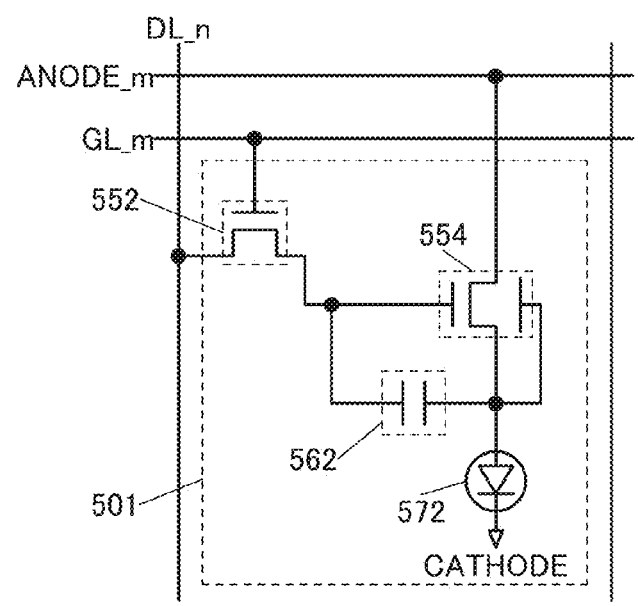

Each of the plurality of pixel circuits 501 in FIG. 48A can have the structure illustrated in FIG. 48B, for example.

The pixel circuit 501 illustrated in FIG. 48B includes transistors 552 and 554, a capacitor 562, and a light-emitting element 572. Any of the transistors described in the above embodiment can be used as one of or both the transistors 552 and 554.

One of a source electrode and a drain electrode of the transistor 552 is electrically connected to a wiring to which a data signal is supplied (a data line DL_n). A gate electrode of the transistor 552 is electrically connected to a wiring to which a gate signal is supplied (a scan line GL_m).

The transistor 552 has a function of controlling whether to write a data signal.

One of a pair of electrodes of the capacitor 562 is electrically connected to the other of the source electrode and the drain electrode of the transistor 552. The other of the pair of electrodes of the capacitor 562 is electrically connected to a second gate electrode (also referred to as a back gate electrode) of the transistor 554. The capacitor 562 functions as a storage capacitor for holding written data.

One of a source electrode and a drain electrode of the transistor 554 is electrically connected to an anode line (ANODE_m).

One of an anode and a cathode of the light-emitting element 572 is electrically connected to the other of the source electrode and the drain electrode of the transistor 554, and the other of the anode and the cathode of the light-emitting element 572 is electrically connected to a cathode line (CATHODE). Note that the other of the pair of electrodes of the capacitor 562 is electrically connected to the one of the anode and the cathode of the light-emitting element 572.

As the light-emitting element 572, for example, an organic EL element can be used. Note that the light-emitting element 572 is not limited to an organic EL element; an inorganic EL element including an inorganic material may be used.

For example, in the display device including the pixel circuit 501 in FIG. 48B, the pixel circuits 501 are sequentially selected row by row by the gate driver 504a illustrated in FIG. 48A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structure including the light-emitting element 572 as a display element of the display device is described in this embodiment, one embodiment of the present invention is not limited to this structure, and any of a variety of elements may be included in the display device. Examples of the element include at least one of the liquid crystal element, an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element using a carbon nanotube, and the like. Other than the above, display media whose contrast, luminance, reflectivity, transmittance, or the like is changed by electrical or magnetic effect may be included. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). An example of a display device including electronic ink or an electrophoretic element is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

A progressive type display, an interlace type display, or the like can be employed as the display type of the display device. Color elements controlled in pixels at the time of color display are not limited to three colors: R, G, and B (R, G, and B correspond to red, green, and blue, respectively). For example, four pixels, an R pixel, a G pixel, a B pixel, and a W (white) pixel may be included. Alternatively, a color component may be composed of two colors among R, G, and B as in PenTile layout. The two colors may differ among color elements. Alternatively, one or more colors of yellow, cyan, magenta, and the like may be added to RGB. Furthermore, the size of a display region may be different depending on the dot of the color element. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. For the coloring layer, red (R), green (G), blue (B), yellow (Y), and the like may be combined as appropriate, for example. With the use of the coloring layer, higher color reproducibility can be obtained than in the case without the coloring layer. In that case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors: R, G, B, Y, and W. By using self-luminous elements, power consumption can be further reduced as compared with the case of using the coloring layer in some cases.

<4-3. Structure Example of Pixel of Display Device>

Figure 49A:
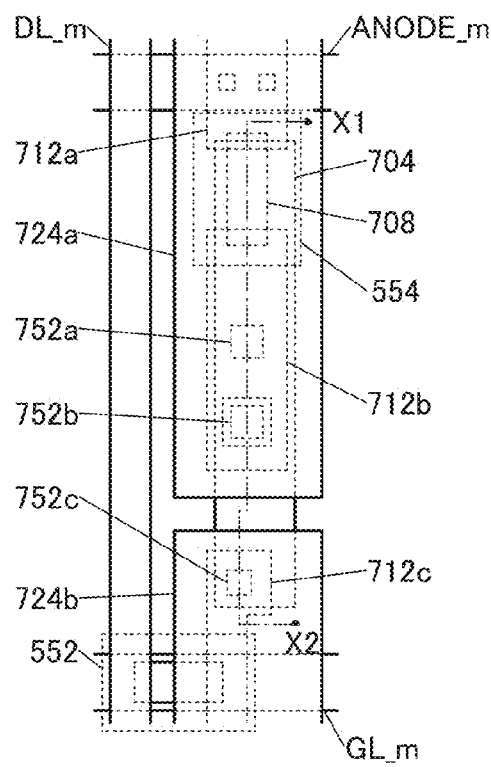
FIGS. 49A and 49B are a top view and a cross-sectional view illustrating a display device.
Figure 49B:
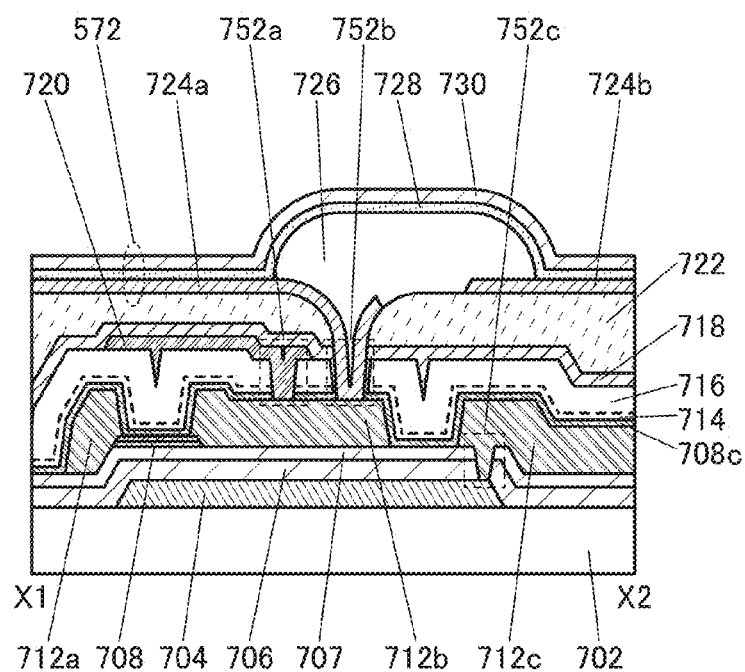

An example of a display device including the pixel circuit illustrated in FIG. 48B is described with reference to FIGS. 49A and 49B. FIG. 49A is a top view of a pixel portion of the display device, and FIG. 49B is a cross-sectional view taken along the dashed-dotted line X1-X2 in FIG. 49A. Note that in FIG. 49A, some components are not illustrated in order to avoid complexity of the drawing.

The display device illustrated in FIGS. 49A and 49B includes a conductive film 704 functioning as a first gate electrode over a substrate 702, insulating films 706 and 707 over the conductive film 704, an oxide semiconductor film 708 over the insulating film 707, conductive films 712a and 712b functioning as a source electrode and a drain electrode over the insulating film 707 and the oxide semiconductor film 708, a conductive film 712c over the insulating film 707, an oxide semiconductor film 708c and insulating films 714 and 716 covering the oxide semiconductor film 708, the conductive films 712a, 712b, and 712c, and the insulating film 707, a conductive film 720 functioning as a second gate electrode over the insulating film 716, an insulating film 718 over the insulating film 716 and the conductive film 720, an insulating film 722 functioning as a planarization insulating film over the insulating film 718, conductive films 724a and 724b functioning as a pixel electrode over the insulating film 722, a structure body 726 having a function of suppressing electrical connection between the conductive films 724a and 724b, an EL layer 728 over the conductive films 724a and 724b and the structure body 726, and a conductive film 730 over the EL layer 728.

The conductive film 712c is electrically connected to the conductive film 704 through an opening 752c provided in the insulating films 706 and 707. The conductive film 720 functioning as a second gate electrode is electrically connected to the conductive film 712b through an opening 752a provided in the oxide semiconductor film 708c and the insulating films 714 and 716. The conductive film 724a is electrically connected to the conductive film 712b through an opening 752b provided in the oxide semiconductor film 708c and the insulating films 714, 716, 718, and 722.

The conductive film 724a functioning as a pixel electrode, the EL layer 728, and the conductive film 730 form the light-emitting element 572. Note that the EL layer 728 can be formed by any of the following methods: a sputtering method, an evaporation method (including a vacuum evaporation method), a printing method (such as relief printing, intaglio printing, gravure printing, planography printing, and stencil printing), an ink-jet method, a coating method, and the like.

When a structure including two transistors and one capacitor as illustrated in FIG. 48B and FIGS. 49A and 49B is used as the structure of a pixel of the display device, the number of wirings can be reduced. For example, the pixel illustrated in FIG. 48B and FIG. 49A includes three wirings, i.e., a gate line, a data line, and an anode line. A pixel with such a structure in the display device can have a high aperture ratio. Moreover, by reducing the number of wirings, a short circuit between adjacent wirings is unlikely to occur, for example. Thus, a display device can be provided with high yield.

The structure described in this embodiment can be used in appropriate combination with the structure described in any of the other embodiments.

Embodiment 5

In this embodiment, a display device including a semiconductor device of one embodiment of the present invention and an electronic device in which the display device is provided with an input device will be described with reference to FIGS. 50A and 50B, FIGS. 51A and 51B, FIG. 52, FIGS. 53A and 53B, FIGS. 54A and 54B, and FIG. 55.

<5-1. Touch Panel>

In this embodiment, a touch panel 2000 including a display device and an input device is described as an example of an electronic device. An example in which a touch sensor is used as an input device is described.

Figure 50A:
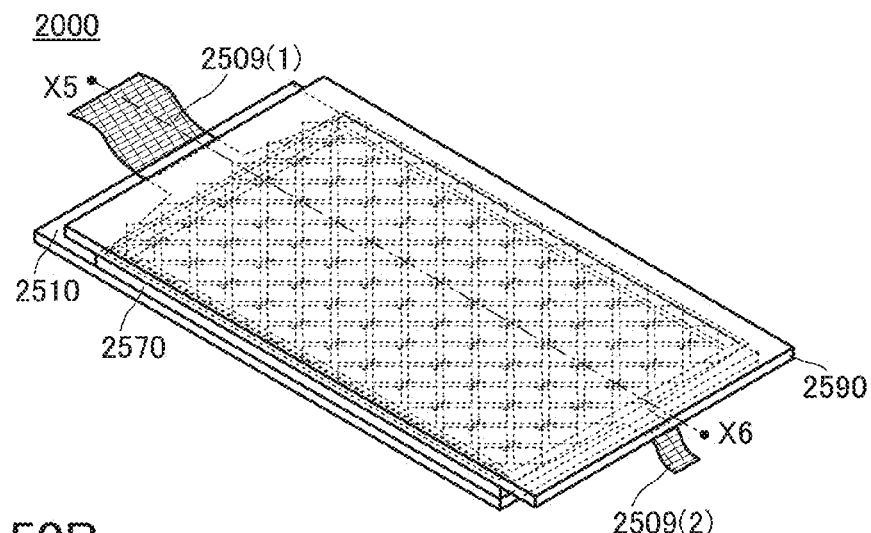
FIGS. 50A and 50B are perspective views illustrating an example of a touch panel.
Figure 50B:
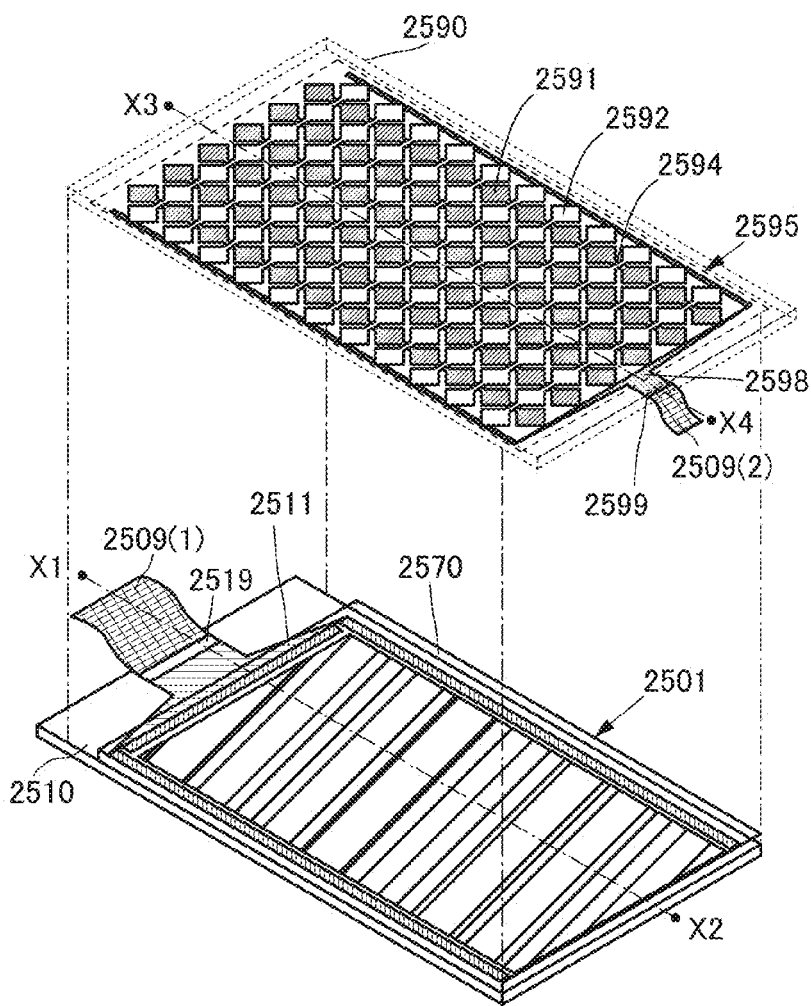

FIGS. 50A and 50B are perspective views of the touch panel 2000. Note that FIGS. 50A and 50B illustrate typical components of the touch panel 2000 for simplicity.

The touch panel 2000 includes a display device 2501 and a touch sensor 2595 (see FIG. 50B). Furthermore, the touch panel 2000 includes a substrate 2510, a substrate 2570, and a substrate 2590. Note that the substrate 2510, the substrate 2570, and the substrate 2590 are each flexible. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 forms a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and part of the plurality of wirings 2598 forms a terminal. The terminal is electrically connected to an FPC 2509(2). Note that in FIG. 50B, electrodes, wirings, and the like of the touch sensor 2595 provided on the back side (the side facing the substrate 2510) of the substrate 2590 are indicated by solid lines for clarity.

As the touch sensor 2595, a capacitive touch sensor can be used, for example. Examples of the capacitive touch sensor include a surface capacitive touch sensor and a projected capacitive touch sensor.

Examples of the projected capacitive touch sensor include a self capacitive touch sensor and a mutual capacitive touch sensor, which differ mainly in the driving method. The use of a mutual capacitive touch sensor is preferable because multiple points can be detected simultaneously.

Note that the touch sensor 2595 illustrated in FIG. 50B is an example of using a projected capacitive touch sensor.

Note that any of a variety of sensors that can sense the approach or contact of an object such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 50A and 50B.

The electrodes 2591 each have a quadrangular shape and are arranged repeatedly in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing unevenness in transmittance. As a result, unevenness in the luminance of light passing through the touch sensor 2595 can be reduced.

Note that the shapes of the electrodes 2591 and the electrodes 2592 are not limited to the above-mentioned shapes and can be any of a variety of shapes. For example, the plurality of electrodes 2591 may be provided so that a space between the electrodes 2591 is reduced as much as possible, and a plurality of electrodes 2592 may be provided with an insulating layer sandwiched between the electrodes 2591 and the electrodes 2592 and may be spaced apart from each other to form a region which does not overlap with the electrodes 2591. In that case, between two adjacent electrodes 2592, it is preferable to provide a dummy electrode which is electrically insulated from these electrodes, whereby the area of a region having a different transmittance can be reduced.

Note that as a material for the conductive films such as the electrodes 2591, the electrodes 2592, and the wirings 2598, that is, wirings and electrodes included in the touch panel, a transparent conductive film including indium oxide, tin oxide, zinc oxide, or the like (e.g., ITO) can be given. For example, a low-resistance material is preferably used as a material that can be used for the wirings and electrodes included in the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh formed of a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes included in the touch panel, a visible light transmittance of higher than or equal to 89% and a sheet resistance of higher than or equal to 40 $\Omega/cm^2$ and lower than or equal to 100 $\Omega/cm^2$ can be achieved. Since the above-described metal nanowire, metal mesh, carbon nanotube, graphene, and the like, which are examples of the material that can be used for the wirings and electrodes included in the touch panel, have high visible light transmittances, they may be used for electrodes (e.g., a pixel electrode or a common electrode) of display elements.

<5-2. Display Device>

Figure 51A:
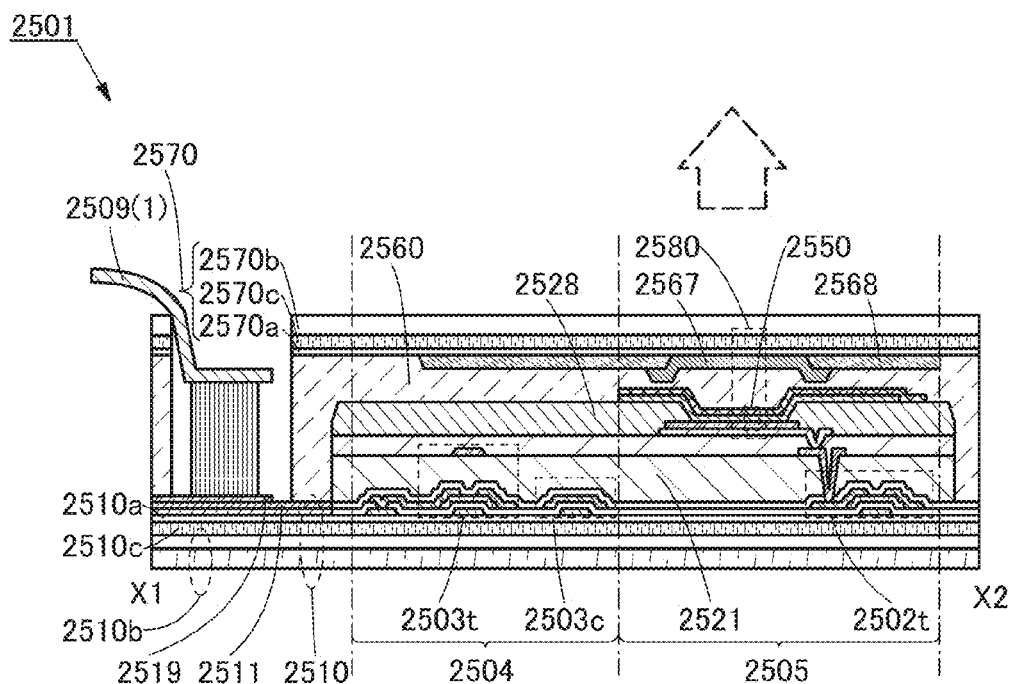
FIGS. 51A and 51B are cross-sectional views each illustrating an example of a display device.
Figure 51B:
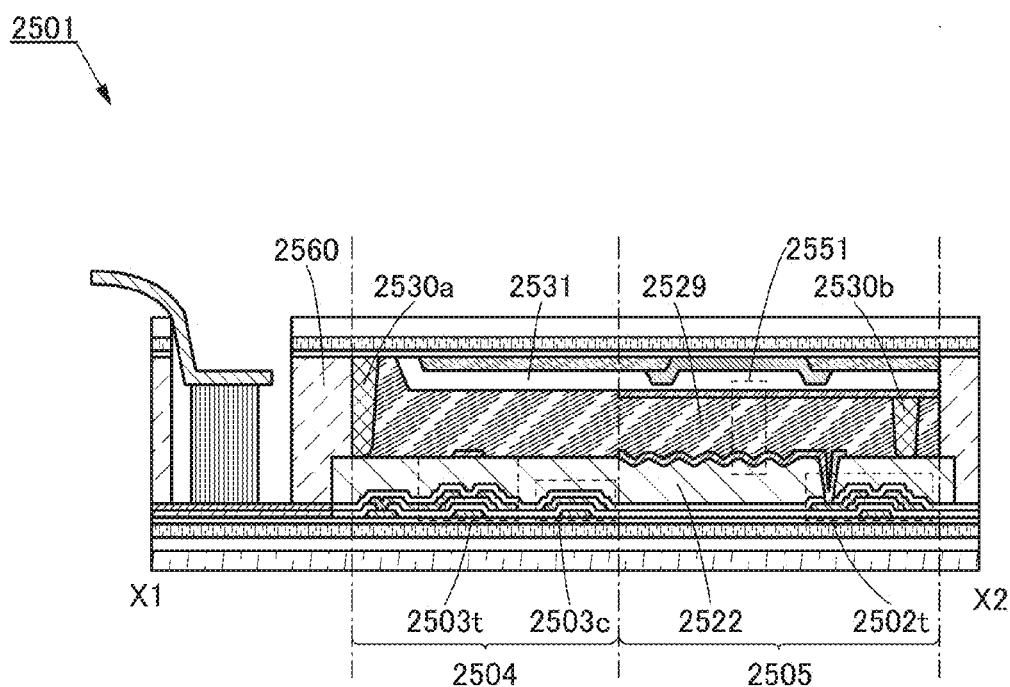

Next, the display device 2501 is described in detail with reference to FIGS. 51A and 51B. FIGS. 51A and 51B each correspond to a cross-sectional view taken along the dashed-dotted line X1-X2 in FIG. 50B.

The display device 2501 includes a plurality of pixels arranged in a matrix. Each of the pixels includes a display element and a pixel circuit for driving the display element.

<<Structure Including EL Element as Display Element>>

First, a structure including an EL element as a display element is described below with reference to FIG. 51A. In the following description, an example of using an EL element that emits white light is described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g/(m²·day), preferably lower than or equal to $1\times10^{-6}$ g/(m²·day) can be favorably used. Note that materials whose thermal expansion coefficients are substantially equal to each other are preferably used for the substrate 2510 and the substrate 2570. For example, the coefficient of linear expansion of the material is preferably lower than or equal to $1\times10^{-3}$/K, more preferably lower than or equal to $5\times10^{-5}$/K, more preferably lower than or equal to $1\times10^{-5}$/K.

Note that the substrate 2510 is a stack including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stack including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layers 2510c and 2570c, for example, polyester, polyolefin, polyamide (e.g., nylon or aramid), polyimide, polycarbonate, acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 51A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 2501 illustrated in FIG. 51A includes a pixel 2505. The pixel 2505 includes a light-emitting module 2580, the EL element 2550, and a transistor 2502*t* that can supply power to the EL element 2550. Note that the transistor 2502*t* functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 51A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an ink-jet method, an etching method using a photolithography technique, or the like.

An insulating layer 2521 is provided in the display device 2501. The insulating layer 2521 covers the transistor 2502*t* and the like. The insulating layer 2521 has a function of covering the roughness caused by the pixel circuit to provide a flat surface. The insulating layer 2521 may also function as a layer for preventing diffusion of impurities. This can prevent a reduction in the reliability of the transistor 2502*t* and the like due to diffusion of impurities.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be provided over the partition 2528.

A gate driver 2504 includes a transistor 2503*t* and a capacitor 2503*c*. Note that the driver circuit can be formed in the same process and over the same substrate as those of the pixel circuits.

Over the substrate 2510, the wirings 2511 through which a signal can be supplied are provided. Over the wirings 2511, the terminal 2519 is provided. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one of or both the transistors 2502*t* and 2503*t*. The transistors used in this embodiment each include an oxide semiconductor film which is highly purified and which has high crystallinity. In such transistors, the current in an off state (off-state current) can be made low. Accordingly, an electric signal such as an image signal can be held for a longer period, and a writing interval can be set longer in an on state. Accordingly, frequency of refresh operation can be reduced, which leads to an effect of suppressing power consumption. Note that the details of the refresh operation are described later.

In addition, the transistors used in this embodiment can each have a relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, in which case the number of components of the semiconductor device can be reduced. In addition, by using a transistor which can operate at high speed in a pixel circuit, a high-quality image can be provided.

<<Structure Including Liquid Crystal Element as Display Element>>

Next, a structure including a liquid crystal element as a display element is described below with reference to FIG. 51B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 51B has the same structure as the display device 2501 illustrated in FIG. 51A except the following points.

The pixel 2505 in the display device 2501 illustrated in FIG. 51B includes a liquid crystal element 2551 and the transistor 2502*t* that can supply power to the liquid crystal element 2551.

The liquid crystal element 2551 includes a lower electrode (also referred to as a pixel electrode), an upper electrode, and a liquid crystal layer 2529 between the lower electrode and the upper electrode. By application of voltage between the lower electrode and the upper electrode, the orientation state of the liquid crystal layer 2529 in the liquid crystal element 2551 can be changed. Furthermore, in the liquid crystal layer 2529, a spacer 2530*a* and a spacer 2530*b* are provided. Although not illustrated in FIG. 51B, an alignment film may be provided on each of the upper electrode and the lower electrode on the side in contact with the liquid crystal layer 2529.

For the liquid crystal layer 2529, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where liquid crystal exhibiting a blue phase is used, an alignment film is not necessarily provided, so that rubbing treatment is also unnecessary. Accordingly, electrostatic discharge damage caused by the rubbing treatment can be prevented, and defects and damage of the liquid crystal display device in the manufacturing process can be reduced.

The spacers 2530*a* and 2530*b* are formed by selectively etching an insulating film. The spacers 2530*a* and 2530*b* are provided in order to control the distance between the substrate 2510 and the substrate 2570 (the cell gap). Note that the spacers 2530*a* and 2530*b* may have different sizes from each other and preferably have a columnar or spherical shape. Although the spacers 2530*a* and 2530*b* are provided on the substrate 2570 side in FIG. 51B, one embodiment of the present invention is not limited thereto, and they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, a resin film may be used, for example. The lower electrode of the liquid crystal element 2551 has a function of a reflective electrode. The display device 2501 illustrated in FIG. 51B is a reflective liquid crystal display device which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 51B includes an insulating layer 2522. The insulating layer 2522 covers the transistor 2502*t* and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<5-3. Touch Sensor>

Figure 52:
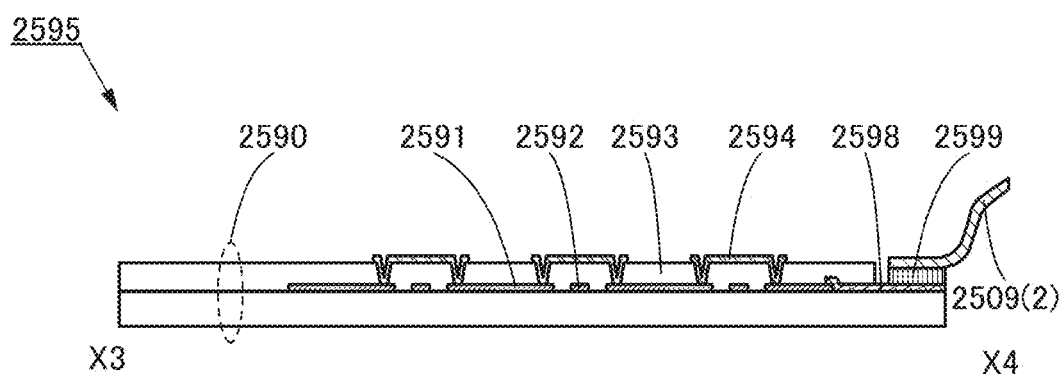
FIG. 52 is a cross-sectional view illustrating an example of a touch sensor.

Next, the touch sensor 2595 is described in detail with reference to FIG. 52. FIG. 52 corresponds to a cross-sectional view taken along the dashed-dotted line X3-X4 in FIG. 50B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are each formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

For example, the electrodes 2591 and the electrodes 2592 can be formed by depositing a light-transmitting conductive material on the substrate 2590 by a sputtering method and then removing an unnecessary portion using any of various pattern formation techniques such as photolithography.

Examples of a material for the insulating layer 2593 include a resin such as acrylic or epoxy resin, a resin having a siloxane bond, and an inorganic insulating material such as silicon oxide, silicon oxynitride, or aluminum oxide.

Furthermore, openings reaching the electrodes 2591 are formed in the insulating layer 2593, and the wiring 2594 electrically connects the adjacent electrodes 2591. A light-transmitting conductive material can be favorably used for the wiring 2594 because the aperture ratio of the touch panel can be increased. Moreover, a material having higher conductivity than the electrodes 2591 and 2592 can be favorably used for the wiring 2594 because electric resistance can be reduced.

The electrodes 2592 extend in one direction, and the plurality of electrodes 2592 are provided in the form of stripes. The wiring 2594 intersects with the electrode 2592.

One electrode 2592 is provided between the pair of electrodes 2591. The wiring 2594 electrically connects the pair of electrodes 2591.

Note that the plurality of electrodes 2591 are not necessarily arranged in the direction orthogonal to one electrode 2592 and may be arranged to intersect with one electrode 2592 at an angle of greater than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer covering the insulating layer 2593 and the wiring 2594 may be provided to protect the touch sensor 2595.

Furthermore, a connection layer 2599 electrically connects the wiring 2598 to the FPC 2509(2).

As the connection layer 2599, an anisotropic conductive film (ACF), an anisotropic conductive paste (ACP), or the like can be used.

<5-4. Touch Panel>

Figure 53A:
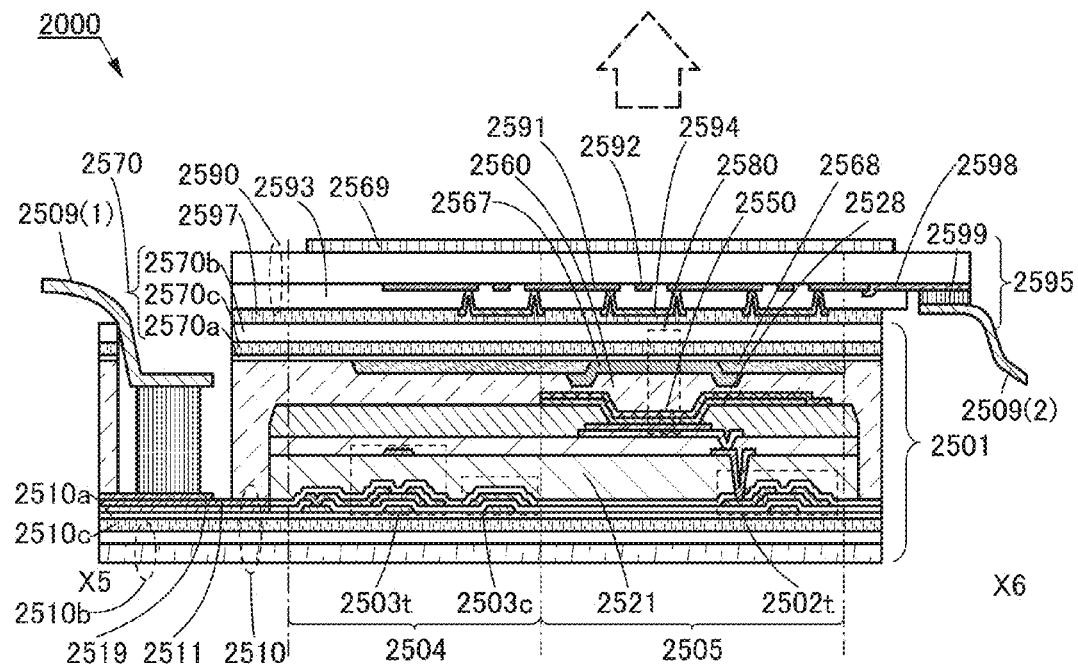
FIGS. 53A and 53B are cross-sectional views each illustrating an example of a touch panel.

Next, the touch panel 2000 is described in detail with reference to FIG. 53A. FIG. 53A corresponds to a cross-sectional view taken along the dashed-dotted line X5-X6 in FIG. 50A.

In the touch panel 2000 illustrated in FIG. 53A, the display device 2501 illustrated in FIG. 50A and the touch sensor 2595 illustrated in FIG. 52 are attached to each other.

The touch panel 2000 illustrated in FIG. 53A includes an adhesive layer 2597 and an anti-reflective layer 2569 in addition to the components illustrated in FIG. 51A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or a ultraviolet curable resin can be used for the adhesive layer 2597. For example, an acrylic-based resin, an urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 53A is described with reference to FIG. 53B.

Figure 53B:
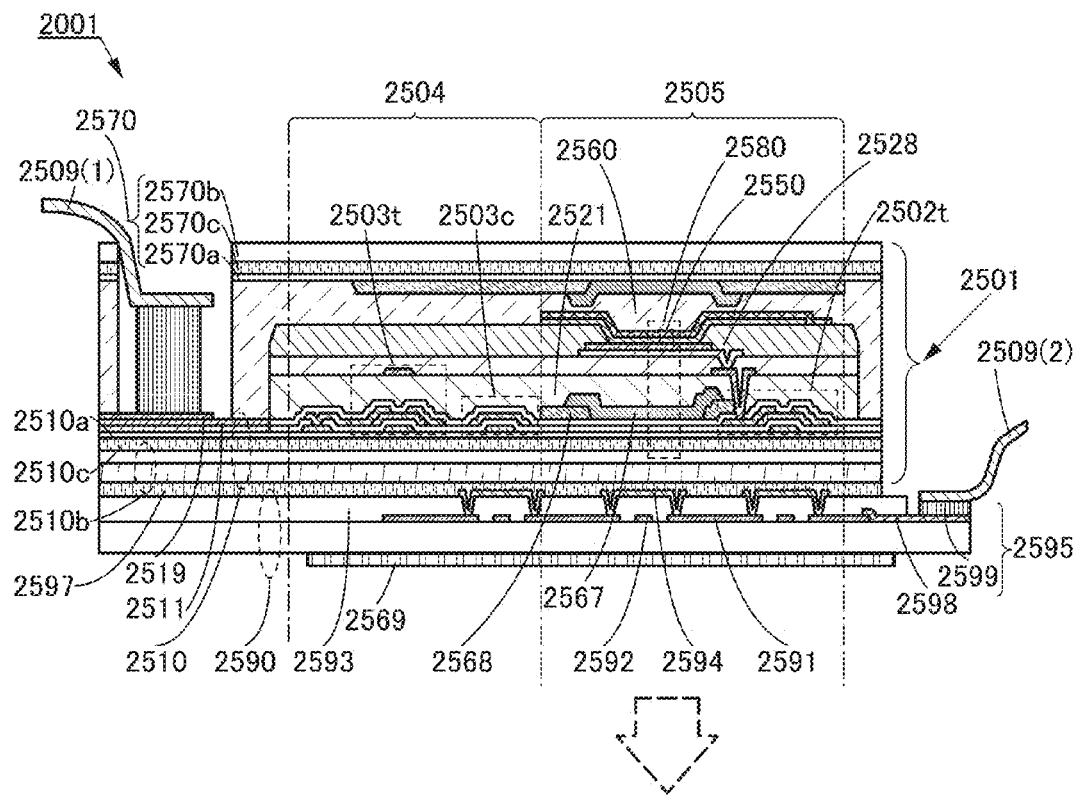

FIG. 53B is a cross-sectional view of a touch panel 2001. The touch panel 2001 illustrated in FIG. 53B differs from the touch panel 2000 illustrated in FIG. 53A in the position of the touch sensor 2595 relative to the display device 2501.

Different structures are described in detail below, and the above description of the touch panel 2000 can be referred to for the other similar structures.

The coloring layer 2567 is positioned below the EL element 2550. The EL element 2550 illustrated in FIG. 53B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 53B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 53A or 53B, light may be emitted from the light-emitting element to one of upper and lower sides, or both, of the substrate 2510.

<5-5. Driving Method of Touch Panel>

Then, an example of a driving method of the touch panel is described with reference to FIGS. 54A and 54B.

Figure 54A:
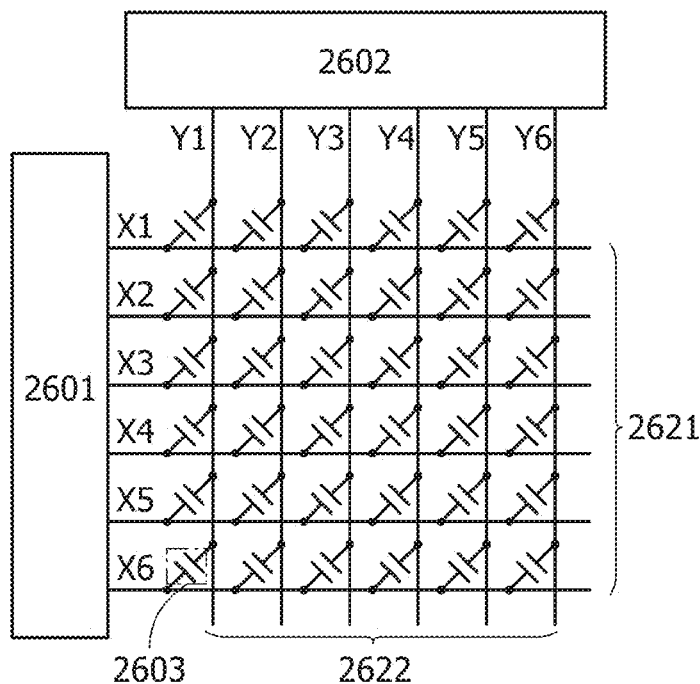
FIGS. 54A and 54B are a block diagram and a timing chart of a touch sensor.

FIG. 54A is a block diagram illustrating the structure of a mutual capacitive touch sensor. FIG. 54A illustrates a pulse voltage output circuit 2601 and a current detecting circuit 2602. Note that in FIG. 54A, six wirings X1 to X6 represent electrodes 2621 to which a pulse voltage is applied, and six wirings Y1 to Y6 represent electrodes 2622 that sense changes in current. FIG. 54A also illustrates a capacitor 2603 that is formed in a region where the electrodes 2621 and 2622 overlap with each other. Note that the functions of the electrodes 2621 and 2622 can be exchanged with each other.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitors 2603. When the electric field between the electrodes is shielded, for example, a change occurs in the mutual capacitance of the capacitor 2603. The approach or contact of an object can be detected by utilizing this change.

The current detecting circuit 2602 is a circuit for detecting changes in current flowing through the wirings Y1 to Y6 that are caused by the change in mutual capacitance of the capacitors 2603. No change in current value is detected in the wirings Y1 to Y6 when there is no approach or contact of an object, whereas a decrease in current value is detected when mutual capacitance is decreased owing to the approach or contact of an object. Note that an integrator circuit or the like is used to detect current values.

Figure 54B:
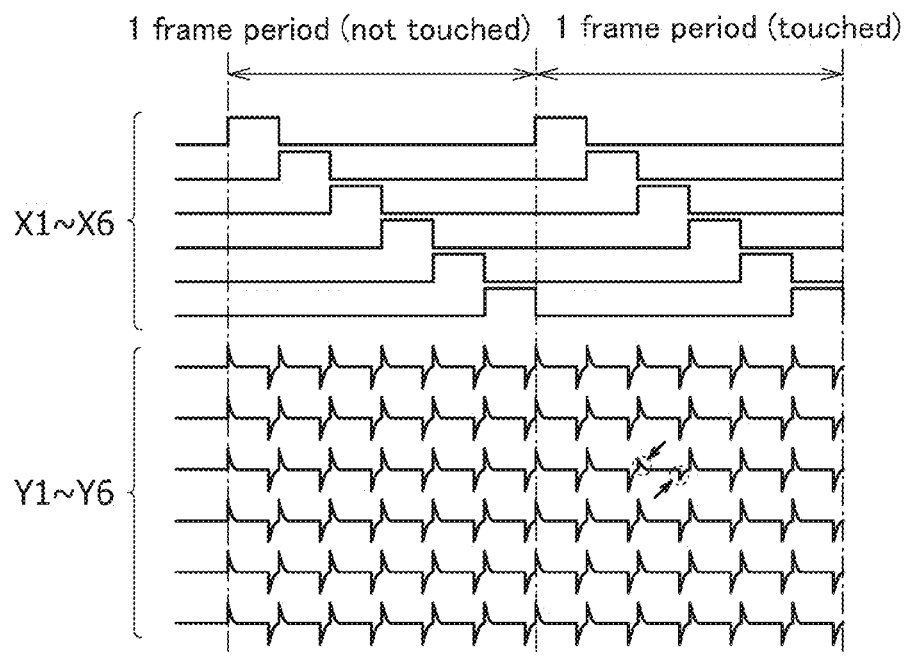

FIG. 54B is a timing chart showing input and output waveforms in the mutual capacitive touch sensor illustrated in FIG. 54A. In FIG. 54B, detection of an object is performed in all the rows and columns in one frame period. FIG. 54B shows a period during which an object is not detected (not touched) and a period during which an object is detected (touched). Detected current values of the wirings Y1 to Y6 are shown as waveforms of voltage values.

A pulse voltage is sequentially applied to the wirings X1 to X6, and waveforms of the wirings Y1 to Y6 change in accordance with the pulse voltage. When there is no approach or contact of an object, the waveforms of the wirings Y1 to Y6 change in accordance with changes in the voltages of the wirings X1 to X6. The current value is decreased at the point of approach or contact of an object; accordingly; the waveform of the voltage value changes.

By detecting a change in mutual capacitance in this manner, the approach or contact of an object can be sensed.

<5-6. Sensor Circuit>

Figure 55:
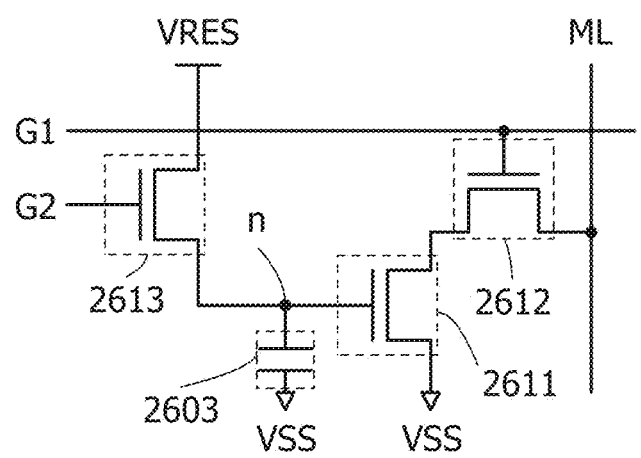
FIG. 55 is a circuit diagram of a touch sensor.

Although FIG. 54A illustrates a passive matrix touch sensor in which only the capacitor 2603 is provided at the intersection of wirings as a touch sensor, an active matrix touch sensor including a transistor and a capacitor may also be used. FIG. 55 illustrates an example of a sensor circuit included in an active matrix touch sensor.

The sensor circuit in FIG. 55 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 55 is described. First, a potential for turning on the transistor 2613 is supplied as the signal G2, and a potential corresponding to the voltage VRES is thus applied to a node n connected to the gate of the transistor 2611. Then, a potential for turning off the transistor 2613 is applied as the signal G2, whereby the potential of the node n is held.

Then, mutual capacitance of the capacitor 2603 changes owing to the approach or contact of an object such as a finger; accordingly, the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By detecting this current, the approach or contact of an object can be detected.

As each of the transistors 2611, 2612, and 2613, any of the transistors described in the above embodiment can be used. In particular, it is preferable to use any of the transistors described in the above embodiment as the transistor 2613 because the potential of the node n can be held for a long time and the frequency of operation of resupplying VRES to the node n (refresh operation) can be reduced.

The structure described in this embodiment can be used in appropriate combination with the structure described in any of the other embodiments.

Embodiment 6

In this embodiment, a display device including a semiconductor device of one embodiment of the present invention and a method for driving the display device will be described with reference to FIGS. 56A and 56B, FIGS. 57A and 57B, FIGS. 58A to 58E, and FIGS. 59A to 59E.

Note that the display device of one embodiment of the present invention may include an information processing portion, an arithmetic portion, a memory portion, a display portion, an input portion, and the like.

In the case where the display device of one embodiment of the present invention continuously displays the same image (still image), power consumption can be reduced by reducing the frequency of writing signals for the same image (also referred to as "refresh"). Note that the frequency of refresh operations is referred to as a refresh rate (also referred to as scan frequency or vertical synchronization frequency). A display device in which the refresh rate is reduced and which causes little eye fatigue is described below.

The eye strain is divided into two categories: nerve strain and muscle strain. The nervous fatigue is caused by prolonged looking at light emitted from a display device or blinking images. This is because brightness stimulates and fatigues the retina and nerve of the eye and the brain. The muscle strain is caused by overuse of a ciliary muscle which works for adjusting the focus.

Figure 56A:
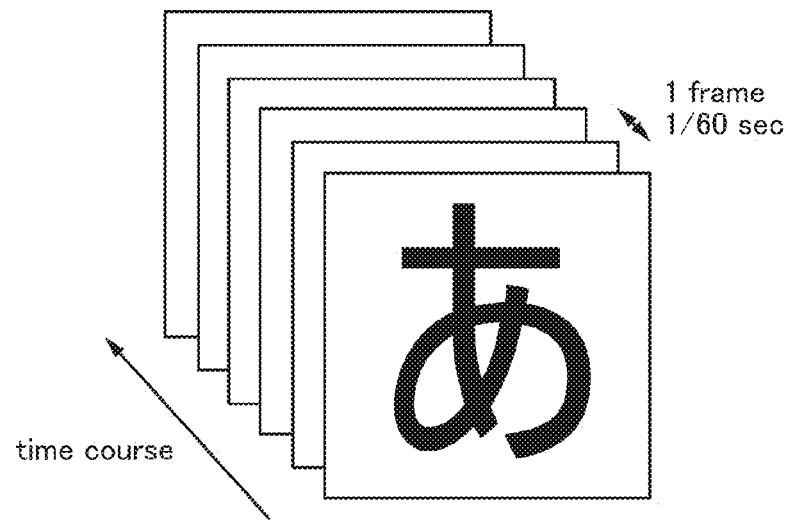
FIGS. 56A and 56B illustrate display of an image in a display device of one embodiment of the present invention.

FIG. 56A is a schematic view illustrating display in a conventional display device. As illustrated in FIG. 56A, for display in the conventional display device, image rewriting is performed 60 times every second. Prolonged looking at such a screen might stimulate the retina, the optic nerves, and the brain of a user and lead to eye strain.

In the display device of one embodiment of the present invention, a transistor including an oxide semiconductor, for example, a transistor including a CAAC-OS, is used in a pixel portion. The off-state current of the transistor is extremely low. Thus, the luminance of the display device can be maintained even when the refresh rate of the display device is lowered.

Figure 56B:
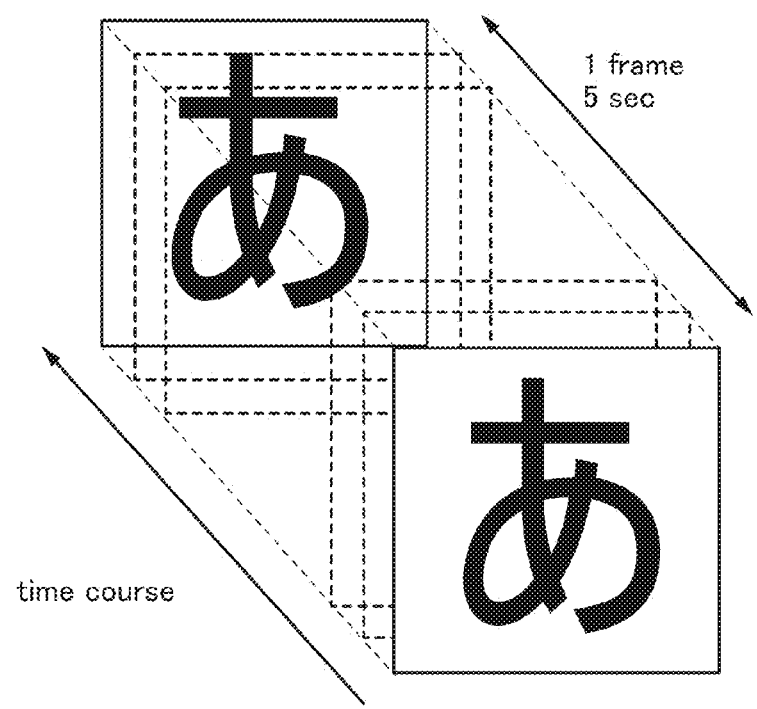

Thus, for example, the number of times of image rewriting can be reduced to 5 times per second as illustrated in FIG. 56B. This enables the user to see the same image as long as possible, and flicker on the screen perceived by the user is reduced. Consequently, a stimulus to the retina or the nerve of an eye or the brain of the user is relieved, resulting in less nervous fatigue.

Figure 57A:
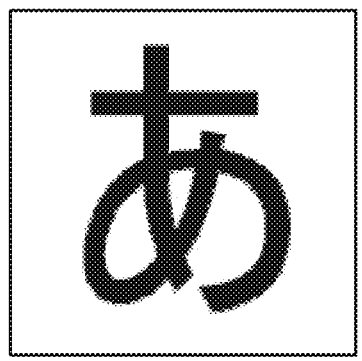
FIGS. 57A and 57B illustrate display of an image in a display device of one embodiment of the present invention.

In the case where the size of one pixel is large (e.g., the resolution is lower than 150 ppi), a character displayed in the display device is blurred as illustrated in FIG. 57A. When a user keeps looking at a blurred character displayed in the display device for a long time, it continues to be difficult to focus the eye on the character even though the ciliary muscle constantly moves in order to focus the eye, which might put strain on the eye.

Figure 57B:
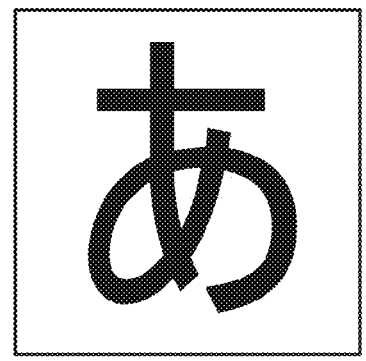

In contrast, as illustrated in FIG. 57B, the display device of one embodiment of the present invention is capable of high-resolution display because the size of each pixel is small and the pixel density is high; thus, precise and smooth display can be achieved. The precise and smooth display enables ciliary muscles to adjust the focus more easily, and reduces muscle fatigue of a user. When the resolution of the display device is higher than or equal to 150 ppi, preferably higher than or equal to 200 ppi, more preferably higher than or equal to 300 ppi, the user's muscle fatigue can be effectively reduced.

Methods for quantifying eye fatigue have been studied. For example, critical flicker (fusion) frequency (CFF) is known as an indicator for evaluating nervous fatigue. Furthermore, focus adjustment time, near point distance, and the like are known as indicators for evaluating muscle fatigue.

Other methods for evaluating eye fatigue include electroencephalography, thermography, counting the number of times of blinking, measuring the amount of tears, measuring the speed of contractile response of the pupil, and questionnaires for surveying subjective symptoms.

The method for driving the display device of one embodiment of the present invention can be evaluated by any of a variety of methods described above, for example.

<6. Driving Method of Display Device>

A method for driving the display device of one embodiment of the present invention is described with reference to FIGS. 58A to 58E.

<<Display Example of Image Data>>

An example of displaying two images including different image data by transferring them is described below.

Figure 58A:
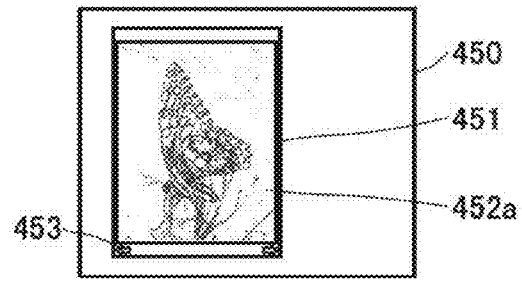
FIGS. 58A to 58E illustrate an example of a method for displaying an image in a display device of one embodiment.

FIG. 58A illustrates an example in which a window 451 and a first image 452a which is a still image displayed in the window 451 are displayed in a display portion 450.

At this time, display is preferably performed at the first refresh rate. Note that the first refresh rate can be higher than or equal to $1.16 \times 10^{-5}$ Hz (about once per day) and lower than or equal to 1 Hz, higher than or equal to $2.78 \times 10^{-4}$ Hz (about once per hour) and lower than or equal to 0.5 Hz, or higher than or equal to $1.67 \times 10^{-2}$ Hz (about once per minute) and lower than or equal to 0.1 Hz.

When frequency of rewriting an image is reduced by setting the first refresh rate to an extremely small value, display substantially without flicker can be achieved, and eye fatigue of a user can be more effectively reduced.

The window 451 is displayed by, for example, executing application software for image display and includes a display region where an image is displayed.

In a lower part of the window 451, a button 453 for switching a displayed image data to a different image data is displayed. When a user performs operation to select the button 453, an instruction of transferring an image can be supplied to an information processing portion of the display device.

Note that the operation method performed by the user may be set in accordance with an input unit. For example, in the case where a touch panel provided to overlap with the display portion 450 is used as the input unit, it is possible to perform operation of touching the button 453 with a finger, a stylus, or the like or input operation by a gesture by which an image is made to slide. In the case where the input operation is performed with gesture or sound, the button 453 is not necessarily displayed.

Figure 58B:
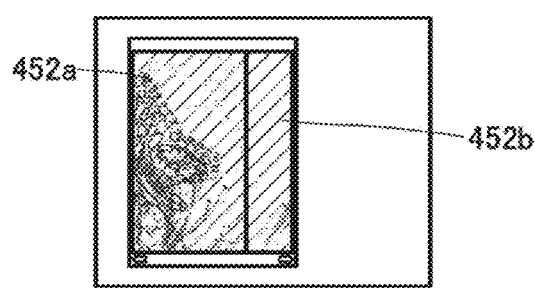

When the information processing portion of the display device receives the instruction of transferring an image, transfer of the image displayed in the window 451 starts (see FIG. 58B).

Note that in the case where display is performed at the first refresh rate in the state of FIG. 58A, the refresh rate is preferably changed to the second refresh rate before transfer of the image starts. The second refresh rate is a value necessary for displaying a moving image. For example, the second refresh rate can be higher than or equal to 30 Hz and lower than or equal to 960 Hz, preferably higher than or equal to 60 Hz and lower than or equal to 960 Hz, more preferably higher than or equal to 75 Hz and lower than or equal to 960 Hz, more preferably higher than or equal to 120 Hz and lower than or equal to 960 Hz, more preferably higher than or equal to 240 Hz and lower than or equal to 960 Hz.

When the second refresh rate is set to a value higher than the first refresh rate, a moving image can be displayed further smoothly and naturally. In addition, flicker which accompanies rewriting of data is less likely to be perceived by a user, whereby eye fatigue of a user can be reduced.

At this time, an image in which the first image 452a and a second image 452b to be displayed next are combined is displayed in the window 451. The combined image is transferred unidirectionally (leftward in this case), and part of the first image 452a and part of the second image 452b are displayed in the window 451.

When the combined image is transferred, the luminance of the image displayed in the window 451 is gradually lowered from the initial luminance at the time of the state in FIG. 58A.

Figure 58C:
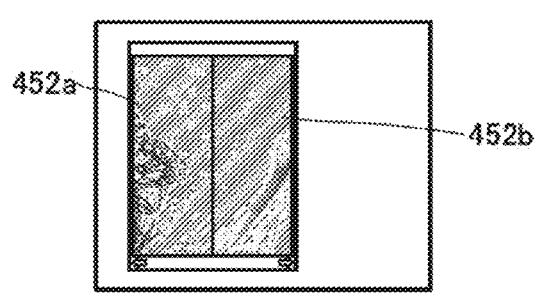

FIG. 58C illustrates a state where the image displayed in the window 451 reaches a position of the predetermined coordinates. Thus, the luminance of the image displayed in the window 451 at this time is the lowest.

Note that the predetermined coordinates in FIG. 58C are set so that half of the first image 452a and half of the second image 452b are displayed; however, the coordinates are not limited to the above, and it is preferable that the coordinates be set freely by a user.

For example, the predetermined coordinates may be set so that the ratio of the distance from the initial coordinates of the image to the distance between the initial coordinates and the final coordinates is higher than 0 and lower than 1.

In addition, it is also preferable that the luminance when the image reaches the position of the predetermined coordinates be set freely by a user. For example, the ratio of the luminance when the image reaches the position of the predetermined coordinates to the initial luminance may be higher than or equal to 0 and lower than 1, preferably higher than or equal to 0 and lower than or equal to 0.8, more preferably higher than or equal to 0 and lower than or equal to 0.5.

Figure 58D:
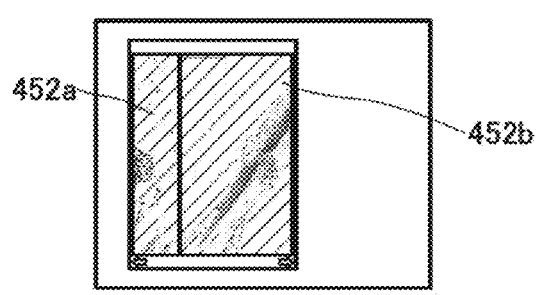

Next, in the window 451, the combined image is transferred with the luminance increasing gradually (FIG. 58D)

Figure 58E:
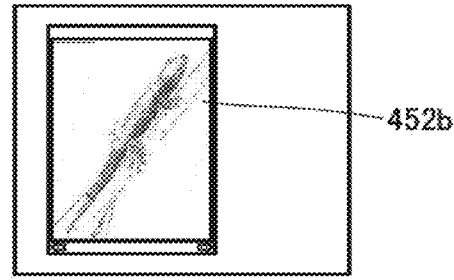

FIG. 58E illustrates a state where the combined image reaches the position of the final coordinates. In the window 451, only the second image 452b is displayed with luminance equal to the initial luminance.

Note that after the transfer of the image is completed, the refresh rate is preferably changed from the second refresh rate to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

<<Display Example of Document Information>>

Next, an example in which document information whose dimension is larger than a display window is displayed by being scrolled is described below.

Figure 59A:
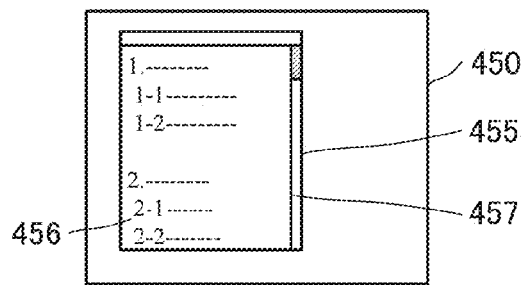
FIGS. 59A to 59E illustrate an example of a method for displaying an image in a display device of one embodiment.

FIG. 59A illustrates an example in which a window 455 and part of document information 456 which is a still image displayed in the window 455 are displayed in the display portion 450.

At this time, display is preferably performed at the first refresh rate.

The window 455 is displayed by, for example, executing application software for document display, application software for document preparation, or the like and includes a display region where document information is displayed.

The dimension of an image of the document information 456 is larger than the display region of the window 455 in the longitudinal direction. That is, part of the document information 456 is displayed in the window 455. Furthermore, as illustrated in FIG. 59A, the window 455 may be provided with a scroll bar 457 which indicates which part of the document information 456 is displayed.

Figure 59B:
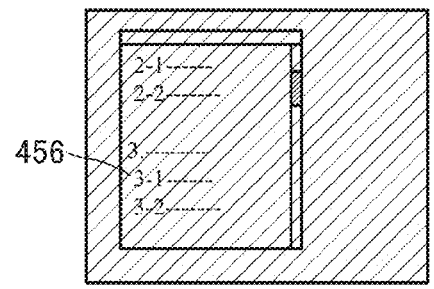

When an instruction of transferring an image (here, also referred to as a scroll instruction) is supplied to the display device from an input portion, transfer of the document information 456 starts (FIG. 59B). In addition, the luminance of the displayed image is gradually lowered.

Note that in the case where display is performed at the first refresh rate in the state of FIG. 59A, the refresh rate is preferably changed to the second refresh rate before transfer of the document information 456 starts.

Here, not only the luminance of the image displayed in the window 455 but also the luminance of the whole image displayed in the display portion 450 is lowered.

Figure 59C:
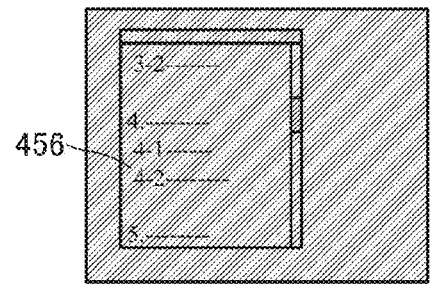

FIG. 59C illustrates a state where the document information 456 reaches a position of the predetermined coordinates. At this time, the luminance of the whole image displayed in the display portion 450 is the lowest.

Figure 59D:
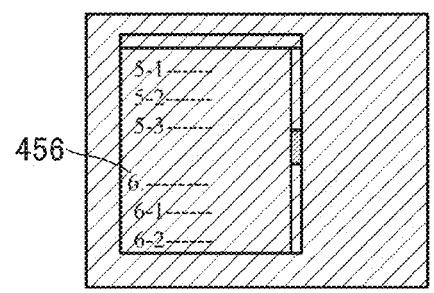

Then, the document information 456 is displayed in the window 455 while being transferred (FIG. 59D). At this time, the luminance of the whole image displayed in the display portion 450 is gradually increased.

Figure 59E:
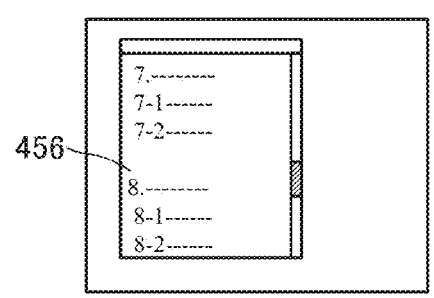

FIG. 59E illustrates a state where the document information 456 reaches a position of the final coordinates. In the window 455, a region of the document information 456, which is different from the region displayed in an initial state, is displayed with luminance equal to the initial luminance.

Note that after transfer of the document information 456 is completed, the refresh rate is preferably changed to the first refresh rate.

Since the luminance of the image is lowered in such a display mode, even when a user follows the motion of the image with his/her eyes, the user is less likely to suffer from eye fatigue. Thus, by such a driving method, eye-friendly display can be achieved.

In particular, display of document information or the like, which has a high contrast, gives a user eye fatigue significantly; thus, it is preferable to apply the above driving method to the display of document information.

This embodiment can be combined with any of the other embodiments disclosed in this specification as appropriate.

Embodiment 7

In this embodiment, a display module, electronic devices, and a display device which include a semiconductor device of one embodiment of the present invention will be described with reference to FIG. 60, FIGS. 61A to 61G, and FIGS. 62A and 62B.

<7-1. Display Module>

Figure 60:
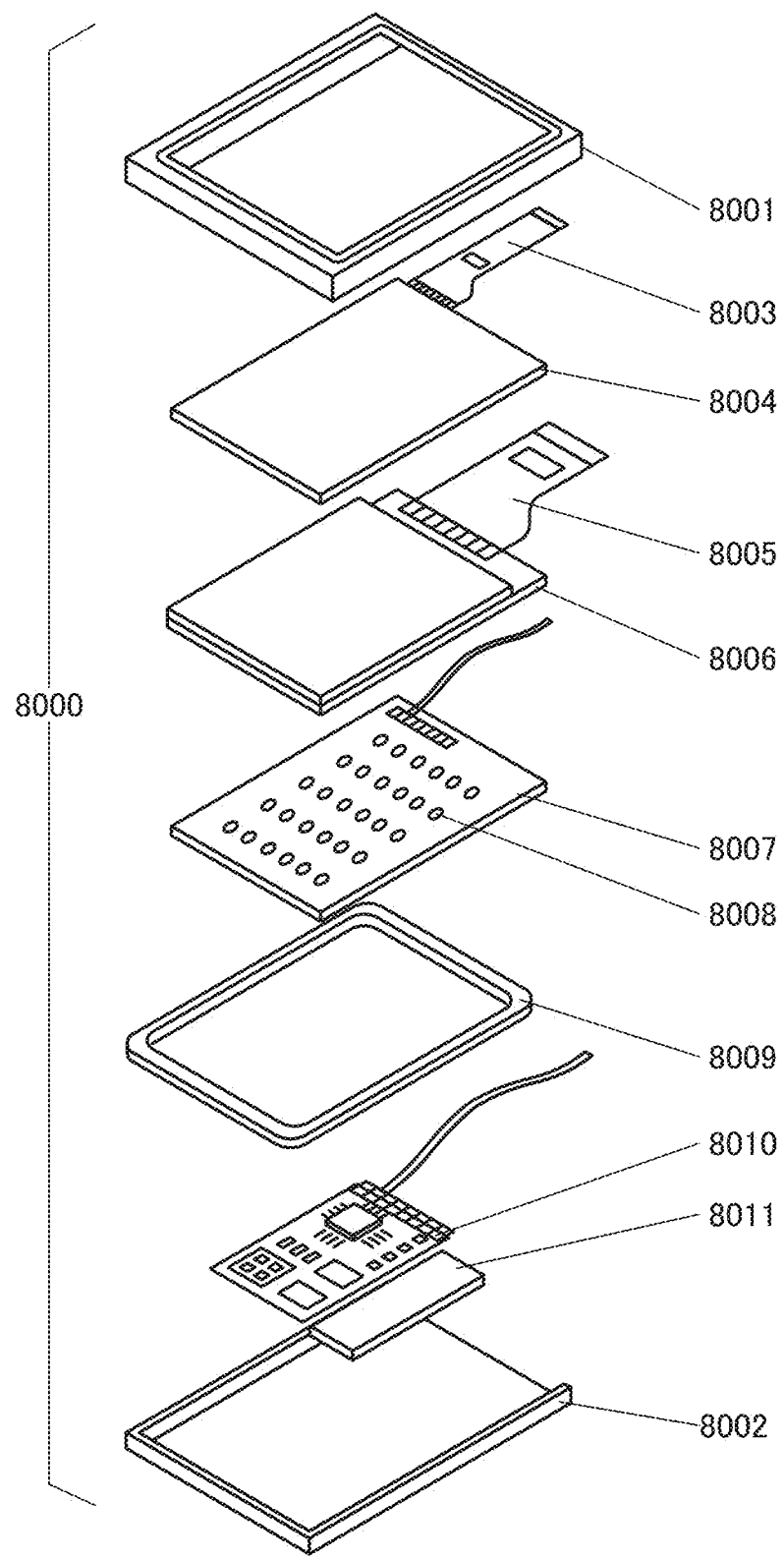
FIG. 60 illustrates a display module.

In a display module 8000 illustrated in FIG. 60, a touch sensor 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch sensor 8004 and the display panel 8006.

The touch sensor 8004 can be a resistive touch sensor or a capacitive touch sensor and may be formed to overlap with the display panel 8006. A counter substrate (sealing substrate) of the display panel 8006 can have a touch sensor function. A photosensor may be provided in each pixel of the display panel 8006 so that an optical touch sensor can be obtained.

The backlight 8007 includes a light source 8008. Note that although a structure in which the light source 8008 is provided over the backlight 8007 is illustrated in FIG. 60, one embodiment of the present invention is not limited to this structure. For example, a structure in which the light source 8008 is provided at an end portion of the backlight 8007 and a light diffusion plate is further provided may be employed. Note that the backlight 8007 needs not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 can also function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a component such as a polarizing plate, a retardation plate, or a prism sheet.

<7-2. Electronic Device>

FIGS. 61A to 61G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 61A to 61G can have a variety of functions, for example, a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a recording medium and displaying the program or data on the display portion, and the like. Note that the electronic devices illustrated in FIGS. 61A to 61G can have a variety of functions, not limited to the above functions. Although not illustrated in FIGS. 61A to 61G, the electronic device may include a plurality of display portions. Furthermore, the electronic device may be provided with a camera and the like and have a function of shooting a still image, a function of shooting a moving image, a function of storing a shot image in a recording medium (an external recording medium or a recording medium incorporated in the camera), a function of displaying a shot image on the display portion, or the like.

The electronic devices illustrated in FIGS. 61A to 61G are described in detail below.

Figure 61A:
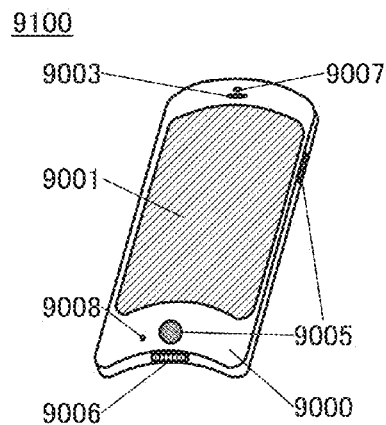
FIGS. 61A to 61G each illustrate an electronic device.

FIG. 61A is a perspective view illustrating a portable information terminal 9100. The display portion 9001 of the portable information terminal 9100 is flexible. Therefore, the display portion 9001 can be incorporated along a bent surface of the bent housing 9000. Furthermore, the display portion 9001 includes a touch sensor, and operation can be performed by touching a screen with a finger, a stylus, or the like. For example, by touching an icon displayed on the display portion 9001, application can be started.

Figure 61B:
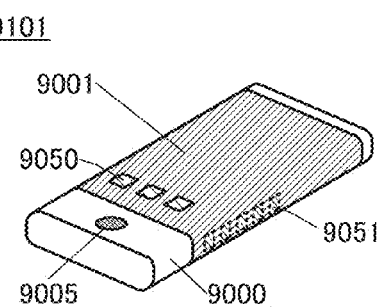

FIG. 61B is a perspective view illustrating a portable information terminal 9101. The portable information terminal 9101 functions as, for example, one or more of a telephone set, a notebook, and an information browsing system. Specifically, the portable information terminal 9101 can be used as a smartphone. Note that the speaker 9003, the connection terminal 9006, the sensor 9007, and the like, which are not illustrated in FIG. 61B, can be positioned in the portable information terminal 9101 as in the portable information terminal 9100 illustrated in FIG. 61A. The portable information terminal 9101 can display characters and image data on its plurality of surfaces. For example, three operation buttons 9050 (also referred to as operation icons or simply icons) can be displayed on one surface of the display portion 9001. Furthermore, information 9051 indicated by dashed rectangles can be displayed on other surfaces of the display portion 9001. Examples of the information 9051 include display indicating reception of an incoming email, social networking service (SNS) message, and call; the title and sender of an email and SNS massage; the date; the time; remaining battery; and the reception strength of an antenna. Instead of the information 9051, the operation buttons 9050 or the like may be displayed in the position where the information 9051 is displayed.

Figure 61C:
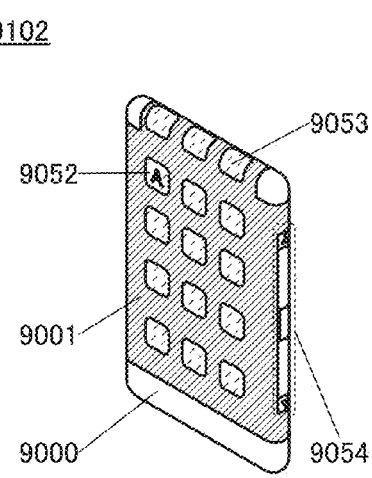

FIG. 61C is a perspective view of a portable information terminal 9102. The portable information terminal 9102 has a function of displaying information, for example, on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 61D:
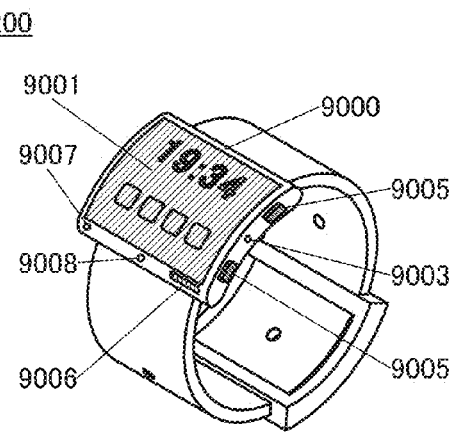

FIG. 61D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication conformable to a communication standard. For example, mutual communication between the portable information terminal 9200 and a headset capable of wireless communication can be performed; thus, hands-free calling is possible. Moreover, the portable information terminal 9200 includes the connection terminal 9006, and data can be directly transmitted to and received from another information terminal via a connector. Charging through the connection terminal 9006 is also possible. Note that the charging operation may also be performed by wireless power feeding without using the connection terminal 9006.

Figure 61E:
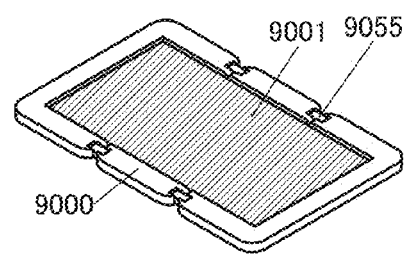
Figure 61F:
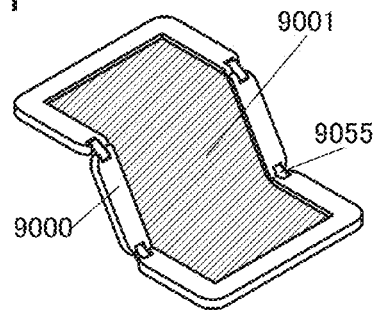
Figure 61G:
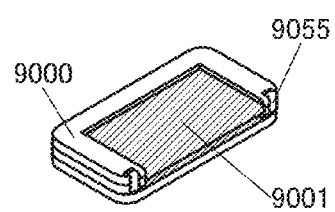

FIGS. 61E, 61F, and 61G are perspective views of a foldable portable information terminal 9201. FIG. 61E is a perspective view of the portable information terminal 9201 that is opened. FIG. 61F is a perspective view of the portable information terminal 9201 that is being opened or being folded. FIG. 61G is a perspective view of the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Figure 62A:
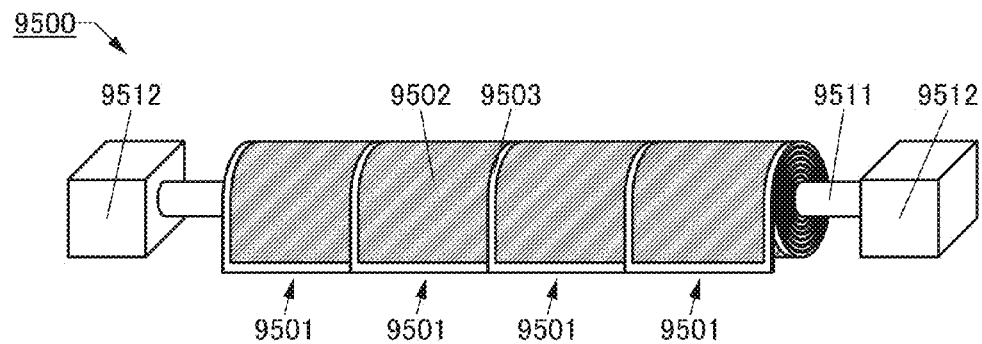
FIGS. 62A and 62B are perspective views of a display device.
Figure 62B:
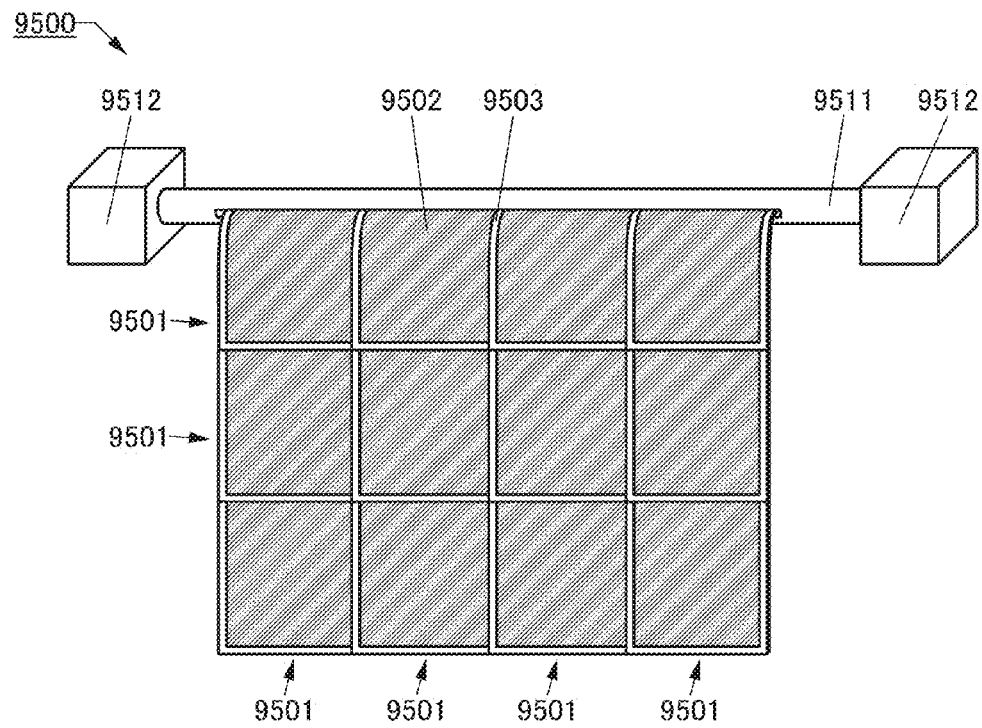

FIGS. 62A and 62B are perspective views of a display device including a plurality of display panels. Note that the plurality of display panels are wound in the perspective view in FIG. 62A and are unwound in the perspective view in FIG. 62B.

A display device 9500 illustrated in FIGS. 62A and 62B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 62A and 62B, without limitation to this structure, the display regions 9502 of the adjacent display panels 9501 may overlap with each other without any space so that a continuous display region 9502 is obtained, for example.

The electronic devices described in this embodiment each include the display portion for displaying some kinds of information. Note that the semiconductor device of one embodiment of the present invention can also be used for an electronic device that does not include a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a flat portion may be employed.

The structure described in this embodiment can be used in appropriate combination with the structure described in any of the other embodiments.

Embodiment 8

In this embodiment, a deposition apparatus which can be used to manufacture the display module of one embodiment of the present invention will be described with reference to FIG. 63.

Figure 63:
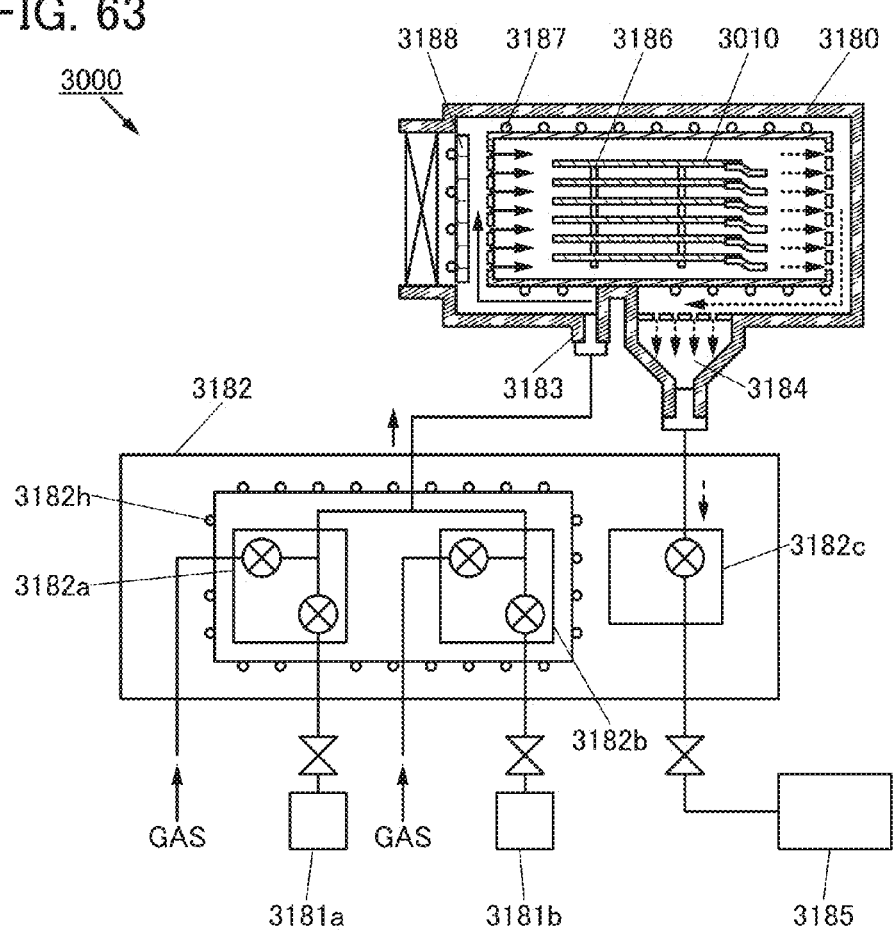
FIG. 63 illustrates the structure of a deposition apparatus.

FIG. 63 illustrates a deposition apparatus 3000 which can be used to manufacture the display module of one embodiment of the present invention. Note that the deposition apparatus 3000 is an example of a batch-type ALD apparatus.

<8-1. Structure Example of Deposition Apparatus>

The deposition apparatus 3000 described in this embodiment includes a deposition chamber 3180 and a control portion 3182 connected to the deposition chamber 3180 (see FIG. 63).

The control portion 3182 includes a control device (not illustrated) which supplies control signals and flow rate controllers 3182a, 3182b, and 3182c to which the control signals are supplied. For example, high-speed valves can be used as the flow rate controllers. Specifically, flow rates can be precisely controlled by using ALD valves or the like. The control portion 3182 also includes a heating mechanism 3182h which controls the temperatures of the flow rate controllers and pipes.

The flow rate controller 3182a is supplied with a control signal, a first source material, and an inert gas and has a function of supplying the first source material or the inert gas in accordance with the control signal.

The flow rate controller 3182b is supplied with a control signal, a second source material, and an inert gas and has a function of supplying the second source material or the inert gas in accordance with the control signal.

The flow rate controller 3182c is supplied with a control signal and has a function of connecting to an evacuation unit 3185 in accordance with the control signal.

<<Source Material Supply Portion>>

A source material supply portion 3181a has a function of supplying the first source material and is connected to the flow rate controller 3182a.

A source material supply portion 3181b has a function of supplying the second source material and is connected to the flow rate controller 3182b.

A vaporizer, a heating unit, or the like can be used as each of the source material supply portions. Thus, a gaseous source material can be generated from a solid or liquid source material.

Note that the number of source material supply portions is not limited to two and may be three or more.

<<Source Material>>

Any of a variety of substances can be used as the first source material. For example, a volatile organometallic compound, a volatile metal alkoxide, or the like can be used as the first source material. Any of a variety of substances which react with the first source material can be used as the second source material. For example, a substance which contributes to an oxidation reaction, a substance which contributes to a reduction reaction, a substance which contributes to an addition reaction, a substance which contributes to a decomposition reaction, a substance which contributes to a hydrolysis reaction, or the like can be used as the second source material.

Furthermore, a radical or the like can be used. For example, plasma obtained by supplying a source material to a plasma source or the like can be used. Specifically, an oxygen radical, a nitrogen radical, or the like can be used.

The second source material which is used in combination with the first source material is preferably a source material which reacts with the first source material at a temperature close to room temperature. For example, a source material which reacts with the first source material at a temperature of higher than or equal to room temperature and lower than or equal to 200° C., preferably higher than or equal to 50° C. and lower than or equal to 150° C., is preferable.

<<Evacuation Unit>>

The evacuation unit 3185 has an evacuating function and is connected to the flow rate controller 3182c. Note that a trap for capturing the source material to be evacuated may be provided between an outlet port 3184 and the flow rate controller 3182c. The evacuated gas or the like is removed by using a removal unit.

<<Control Portion>>

The control portion 3182 supplies the control signals for controlling the flow rate controllers, a control signal for controlling the heating mechanism, and the like. For example, in a first step, the first source material is supplied to a surface of a process base. Then, in a second step, the second source material which reacts with the first source material is supplied. Accordingly, a reaction product of the first source material and the second source material can be deposited onto a surface of a process member 3010.

Note that the amount of the reaction product to be deposited onto the surface of the process member 3010 can be controlled by a repetition of the first step and the second step.

Note that the amount of the first source material to be supplied to the process member 3010 is limited by the maximum possible amount of adsorption on the surface of the process member 3010. For example, conditions are selected so that a monomolecular layer of the first source material is formed on the surface of the process member 3010, and the formed monomolecular layer of the first source material is reacted with the second source material, whereby a significantly uniform layer containing the reaction product of the first source material and the second source material can be formed.

Accordingly, a variety of materials can be deposited on a surface of the process member 3010 even when the surface has a complicated structure. For example, a film having a thickness of greater than or equal to 3 nm and less than or equal to 200 nm can be formed on the process member 3010.

In the case where, for example, a small hole called a pinhole or the like is formed in the surface of the process member 3010, the pinhole can be filled by deposition of a material into the pinhole.

The remainder of the first source material or the second source material is evacuated from the deposition chamber 3180 with the use of the evacuation unit 3185. For example, the evacuation may be performed while an inert gas such as argon or nitrogen is introduced.

<<Deposition Chamber>>

The deposition chamber 3180 includes an inlet port 3183 from which the first source material, the second source material, and the inert gas are supplied and the outlet port 3184 from which the first source material, the second source material, and the inert gas are evacuated.

The deposition chamber 3180 includes a support portion 3186 which has a function of supporting one or a plurality of process members 3010, a heating mechanism 3187 which has a function of heating the one or the plurality of process members, and a door 3188 which has a function of opening or closing to load and unload the one or the plurality of process members 3010.

For example, a resistive heater, an infrared lamp, or the like can be used as the heating mechanism 3187. The heating mechanism 3187 has a function of heating up, for example, to higher than or equal to 80° C., higher than or equal to 100° C., or higher than or equal to 150° C. The heating mechanism 3187 heats the one or the plurality of process members 3010 to a temperature of higher than or equal to room temperature and lower than or equal to 200° C., preferably higher than or equal to 50° C. and lower than or equal to 150° C.

The deposition chamber 3180 may include a pressure regulator and a pressure detector.

<<Support Portion>>

The support portion 3186 supports the one or the plurality of process members 3010. Accordingly, an insulating film, for example, can be formed over the one or the plurality of process members 3010 in each treatment.

<8-2. Example of Film>

An example of a film which can be formed with the deposition apparatus 3000 described in this embodiment is described.

For example, a film containing an oxide, a nitride, a fluoride, a sulfide, a ternary compound, a metal, or a polymer can be formed.

For example, a material containing aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like can be deposited.

For example, a material containing aluminum nitride, hafnium nitride, silicon nitride, tantalum nitride, titanium nitride, niobium nitride, molybdenum nitride, zirconium nitride, gallium nitride, or the like can be deposited.

For example, a material containing copper, platinum, ruthenium, tungsten, iridium, palladium, iron, cobalt, nickel, or the like can be deposited.

For example, a material containing zinc sulfide, strontium sulfide, calcium sulfide, lead sulfide, calcium fluoride, strontium fluoride, zinc fluoride, or the like can be deposited.

For example, a material that includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be deposited.

This embodiment can be combined with any of the other embodiments in this specification as appropriate.

This application is based on Japanese Patent Application serial no. 2015-061347 filed with Japan Patent Office on Mar. 24, 2015, the entire contents of which are hereby incorporated by reference.

What is claimed is:

1. A semiconductor device comprising:
   a transistor, the transistor comprising:
   a first gate electrode;
   a first insulating film over the first gate electrode;
   an oxide semiconductor film which overlaps with the first gate electrode with the first insulating film interposed therebetween;
   a source electrode electrically connected to the oxide semiconductor film;
   a drain electrode electrically connected to the oxide semiconductor film;
   a second insulating film over the oxide semiconductor film; and
   a second gate electrode which overlaps with the oxide semiconductor film with the second insulating film interposed therebetween,
   wherein the oxide semiconductor film comprises:
   a first oxide semiconductor film in contact with an upper surface of the first insulating film;
   a second oxide semiconductor film in contact with an upper surface of the first oxide semiconductor film; and
   a third oxide semiconductor film including a region in contact with an upper surface of the second oxide semiconductor film, wherein the first oxide semiconductor film, the second oxide semiconductor film, and the third oxide semiconductor film each include In, Zn, and M (M represents Al, Ga, Y, or Sn), wherein the third oxide semiconductor film includes a region in contact with a side edge of the second oxide semiconductor film in a channel width direction and a region in contact with the second insulating film, and wherein the third oxide semiconductor film includes a region where a content of M is greater than or equal to a content of In.

2. The semiconductor device according to claim 1,
wherein the second oxide semiconductor film is covered with the first oxide semiconductor film and the third oxide semiconductor film.

3. The semiconductor device according to claim 1,
wherein the second oxide semiconductor film includes a region where a content of In is greater than or equal to a content of M.

4. The semiconductor device according to claim 1,
wherein the first oxide semiconductor film includes a region where a content of M is greater than or equal to a content of In.

5. The semiconductor device according to claim 1,
wherein the third oxide semiconductor film includes a region where the content of M is greater than or equal to the content of M in the second oxide semiconductor film.

6. The semiconductor device according to claim 1,
wherein the second oxide semiconductor film includes a region where the content of In is greater than or equal to the content of In in the third oxide semiconductor film.

7. The semiconductor device according to claim 1,
wherein the second oxide semiconductor film includes a region where the content of In is greater than or equal to a content of In in the first oxide semiconductor film.

8. The semiconductor device according to claim 1,
wherein a carrier density of the second oxide semiconductor film is higher than a carrier density of the first oxide semiconductor film and a carrier density of the third oxide semiconductor film.

9. The semiconductor device according to claim 1,
wherein the oxide semiconductor film includes a crystal part, and
wherein the crystal part has c-axis alignment.

10. A display device comprising:
the semiconductor device according to claim 1; and
a display element.

11. A display module comprising:
the display device according to claim 10; and
a touch sensor.

12. An electronic device comprising:
the semiconductor device according to claim 1; and
at least one of an operation key and a battery.

13. The semiconductor device according to claim 1,
wherein a channel formation region of the second oxide semiconductor film is electrically surrounded by the first gate electrode and the second gate electrode in the channel width direction.

14. The semiconductor device according to claim 1, wherein the second oxide semiconductor film does not include a region which is in contact with any of the first insulating film and the second insulating film.

15. A semiconductor device comprising:
a transistor, the transistor comprising:
a first gate electrode;
a first insulating film over the first gate electrode;
an oxide semiconductor film which overlaps with the first gate electrode with the first insulating film interposed therebetween;
a source electrode electrically connected to the oxide semiconductor film;
a drain electrode electrically connected to the oxide semiconductor film;
a second insulating film over the oxide semiconductor film;
a second gate electrode which overlaps with the oxide semiconductor film with the second insulating film interposed therebetween, and
a third insulating film over the second gate electrode,
wherein the oxide semiconductor film comprises:
a first oxide semiconductor film in contact with an upper surface of the first insulating film;
a second oxide semiconductor film in contact with an upper surface of the first oxide semiconductor film; and
a third oxide semiconductor film including a region in contact with an upper surface of the second oxide semiconductor film, wherein the first oxide semiconductor film, the second oxide semiconductor film, and the third oxide semiconductor film each include In, Zn, and M (M represents Al, Ga, Y, or Sn),
wherein the second gate electrode includes a metal element included in the first oxide semiconductor film, the second oxide semiconductor film, and the third oxide semiconductor film,
wherein the third oxide semiconductor film includes a region in contact with a side edge of the second oxide semiconductor film in a channel width direction and a region in contact with the second insulating film, and
wherein the third oxide semiconductor film includes a region where a content of M is greater than or equal to a content of In.

16. The semiconductor device according to claim 15,
wherein the third insulating film includes at least one of nitrogen and hydrogen.

17. The semiconductor device according to claim 15,
wherein the second oxide semiconductor film is covered with the first oxide semiconductor film and the third oxide semiconductor film.

18. The semiconductor device according to claim 15,
wherein the second oxide semiconductor film includes a region where a content of In is greater than or equal to a content of M.

19. The semiconductor device according to claim 15,
wherein the first oxide semiconductor film includes a region where a content of M is greater than or equal to a content of In.

20. The semiconductor device according to claim 15,
wherein the third oxide semiconductor film includes a region where the content of M is greater than or equal to the content of M in the second oxide semiconductor film.

21. The semiconductor device according to claim 15,
wherein the second oxide semiconductor film includes a region where the content of In is greater than or equal to the content of In in the third oxide semiconductor film.

22. The semiconductor device according to claim 15,
wherein the second oxide semiconductor film includes a region where the content of In is greater than or equal to a content of In in the first oxide semiconductor film.

23. The semiconductor device according to claim 15,
wherein a carrier density of the second oxide semiconductor film is higher than a carrier density of the first oxide semiconductor film and a carrier density of the third oxide semiconductor film.

24. The semiconductor device according to claim 15, wherein the oxide semiconductor film includes a crystal part, and
wherein the crystal part has c-axis alignment.

25. A display device comprising:
the semiconductor device according to claim 15; and
a display element.

26. A display module comprising:
the display device according to claim 25; and
a touch sensor.

27. An electronic device comprising:
the semiconductor device according to claim 15; and
at least one of an operation key and a battery.

28. The semiconductor device according to claim 15, wherein a channel formation region of the second oxide semiconductor film is electrically surrounded by the first gate electrode and the second gate electrode in the channel width direction.

29. The semiconductor device according to claim 15, wherein the second oxide semiconductor film does not include a region which is in contact with any of the first insulating film and the second insulating film.

* * * * *